US010593683B2

(12) United States Patent
Atsumi et al.

(10) Patent No.: US 10,593,683 B2
(45) Date of Patent: *Mar. 17, 2020

(54) SEMICONDUTOR DEVICE

(71) Applicant: Semiconductor Energy Laboratory Co., Ltd., Atsugi-shi, Kanagawa-ken (JP)

(72) Inventors: Tomoaki Atsumi, Kanagawa (JP); Shuhei Nagatsuka, Kanagawa (JP); Tamae Moriwaka, Kanagawa (JP); Yuta Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/275,380

(22) Filed: Feb. 14, 2019

(65) Prior Publication Data

US 2019/0189622 A1    Jun. 20, 2019

Related U.S. Application Data

(63) Continuation of application No. 15/591,150, filed on May 10, 2017, now Pat. No. 10,217,752, which is a (Continued)

(30) Foreign Application Priority Data

Mar. 7, 2014  (JP) ................................ 2014-045406

(51) Int. Cl.
*H01L 29/10*   (2006.01)
*H01L 27/115*  (2017.01)
(Continued)

(52) U.S. Cl.
CPC .............. *H01L 27/115* (2013.01); *G11C 7/16* (2013.01); *G11C 8/14* (2013.01); *G11C 11/24* (2013.01);
(Continued)

(58) Field of Classification Search
CPC ............ H01L 27/0629; H01L 27/0688; H01L 27/108; H01L 27/115; H01L 27/11551;
(Continued)

(56) References Cited

U.S. PATENT DOCUMENTS 4,888,631 A   12/1989  Azuma et al.
5,534,884 A   7/1996   Mase et al.
(Continued)

FOREIGN PATENT DOCUMENTS

EP   1737044 A   12/2006
EP   2226847 A   9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Brook Kebede
(74) *Attorney, Agent, or Firm* — Fish & Richardson P.C.

(57) ABSTRACT

[Problem] To provide a semiconductor device suitable for miniaturization. To provide a highly reliable semiconductor device. To provide a semiconductor device with improved operating speed.
[Solving Means] A semiconductor device including a memory cell including first to cth (c is a natural number of 2 or more) sub memory cells, wherein: the jth sub memory cell includes a first transistor, a second transistor, and a
(Continued)

capacitor; a first semiconductor layer included in the first transistor and a second semiconductor layer included in the second transistor include an oxide semiconductor; one of terminals of the capacitor is electrically connected to a gate electrode included in the second transistor; the gate electrode included in the second transistor is electrically connected to one of a source electrode and a drain electrode which are included in the first transistor; and when j≥2, the jth sub memory cell is arranged over the j-1th sub memory cell.

22 Claims, 31 Drawing Sheets

Related U.S. Application Data continuation of application No. 14/637,542, filed on Mar. 4, 2015, now Pat. No. 9,653,611.

(51) Int. Cl.
| | |
|---|---|
| H01L 29/786 | (2006.01) |
| H01L 27/11551 | (2017.01) |
| H01L 27/1156 | (2017.01) |
| H01L 27/06 | (2006.01) |
| G11C 7/16 | (2006.01) |
| G11C 8/14 | (2006.01) |
| G11C 11/403 | (2006.01) |
| G11C 11/408 | (2006.01) |
| G11C 11/24 | (2006.01) |
| H01L 29/24 | (2006.01) |

(52) U.S. Cl.
CPC ........ *G11C 11/403* (2013.01); *G11C 11/4085* (2013.01); *H01L 27/0688* (2013.01); *H01L 27/1156* (2013.01); *H01L 27/11551* (2013.01); *H01L 29/24* (2013.01); *H01L 29/7869* (2013.01)

(58) Field of Classification Search
CPC . H01L 27/1156; H01L 29/24; H01L 29/7869; G11C 7/16; G11C 8/14; G11C 11/403; G11C 11/4085
USPC ...................................... 257/43, 57
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,982,471 | A | 11/1999 | Hirakata et al. |
| 6,169,532 | B1 | 1/2001 | Sumi et al. |
| 6,266,038 | B1 | 7/2001 | Yoshida et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,961,042 | B2 | 11/2005 | Murai |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,098,880 | B2 | 8/2006 | Inoue et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,737,517 | B2 | 6/2010 | Kawamura et al. |
| 8,067,775 | B2 | 11/2011 | Miyairi et al. |
| 8,378,403 | B2 | 2/2013 | Kato |
| 8,637,865 | B2 | 1/2014 | Kato |
| 8,724,407 | B2 | 5/2014 | Kobayashi et al. |
| 8,809,853 | B2 | 8/2014 | Saito et al. |
| 8,854,865 | B2 | 10/2014 | Saito |
| 8,958,252 | B2 | 2/2015 | Kobayashi et al. |
| 9,472,682 | B2 | 10/2016 | Yamazaki et al. |
| 9,514,792 | B2 | 12/2016 | Kajigaya |
| 9,653,611 | B2 | 5/2017 | Atsumi et al. |
| 9,755,084 | B2 | 9/2017 | Isobe et al. |
| 9,780,093 | B2 | 10/2017 | Kato |
| 2001/0020928 | A1 | 9/2001 | Yanagisawa et al. |
| 2001/0046027 | A1 | 11/2001 | Tai et al. |
| 2002/0003271 | A1 | 1/2002 | Ikeda et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0219188 | A1 | 10/2005 | Kawabe et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0205976 | A1 | 9/2007 | Takatori et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0042968 | A1 | 2/2008 | Oh |
| 2008/0050595 | A1 | 2/2008 | Nakagawara et al. |
| 2008/0055218 | A1 | 3/2008 | Tsuda et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284970 A1 | 11/2008 | Ishitani |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0079684 A1 | 3/2009 | Watanabe |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244020 A1 | 9/2010 | Sakata et al. |
| 2012/0001243 A1 | 1/2012 | Kato |
| 2012/0061668 A1 | 3/2012 | Miyairi et al. |
| 2012/0106226 A1 | 5/2012 | Saito |
| 2012/0161132 A1 | 6/2012 | Yamazaki |
| 2012/0161220 A1 | 6/2012 | Yamazaki |
| 2012/0294070 A1 | 11/2012 | Matsuzaki et al. |
| 2013/0069132 A1 | 3/2013 | Atsumi et al. |
| 2013/0070506 A1 | 3/2013 | Kajigaya |
| 2013/0140569 A1 | 6/2013 | Yoneda et al. |
| 2013/0148411 A1 | 6/2013 | Atsumi et al. |
| 2013/0155790 A1 | 6/2013 | Atsumi |
| 2013/0207112 A1 | 8/2013 | Isobe et al. |
| 2013/0221356 A1 | 8/2013 | Yamazaki et al. |
| 2013/0258746 A1* | 10/2013 | Kurokawa .......... H01L 27/0688 365/72 |
| 2014/0325249 A1* | 10/2014 | Toyotaka ........... G11C 14/0018 713/323 |
| 2014/0374747 A1* | 12/2014 | Kurokawa ........ H01L 27/11529 257/43 |
| 2015/0084046 A1* | 3/2015 | Kato .................. H01L 27/1255 257/43 |
| 2017/0033205 A1 | 2/2017 | Yamazaki et al. |
| 2018/0090499 A1 | 3/2018 | Kato |

FOREIGN PATENT DOCUMENTS

| | | | |
|---|---|---|---|
| JP | 60-198861 A | 10/1985 | |
| JP | 62-165971 A | 7/1987 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-096055 A | 4/2007 | |
| JP | 2007-123861 A | 5/2007 | |
| JP | 2012-033906 A | 2/2012 | |
| JP | 2012-256405 A | 12/2012 | |
| JP | 2013-065638 A | 4/2013 | |
| JP | 2013-165132 A | 8/2013 | |
| JP | 2014-030000 A | 2/2014 | |
| WO | WO-2004/114391 | 12/2004 | |
| WO | WO-2012/002186 | 1/2012 | |
| WO | WO-2012/128189 | 9/2012 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SIC International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17 22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID DIGEST '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Application", SID Digest '09 : SID International Symposium Digest of Technical Papers, May 31, 2009, pp. 578-581.
Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 ; SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner peak derived
from a substrate electrons move in 101b

SEMICONDUTOR DEVICE

CROSS-REFERENCE TO RELATED APPLICATIONS

This application is a continuation of U.S. application Ser. No. 15/591,150, filed May 10, 2017, now allowed, which is a continuation of U.S. application Ser. No. 14/637,542, filed Mar. 4, 2015, now U.S. Pat. No. 9,653,611, which claims the benefit of a foreign priority application filed in Japan as Serial No. 2014-045406 on Mar. 7, 2014, all of which are incorporated by reference.

TECHNICAL FIELD

The present invention relates to an object, a method, or a manufacturing method. Furthermore, the present invention relates to a process, a machine, manufacture, or a composition of matter (composition of matter). In particular, one embodiment of the present invention relates to a semiconductor device, a display device, a light-emitting device, a power storage device, a memory device, a driving method thereof, or a manufacturing method thereof Note that in this specification and the like, a semiconductor device refers to all devices that can function by utilizing semiconductor characteristics. A transistor and a semiconductor circuit are embodiments of semiconductor devices. Furthermore, an arithmetic device, a memory device, an imaging device, an electro-optical device, a power generation device (including a thin film solar cell, an organic thin film solar cell, and the like), and an electronic appliance each may include a semiconductor device.

BACKGROUND ART

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely known, but oxide semiconductors have been attracting attention as alternative materials.

For example, a technique for forming a transistor using zinc oxide or an In-Ga-Zn-based oxide semiconductor as an oxide semiconductor is disclosed (see Patent Literature 1 and Patent Literature 2).

Furthermore, in recent years, demand for integrated circuits in which semiconductor elements such as miniaturized transistors are integrated with high density has risen with increased performance and reductions in the size and weight of electronic appliances.

CITATION LIST

Patent Literatures

[Patent Literature 1] Japanese Published Patent Application No. 2007-123861
[Patent Literature 2] Japanese Published Patent Application No. 2007-096055

SUMMARY OF INVENTION

Problems to be Solved by the Invention

One object of one embodiment of the present invention is to provide a semiconductor device that is suitable for miniaturization. Another object is to provide a semiconductor device having a reduced circuit area. Another object of one embodiment of the present invention is to provide a semiconductor device with improved operating speed. Another object of one embodiment of the present invention is to provide a semiconductor device with improved write speed. Another object of one embodiment of the present invention is to provide a semiconductor device with improved read speed. Another object of one embodiment of the present invention is to provide a semiconductor device with low power consumption.

Another object of one embodiment of the present invention is to provide a highly reliable semiconductor device. Another object of one embodiment of the present invention is to give favorable electrical characteristics to a semiconductor device. Another object of one embodiment of the present invention is to provide a semiconductor device including a memory element with favorable retention characteristics. Another object of one embodiment of the present invention is to provide a semiconductor device having a novel structure. Another object is to provide a novel semiconductor device.

Note that the descriptions of these objects do not disturb the existence of other objects. Note that in one embodiment of the present invention, there is no need to achieve all the objects. Note that other objects will be apparent from the description of the specification, the drawings, the claims, and the like and can be derived from the description of the specification, the drawings, the claims, and the like.

Means for Solving the Problems

One embodiment of the present invention is a semiconductor device including a memory cell including first to cth (c is a natural number of 2 or more) sub memory cells, wherein: the jth is a natural number of 1 to c) sub memory cell includes a first transistor, a second transistor, and a capacitor; a first semiconductor layer included in the first transistor and a second semiconductor layer included in the second transistor include an oxide semiconductor; one of terminals of the capacitor is electrically connected to a gate electrode included in the second transistor; the gate electrode included in the second transistor is electrically connected to one of a source electrode and a drain electrode which are included in the first transistor; and when j≥2, the jth sub memory cell is arranged over a j-1th sub memory.

Furthermore, one embodiment of the present invention is a semiconductor device including a memory cell including first to cth (c is a natural number of 2 or more) sub memory cells, wherein: the jth (j is a natural number of 1 to c) sub memory cell includes a first transistor, a second transistor, and a capacitor; a first semiconductor layer included in the first transistor and a second semiconductor layer included in the second transistor include an oxide semiconductor; one of terminals of the capacitor is electrically connected to a gate electrode included in the second transistor; the gate electrode included in the second transistor is electrically connected to one of a source electrode and a drain electrode which are included in the first transistor; when j≥2, the semiconductor layer included in the second transistor Tb_j included in the jth sub memory cell and a semiconductor layer included in a first transistor Ta_(j-1) included in the j-1th sub memory cell are in contact with an upper surface of a first insulating film; and when j≥2, the gate electrode included in the second transistor Tb_j included in the jth sub memory cell and a gate electrode included in the first transistor Ta_(j-1) included in the j-1th sub memory cell are in contact with a lower surface of a second insulating film.

Furthermore, one embodiment of the present invention is a semiconductor device including a memory cell including first to cth (c is a natural number of 2 or more) sub memory cells, wherein: the jth (j is a natural number of 1 to c) sub memory cell includes a first transistor, a second transistor, and a capacitor; when j≥2, the jth sub memory cell is arranged over a j-1th sub memory; a first semiconductor layer included in the first transistor and a second semiconductor layer included in the second transistor include an oxide semiconductor; one of the semiconductor layer included in the first transistor and the semiconductor layer included in the second transistor which are included in the first sub memory cell, and a semiconductor layer included in a third transistor are over and in contact with a first insulating film; and one of a semiconductor layer included in a first transistor included in the cth sub memory cell and a semiconductor layer included in a second transistor included in the cth sub memory cell, and a semiconductor layer included in a fourth transistor are over and in contact with a second insulating film.

Furthermore, in the above structure, it is preferable that the first semiconductor layer included in the first transistor included in the jth (j is a natural number of 1 to c) sub memory cell and the second semiconductor layer included in the second transistor included in the jth sub memory cell include In, an element represented by M, and Zn, that the atomic ratio of In to M and Zn of the oxide semiconductor included in the first semiconductor layer satisfy In:M:Zn=g:h:i, that the atomic ratio of In to M and Zn of the oxide semiconductor included in the second semiconductor layer satisfy In:M:Zn=d:e;f, and that $g/(g+h+i)$ be smaller than $d/(d+e+f)$.

Advantageous Effects of the Invention

One embodiment of the present invention can provide a semiconductor device that is suitable for miniaturization. Furthermore, a semiconductor device having a reduced circuit area can be provided. Furthermore, one embodiment of the present invention can provide a semiconductor device with improved operating speed. Furthermore, one embodiment of the present invention can provide a semiconductor device with improved write speed. Furthermore, one embodiment of the present invention can provide a semiconductor device with improved read speed. Furthermore, one embodiment of the present invention can provide a semiconductor device with low power consumption.

Furthermore, one embodiment of the present invention can provide a highly reliable semiconductor device. Furthermore, one embodiment of the present invention can provide a semiconductor device with favorable electrical characteristics. Furthermore, one embodiment of the present invention can provide a semiconductor device including a memory element with favorable retention characteristics. Furthermore, one embodiment of the present invention can provide a semiconductor device having a novel structure. Furthermore, a novel semiconductor device can be provided.

Note that the descriptions of these effects do not disturb the existence of other effects. Note that in one embodiment of the present invention, there is no need to achieve all the effects. Note that other effects will be apparent from the description of the specification, the drawings, the claims, and the like and can be derived from the description of the specification, the drawings, the claims, and the like.

BRIEF DESCRIPTION OF DRAWINGS

FIGS. 25A and 25B A drawing showing the band structure of part of a transistor of one embodiment of the present invention and a drawing illustrating a current path when the transistor is on.

MODE FOR CARRYING OUT THE INVENTION

Figure 1A:
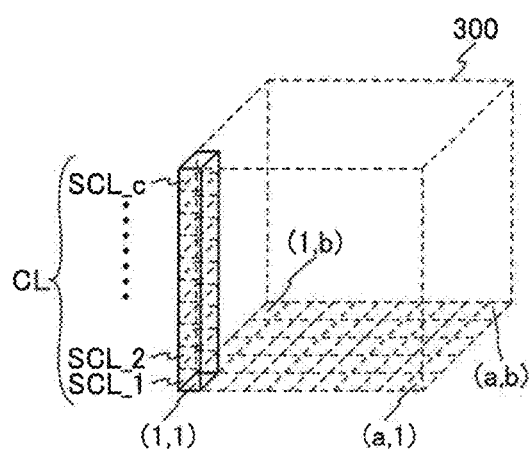
FIGS. 1A and 1B Drawings showing an example and a circuit diagram of a semiconductor device of one embodiment of the present invention.

Embodiments will be described in detail with reference to drawings. Note that the present invention is not limited to the description below, and it is easily understood by those skilled in the art that the modes and details thereof can be variously changed without departing from the purpose and the scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases; therefore, it is not necessarily limited to the scales.

Note that in this specification and the like, ordinal numbers such as "first", "second", and the like are used in order to avoid confusion among components and do not limit the number.

Note that a "semiconductor" includes characteristics of an "insulator" in some cases when the conductivity is sufficiently low, for example Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

A transistor is a kind of semiconductor elements and can achieve amplification of current or voltage, switching operation for controlling conduction or non-conduction, or the like. A transistor in this specification includes an IGFET (Insulated Gate Field Effect Transistor) and a thin film transistor (TFT: Thin Film Transistor).

Furthermore, in this specification, the term "parallel" indicates a state in which the angle formed between two straight lines is greater than or equal to −10° and less than or equal to 10°, and accordingly also includes the case where the angle is greater than or equal to −5° and less than or equal to 5°. Furthermore, the term "substantially parallel" indicates a state in which the angle formed between two straight lines is greater than or equal to −30° and less than or equal to 30°. In addition, the term "perpendicular" indicates a state in which the angle formed between two straight lines is greater than or equal to □0° and less than or equal to 100°, and accordingly also includes the case where the angle is greater than or equal to □□° and less than or equal to 95°□ Furthermore, the term "substantially perpendicular" indicates a state in which the angle formed between two straight lines is greater than or equal to 60° and less than or equal to 120°.

Furthermore, in this specification, trigonal and rhombohedral crystal systems are included in a hexagonal crystal system.

(Embodiment 1)

In this embodiment, a circuit configuration and operation of a memory cell array 300 included in a semiconductor device 700 of one embodiment of the invention to be disclosed are described.

Note that a semiconductor device refers to a device including a semiconductor element. Note that a semiconductor device includes a driver circuit or the like for driving a circuit including a semiconductor element. Furthermore, in some cases, a semiconductor device includes a driver circuit, a power supply circuit, or the like provided over another substrate, in addition to a memory cell.

Furthermore, an inverter circuit, a NAND circuit, an AND circuit, a NOR circuit, an OR circuit, a buffer, a level shifter, an XOR circuit, an XNOR circuit, an AND-NOR circuit, an OR-NAND circuit, an AND-OR-INV circuit, an OR-AND-INV circuit, an analog switch, a flip-flop, a settable flip-flop, a resettable flip-flop, a settable and resettable flip-flop, an adder, a half adder, a multiplexer, a demultiplexer, a register, a scan register, a retention register, an isolator, a decoder, or the like may be included in the semiconductor device 700.

Figure 2:
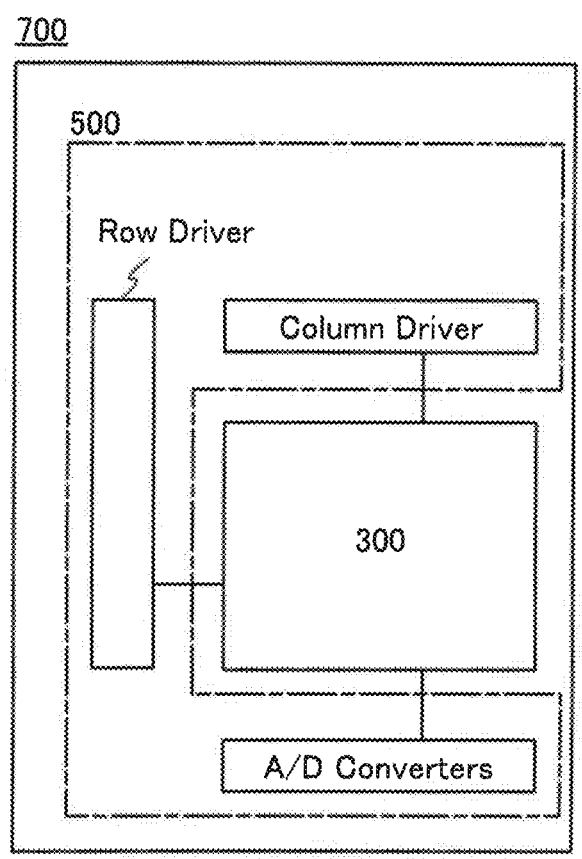
FIG. 2 A block diagram of one embodiment of the present invention.

An example of the semiconductor device 700 of one embodiment of the present invention is shown in FIG. 2. The semiconductor device 700 includes the memory cell array 300 and a peripheral circuit 500 of the memory cell array. Furthermore, the peripheral circuit 500 of the memory cell array preferably includes a row selection driver, a column selection driver, an A/D converter, and the like. Furthermore, the peripheral circuit 500 may include a logic circuit or the like. Furthermore, a structure of the semiconductor device 700 is not limited to the structure shown in FIG. 2.

Here, the structure including the memory cell array 300 and the row selection driver, the column selection driver, the A/D converter, and the like that are connected to the memory cell array may be referred to as a memory device.

The memory cell array 300 shown in FIG. 1A includes memory cells CL arranged in a matrix of a (in the horizontal direction)×b (in the vertical direction) (a and b are natural numbers) in a plane.

Each memory cell CL includes c (c is a natural number of 2 or more) sub memory cells SCL. Here, a jth (j is a natural number of 1 to c) sub memory cell is denoted by SCL_j. The sub memory cell SCL_j includes a first transistor Ta_j, a second transistor Tb_j, and a first capacitor Ca_j.

That is, the memory cell CL includes the c sub memory cells SCL_j which are stacked, and each sub memory cell SCL includes a first transistor Ta, a second transistor Tb, and a capacitor Ca.

For example, the case where single crystal silicon is used for the transistor Ta_j and the transistor Tb_j is considered. In order to obtain excellent single crystal silicon, a transistor is preferably formed using a single crystal silicon substrate or the like. Meanwhile, in the case where oxide semiconductor layers are used for the transistor Ta_j and the transistor Tb_j, because they can be formed by, for example, a sputtering method which is described later, a CVD method, an MBE method, a PLD method, an ALD method, or the like, semiconductor layers can be formed by being stacked repeatedly. Therefore, a transistor can be formed by being stacked over a transistor. As shown in FIG. 1A, c sub memory cells SCL can be stacked. The memory cell CL includes the c sub memory cells SCL. Accordingly, capacity per area can be increased.

Figure 1B:
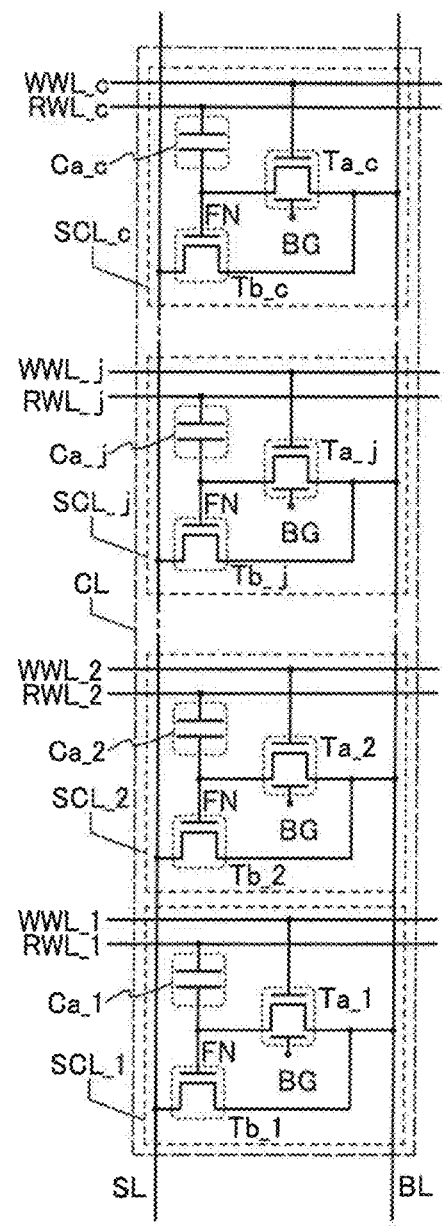

As shown in FIG. 1B, in the memory cell CL including the c sub memory cells SCL, the sub memory cells SCL_j share a bit line BL and a source line SL.

A write word line WWL_j is connected to a gate of the transistor Ta_j. Furthermore, the bit line BL is connected to one of a source and a drain of the transistor Ta_j, and a floating node FN is connected to the other of the source and the drain thereof.

The floating node FN is connected to a gate of the transistor Tb_j. Furthermore, the bit line BL is connected to one of a source and a drain of the transistor Tb_j, and the source line SL is connected to the other of the source and the drain thereof.

The floating node FN is connected to one electrode of the capacitor Ca_j, and a read word line RWL_j is connected to the other electrode thereof.

A word signal is supplied to the write word line WWL_j.

The word signal is a signal to turn on the transistor Ta_j to supply the potential of the bit line BL to the floating node FN.

Binary or multilevel data is supplied to the bit line BL. The multilevel data is k-bit (k is a natural number of 2 or more) data. Specifically, 2-bit data is 4-level data, namely, a signal having any one of the four levels of voltages.

A read signal is supplied to the read word line RWL_j.

The read signal is a signal which is supplied to the other electrode of the capacitor Ca_j to perform reading of data from the memory cell in a selective manner.

The floating node FN corresponds to any node on a wiring which connects the one electrode of the capacitor Ca_j, the other electrode of the source and the drain of the transistor Ta_j, and the gate of the transistor Tb_j.

Note that in this specification, node refers to any point on a wiring provided to connect elements electrically.

Note that in this specification, writing of data to the memory cell means that a word signal supplied to the write word line WWL_j is controlled so that the potential of the floating node FN becomes a potential corresponding to the potential of the bit line BL. Furthermore, reading of data from the memory cell means that a read signal supplied to the read word line RWL_j is controlled so that the potential of the bit line BL becomes a potential corresponding to the potential of the floating node FN.

The transistor Ta_j preferably has a second gate electrode (BG). A potential lower or higher than that of the source electrode can be applied to the second gate electrode, whereby the threshold voltage of the transistor can be shifted in a positive direction or a negative direction. For example, by shifting the threshold voltage of the transistor in the positive direction, normally-off in which the transistor is in a non-conduction state (off state) even when the gate potential is 0 V can be achieved in some cases. Note that the voltage applied to the second gate electrode may be variable or fixed. In the case where the voltage applied to the second gate electrode is variable, a circuit for controlling the voltage may be connected to the second gate electrode. Furthermore, the second gate electrode may be connected to a first gate electrode. The second gate is connected to the first gate and the same potential is applied thereto, whereby on-state current can be increased, variations in the initial characteristics can be reduced, degradation due to the −GBT (Minus Gate Bias Temperature) stress test can be suppressed, and a change in the rising voltage of the on-state current at different drain voltages can be suppressed.

In addition, although not illustrated in FIG. 1B, the transistor Tb_j may also have a second gate electrode (BG). The on-state current of the transistor Tb_j is preferably high. The increase of the on-state current of the transistor Tb_j can increase the read speed of the memory cell array 300, for example Note that in the case of including a display element such as a liquid crystal element or an organic EL (Electroluminescence) element electrically connected to the node FN, for example, a part of the memory cell array 300 can function as a pixel of a display device.

Note that the potential of the floating node FN is based on the data supplied to the bit line BL. Furthermore, the floating node FN is in an electrically floating state when the transistor Ta_j is in a non-conduction state. Thus, in the case where the voltage of the read signal supplied to the read word line RWL is changed, the potential of the floating node FN becomes a potential which is the sum of the previous potential and the amount of change in the voltage of the read signal. The change in the potential is due to capacitive coupling of the capacitor Ca_j which is caused by the change of the read signal supplied to the read word line RWL.

The transistor Ta_j has a function of a switch for controlling writing of data by being switched between a conduction state and a non-conduction state. Furthermore, the transistor Ta_j has a function of retaining a potential based on written data by keeping a non-conduction state. Note that the transistor Ta_j is also referred to as a first transistor. Furthermore, the transistor Ta_j is an n-channel type transistor in the description.

Note that, as the transistor Ta_j, a transistor having a low current (off-state current) which flows between a source and a drain in a non-conduction state is preferably used. Here, the low off-state current means that the normalized off-state current per micrometer of a channel width with a drain-source voltage of 10 V at room temperature is less than or equal to 10 zA. An example of a transistor having such a low off-state current is a transistor including an oxide semiconductor as a semiconductor layer.

A transistor with low off-state current is used as the transistor Ta_j, whereby the potential of the floating node FN in a non-conduction state can be retained for a long period of time. Thus, the refresh rate of the semiconductor device can be reduced, which achieves a low-power-consumption semiconductor device.

Note that to hold a potential retained in the floating node FN at 85° C. for 10 years ($3.15 \times 10^8$ seconds), a value of off-state current is preferably lower than 4.3 yA (yoctoamperes: 1 yA is $10^{-24}$ A) per femtofarad of capacitance and per micrometer of a channel width of the transistor. In that case, the allowable potential variation in the floating node FN is preferably within 0.5 V. Alternatively, the off-state current is preferably lower than 1.5 yA at 95° C. In the semiconductor device of one embodiment of the present invention, the concentration of hydrogen contained in the layer below the barrier film is sufficiently reduced. Thus, the transistor including an oxide semiconductor in the layer over the barrier film can have extremely low off-state current.

Furthermore, when the capacitance is increased, the potential can be retained in the node FN for a longer time. In other words, the retention time can be lengthened.

In the configuration of the memory cell array 300 shown in FIG. 1B, a potential based on written data is retained by keeping the non-conduction state. Thus, it is particularly preferable to use a transistor with a low off-state current as a switch for suppressing change in the potential in the floating node FN which is accompanied by the transfer of electrical charge.

When the transistor Ta_j is a transistor having a low off-state current and keeps a non-conduction state, the memory cell array 300 can be a non-volatile memory. Thus, once data is written to the memory cell array 300, the data can be retained in the floating node FN until the transistor Ta_j is turned on again.

The transistor Tb_j has a function of making a current $I_d$ flow between the source and the drain in accordance with the potential of the floating node FN. Note that in the memory cell array 300 shown in FIG. 1A, the current $I_d$ that flows between the source and the drain of the transistor Tb_j is a current that flows between the bit line BL and the source line SL. Note that as the transistor Tb_j, a transistor using silicon in a semiconductor layer may be used, or a transistor using an oxide semiconductor in a semiconductor layer may be used. Here, an example in which a transistor using an oxide semiconductor in a semiconductor layer is used as the transistor Tb_j is shown. Note that the transistor Tb_j is also referred to as a second transistor. Furthermore, the transistor Tb_j is an n-channel type transistor in the description.

An n-channel type transistor which has high switching speed can be used for the transistor Ta_j and the transistor Tb_j. For example, the switching speed of the transistor is lower than 10 ns, preferably lower than 1 ns, more preferably lower than 0.1 ns. For example, a transistor including an oxide semiconductor (preferably an oxide including In, Ga, and Zn) in a channel formation region (hereinafter the transistor is also referred to as a transistor using an oxide semiconductor) can be used.

Next, operation of the memory cell array 300 illustrated in FIG. 1B is described.

Figure 3A:
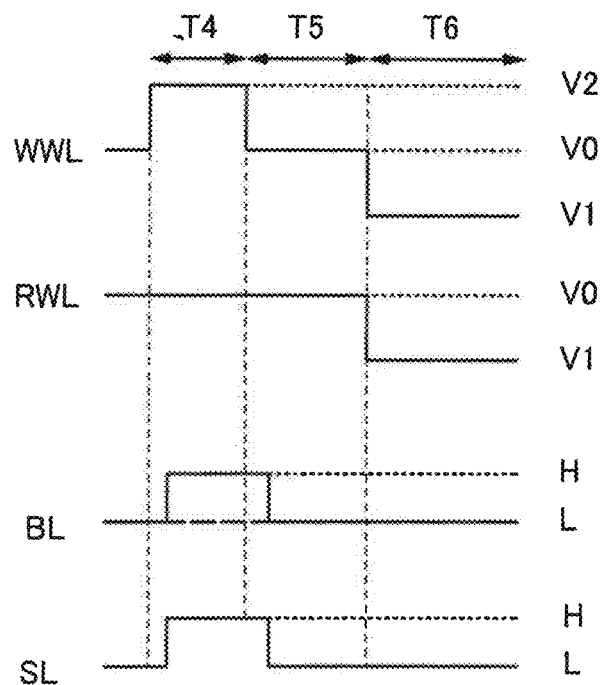
FIGS. 3A and 3B Drawings illustrating timing charts of a circuit of one embodiment of the present invention.
Figure 3B:
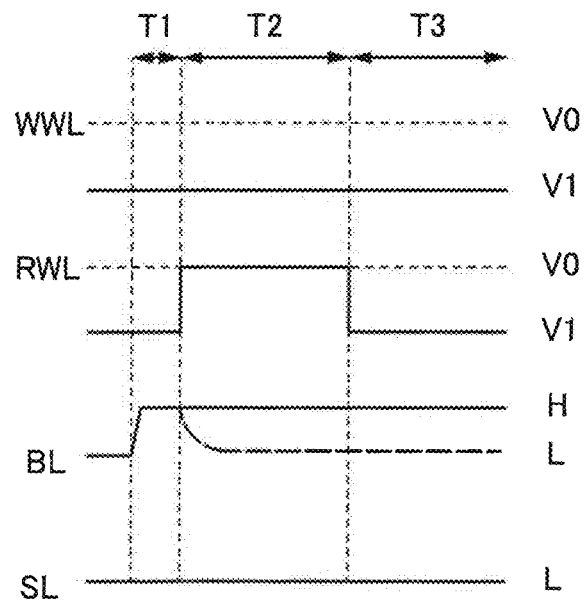

Timing charts shown in FIGS. 3A and 3B illustrate change of signals supplied to the write word line WWL, the read word line RWL, the floating node FN, the bit line BL, and the source line SL which are shown in FIG. 1B.

First, write operation is described with reference to FIG. 3A. Though writing of binary data is described here, writing to the memory cell array 300 is not limited to the writing of binary data, and multilevel data may be written. In the timing chart shown in FIG. 3A, a writing period T4, a break period T5, and a non-selection period T6 are shown.

In the writing period T4, a potential V2 is supplied to the write word line WWL first. Furthermore, a potential V0 is supplied to the read word line RWL. Next, a potential corresponding to binary data, that is, an H-level potential or an L-level potential is supplied to the bit line BL. Furthermore, the H-level potential is supplied to the source line SL.

Next, in the break period T5, the potential V0 is supplied to the read word line RWL and the write word line WWL. Next, the L-level potential is supplied to the bit line BL and the source line SL. Here, the potential V0 may be a ground potential, and the potential V2 may be a positive potential. Furthermore, the absolute value of the potential V2 is preferably higher than the H-level potential. For example, it may range from approximately a threshold value of the transistor Tb_j to approximately three times the threshold value.

Next, in the non-selection period T6, a potential V1 is applied to the read word line RWL and the write word line WWL. Here, the potential V1 may be a negative potential, for example. Furthermore, the absolute value of the potential V1 is preferably higher than the H-level potential. Furthermore, the L-level potential is supplied to the bit line BL and the source line SL.

Next, read operation is described with reference to FIG. 3B. In the timing chart shown in FIG. 3B, a period T1 in which the potential of the bit line BL is precharged, a period T2 in which the electrical charge of the bit line BL is discharged to perform data reading, and a non-selection period T3 are shown.

In the period T1 shown in FIG. 3B, the bit line BL is precharged. That is, the bit line BL is supplied with a potential (a potential H') which is almost the same as that of the H-level. At this time, the potential V1 is supplied to the write word line WWL. Furthermore, the read word line RWL is supplied with the potential V1. Furthermore, in the floating node FN, a potential corresponding to data is retained. Furthermore, the source line SL is supplied with the L-level potential.

At this time, the bit line BL becomes in an electrically floating state after being supplied with the H-level potential. That is, the bit line BL is brought into a state in which the potential is changed by the charging or discharging of electrical charge. The floating state can be achieved by turning off a switch for supplying a potential to the bit line BL.

Next, in the period T2 shown in FIG. 3B, the electrical charge of the bit line BL is discharged to perform data reading. At this time, the write word line WWL is supplied with the potential V1 as in the previous period. Furthermore, the read word line RWL is supplied with the H-level potential, here, the potential V0. Furthermore, in the floating node FN, each of the potentials corresponding to data is increased. Furthermore, the potential of the bit line BL is changed in accordance with the potential of the floating node FN. For example, an H-level signal (the potential H') is output to the bit line BL in the case where the L-level potential is input to the floating node FN, and an L-level signal (a potential L') is output to the bit line BL in the case where the H-level potential is input to the floating node FN. Furthermore, the L-level potential is supplied to the source line SL as in the previous period.

Next, the period T3 shown in FIG. 3B shows a non-selection state. In the period T3, a potential of the read word line RWL is set to V1.

Figure 4:
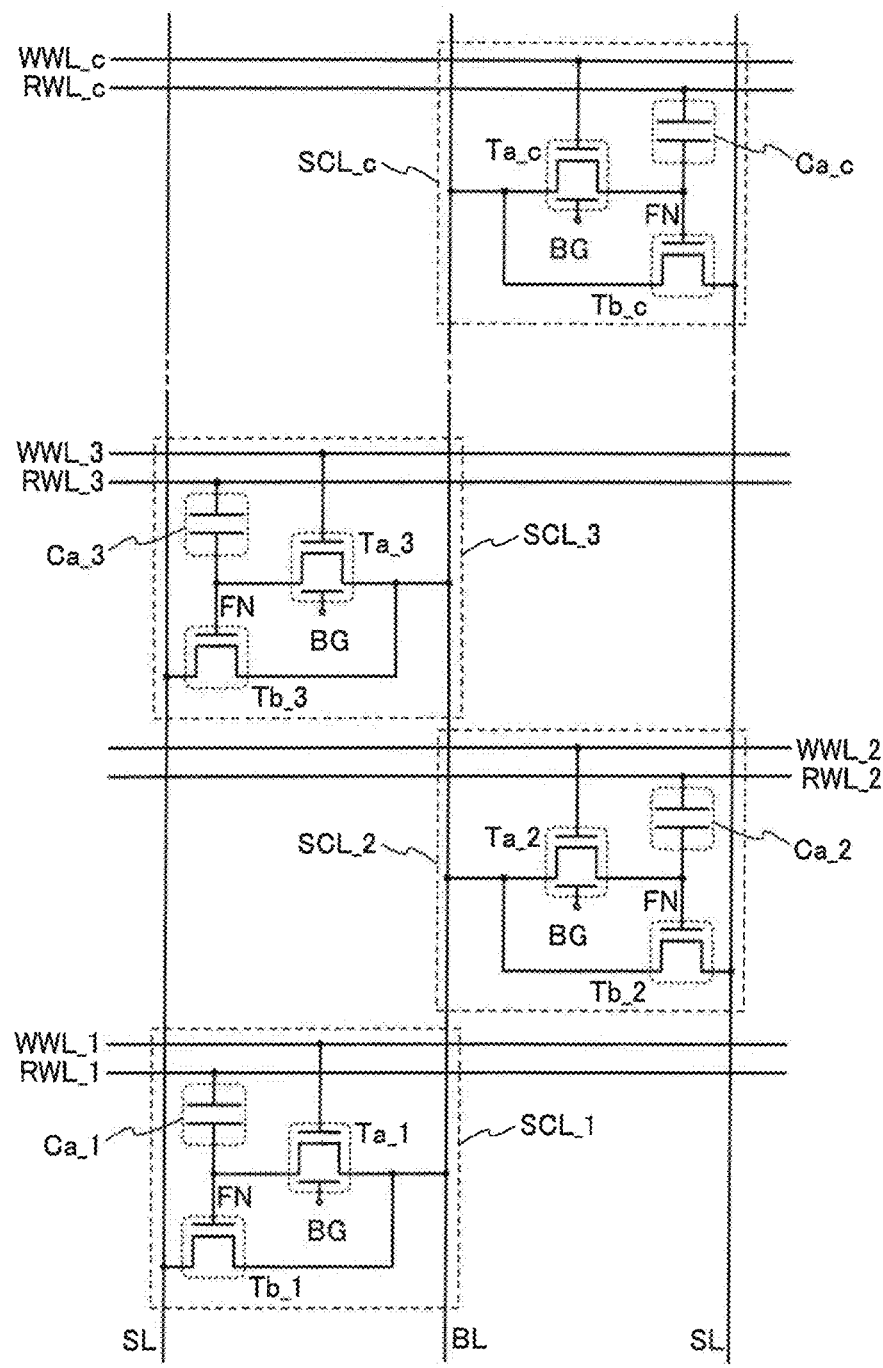
FIG. 4 A circuit diagram of one embodiment of the present invention.
Figure 5:
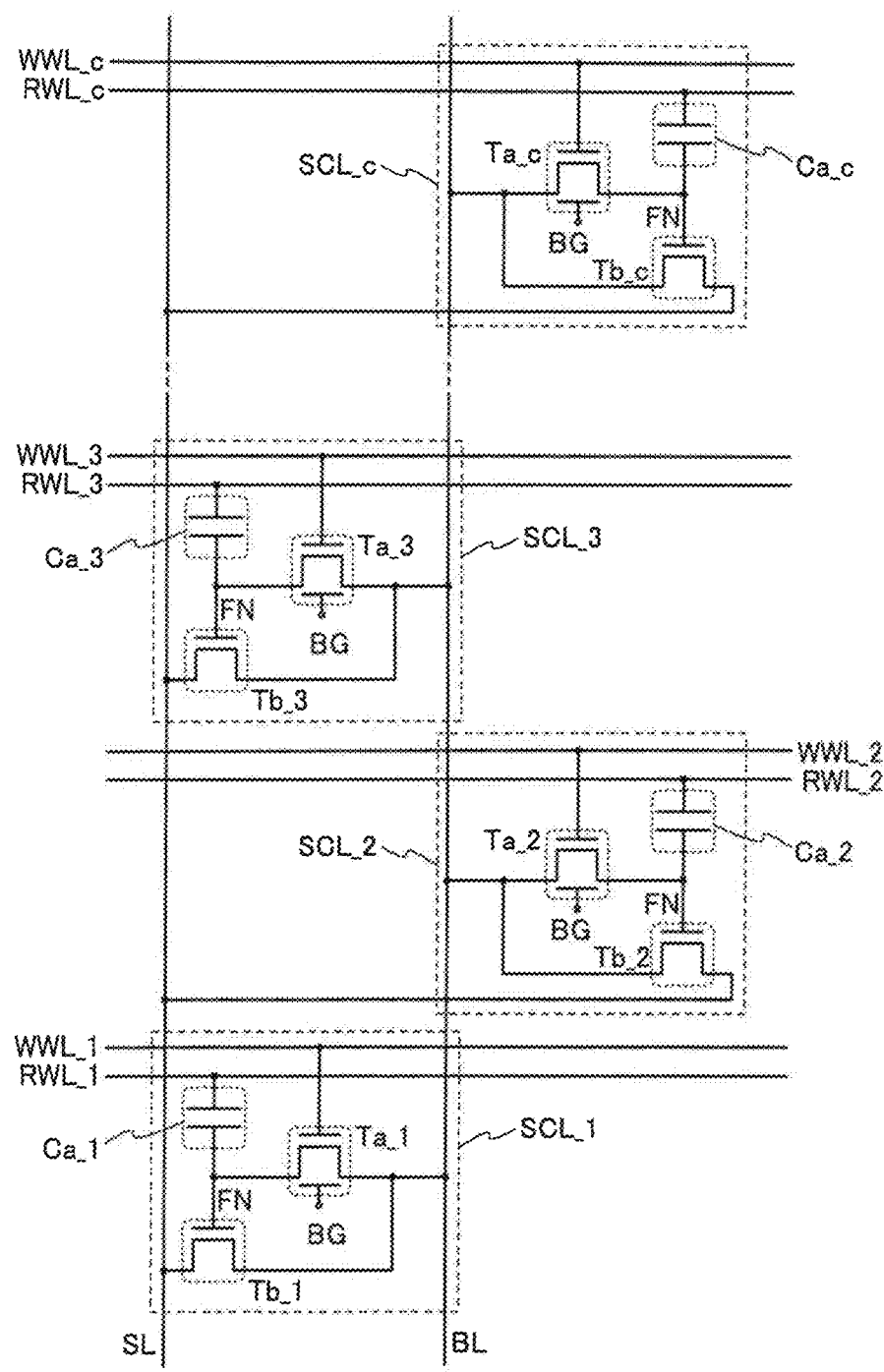
FIG. 5 A circuit diagram of one embodiment of the present invention.

Furthermore, the memory cell array 300 may have a circuit configuration as shown in FIG. 4. In FIG. 4, the sub memory cells SCL_j are connected to the bit line BL in a staggered configuration, whereby the integration degree of the memory cell array 300 can be increased in some cases. Furthermore, the storage capacity per area can be increased. Here, among the sub memory cells SCL_j where j=1 to c, four sub memory cells SCL_j where j=1, 2, 3, and c are shown in FIG. 4. Furthermore, the memory cell array 300 may have a circuit configuration as shown in FIG. 5. In FIG. 5, the number of source lines SL can be smaller than that in FIG. 4. Here, among the sub memory cells SCL_j where j=1 to c, four sub memory cells SCL_j where j=1, 2, 3, and c are shown in FIG. 5. Note that also in FIG. 4 and FIG. 5, the transistor Ta_j may have a second gate electrode (BG) in a manner similar to that of FIG. 1B.

[Structure Example of Stacked-layer Structure]

Figure 6:
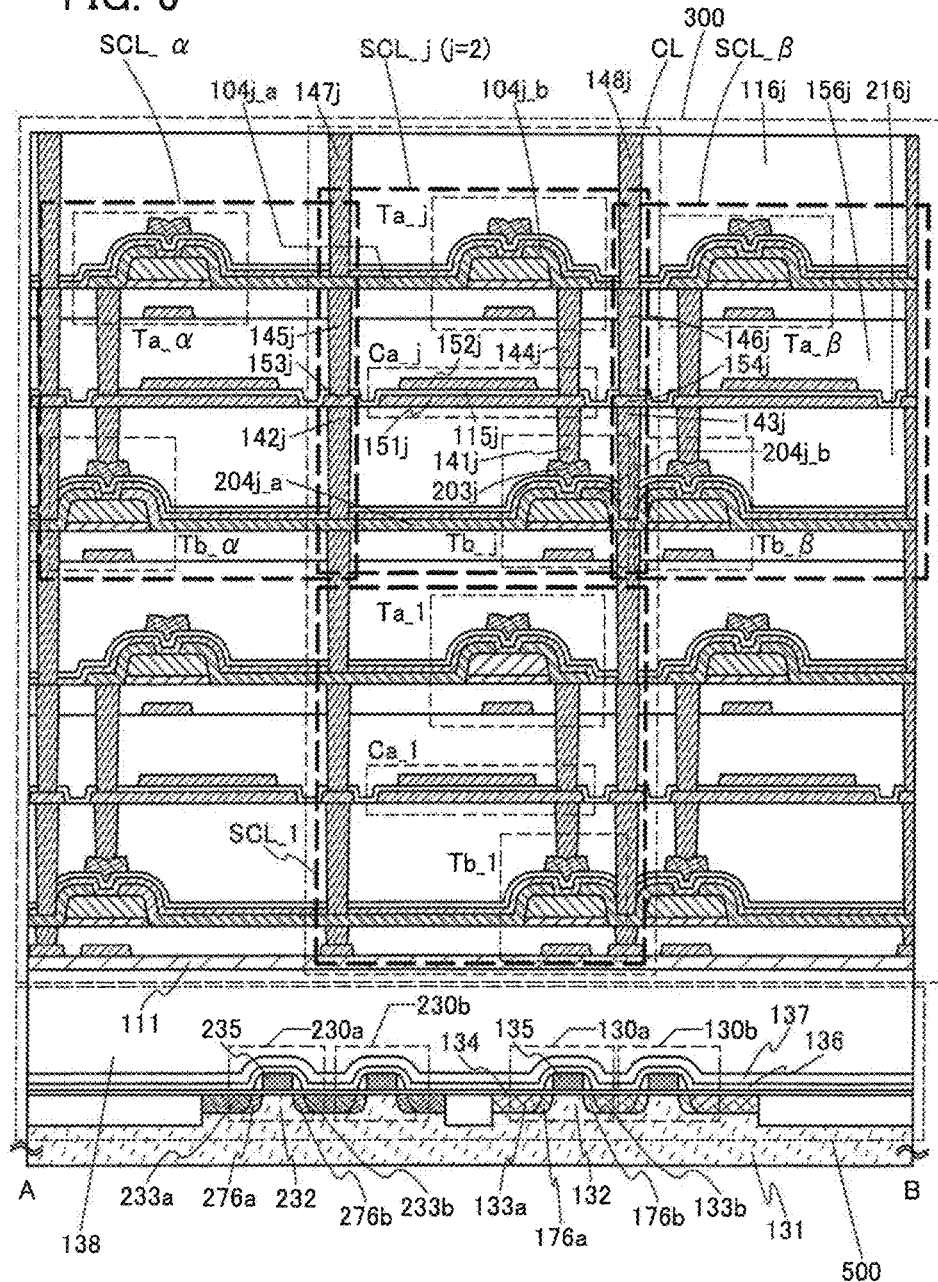
FIG. 6 A drawing showing an example of a semiconductor device of one embodiment of the present invention.

Next, an example of a stacked-layer structure including the memory cell array 300 illustrated in FIGS. 1A and 1B is described using FIG. 6.

A stacked-layer structure shown in FIG. 6 is an example of the semiconductor device 700 including the memory cell array 300 and the peripheral circuit 500.

The peripheral circuit 500 includes a transistor 130a, a transistor 130b, a transistor 230a, and a transistor 230b. The transistor 130a, the transistor 130b, the transistor 230a, and the transistor 230b contain a first semiconductor material. As semiconductors that can be used as the first semiconductor material, semiconductor materials such as silicon, germanium, gallium, and arsenic; compound semiconductor materials containing silicon, germanium, gallium, arsenic, or aluminum; organic semiconductor materials; oxide semiconductor materials; or the like is given. Here, the case where single crystal silicon is used as the first semiconductor material is described. Although the transistor 130a, the transistor 130b, the transistor 230a, and the transistor 230b may be either a p-channel type or an n-channel type, an appropriate transistor may be used depending on the circuit configuration or the driving method. Here, n-channel type transistors are given as examples of the transistor 130a and the transistor 130b, and p-channel type transistors are given as examples of the transistor 230a and the transistor 230b. Here, because the transistor 130a and the transistor 130b have almost similar structures, only the transistor 130a is described. Furthermore, because the transistor 230a and the transistor 230b are almost similar in structure, only the transistor 230a is described.

The transistor 130a is provided for a semiconductor substrate 131 and includes a semiconductor layer 132 which is part of the semiconductor substrate 131, a gate insulating film 134, a gate electrode 135, and a low-resistance layer 133a and a low-resistance layer 133b each functioning as a source region or a drain region.

A region of the semiconductor layer 132 where a channel is formed, a region in the vicinity thereof, the low-resistance layer 133a and the low-resistance layer 133b to be a source region or a drain region, and the like preferably contain a semiconductor such as a silicon-based semiconductor, more preferably contain single crystal silicon. Alternatively, it may be formed of a material including Ge (germanium), SiGe (silicon germanium), GaAs (gallium arsenide), GaAlAs (gallium aluminum arsenide), or the like. Alternatively, a structure using silicon having crystal lattice distortion may be employed. Alternatively, the transistor 130a may be a HEMT (High Electron Mobility Transistor) with GaAs, GaAlAs, or the like.

Furthermore, the transistor 130a may include a region 176a and a region 176b which are LDD (lightly doped drain) regions.

The low-resistance layer 133a and the low-resistance layer 133b contain an element that imparts n-type conductivity, such as phosphorus, or an element that imparts p-type conductivity, such as boron, in addition to a semiconductor material used for the semiconductor layer 132.

For the gate electrode 135, a semiconductor material such as silicon containing the element that imparts n-type conductivity, such as phosphorus, or the element that imparts p-type conductivity, such as boron, or a conductive material such as a metal material, an alloy material, or a metal oxide material can be used. It is particularly preferable to use a high-melting-point material that has both heat resistance and conductivity, such as tungsten or molybdenum, and it is particularly preferable to use tungsten.

The transistor 230a is provided for the semiconductor substrate 131 and includes a semiconductor layer 232 which is part of the semiconductor substrate 131, the gate insulating film 134, a gate electrode 235, and a low-resistance layer 233a and a low-resistance layer 233b each functioning as a source region or a drain region.

For the semiconductor layer 232, the description of the semiconductor layer 132 may be referred to. Furthermore, for the low-resistance layer 233a and the low-resistance layer 233b, the description of the low-resistance layer 133a and the low-resistance layer 133b may be referred to. Furthermore, for the gate electrode 235, the description of the gate electrode 135 may be referred to.

Furthermore, for example, in the case where the transistor 130a is an n-channel type transistor and the transistor 230a is a p-channel type transistor, for example, phosphorus may be added to the low-resistance layer 133a and the low-resistance layer 133b, and, for example, boron may be added to the low-resistance layer 233a and the low-resistance layer 233b. Furthermore, for example, materials with different work functions may be used for the gate electrode 135 and the gate electrode 235.

Figure 17A:
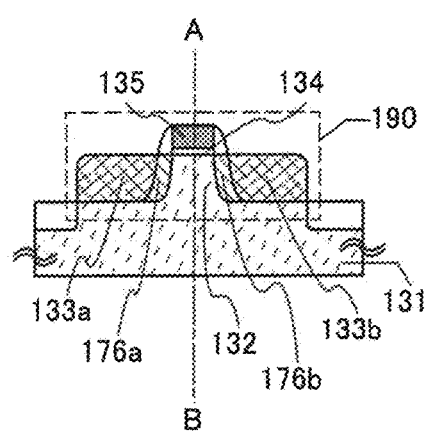
FIGS. 17A and 17B Drawings showing an example of a transistor.
Figure 17B:
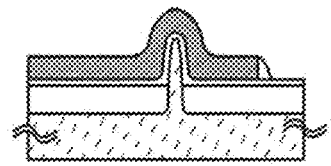

Here, a transistor 190 as shown in FIGS. 17A and 17B may be used instead of the transistor 130a, the transistor 130b, the transistor 230a, and the transistor 230b. Note that an example of an n-channel type transistor is shown in FIGS. 17A and 17B, but a similar structure can be used for a p-channel type transistor. A cross section along dashed dotted line A-B illustrated in FIG. 17A is shown in FIG. 17B. In the transistor 190, the semiconductor layer 132 (part of the semiconductor substrate 131) in which a channel is formed has a protruding shape, and the gate insulating film 134 and the gate electrode 135 are provided along a side surface and an upper surface of the protruding portion. The transistor 190 is also referred to as a FIN transistor because it utilizes a protruding portion of the semiconductor substrate. Note that an insulating film serving as a mask for forming the protruding portion may be provided in contact with the top of the protruding portion. Furthermore, although the case where the protruding portion is formed by processing part of the semiconductor substrate is described here, a semiconductor layer having a protruding shape may be formed by processing an SOI substrate.

An insulating film 136, an insulating film 137, and an insulating film 138 are sequentially stacked to cover the transistor 130a, the transistor 130b, the transistor 230a, and the transistor 230b.

In a manufacturing process of the semiconductor device, the insulating film 136 functions as a protective film at the time of activating an element imparting conductivity that is added to the low-resistance layer 133a, the low-resistance layer 133b, the low-resistance layer 233a, the low-resistance layer 233b, and the like. The insulating film 136 is not necessarily provided when not needed.

In the case where a silicon-based semiconductor material is used for the semiconductor layer 132 and the semiconductor layer 232, the insulating film 137 preferably includes an insulating material containing hydrogen. The insulating film 137 containing hydrogen is provided over the transistor 130a, transistor 130b, the transistor 230a, and the transistor 230b, and heat treatment is performed, whereby dangling bonds in the semiconductor layer 132 and the semiconductor layer 232 are terminated by hydrogen in the insulating film 137, so that the reliability of the transistor 130a, transistor 130b, the transistor 230a, and the transistor 230b can be improved.

The insulating film 138 functions as a planarization layer that planarizes a level difference caused by the transistor 130a, the transistor 130b, the transistor 230a, the transistor 230b, and the like that are provided in a layer thereunder. The upper surface of the insulating film 138 may be planarized by planarization treatment using a CMP (Chemical Mechanical Polishing) method or the like in order to increase the planarity of the upper surface thereof.

Furthermore, a plug or the like that is electrically connected to the low-resistance layer 133a, the low-resistance layer 133b, the low-resistance layer 233a, the low-resistance layer 233b, and the like may be embedded in the insulating film 136, the insulating film 137, and the insulating film 138.

Furthermore, a transistor using an oxide semiconductor is included in the memory cell array 300. Therefore, the stacked-layer structure shown in FIG. 6 preferably includes a barrier film 111 between the memory cell array 300 and the transistor 130a, the transistor 130b, the transistor 230a, and the transistor 230b.

The barrier film 111 is a layer having a function of suppressing water and hydrogen of layers below the barrier film 111 from diffusing upward. Furthermore, the barrier film 111 preferably has low oxygen permeability. Furthermore, the barrier film 111 may have an opening or a plug for electrically connecting an electrode or a wiring provided over the barrier film 111 to an electrode or a wiring provided below the barrier film 111. Here, a film to which water and hydrogen are less likely to diffuse refers to a film which has lower water and hydrogen permeability than silicon oxide or the like that is generally used as an insulating film, for example. Furthermore, a film having low oxygen permeability refers to a film having lower oxygen permeability than silicon oxide or the like that is generally used as an insulating film.

Here, it is preferable that hydrogen, water, and the like in the layers below the barrier film 111 be reduced as much as possible. Alternatively, degasification is preferably reduced. Hydrogen or water might become a factor that causes changes in the electrical characteristics of an oxide semiconductor. Furthermore, hydrogen or water diffusing from the layers below the barrier film 111 to the layers over the barrier film 111 can be suppressed by the barrier film 111; however, the hydrogen or water might diffuse to the layers thereover through an opening, a plug, or the like provided in the barrier film 111.

To reduce hydrogen and water contained in the layers below the barrier film 111 or to reduce degasification, heat treatment for removing the hydrogen and the water contained in the layers below the barrier film 111 or for reducing degasification is preferably performed before the formation of the barrier film 111 or immediately after the formation of an opening for forming a plug in the barrier film 111. The heat treatment is preferably performed at as high a temperature as possible as long as the heat resistance of the conductive films and the like in the semiconductor device and the electrical characteristics of the transistor are not degraded. Specifically, the temperature may be, for example, 450° C. or higher, preferably 490° C. or higher, further preferably 530° C. or higher, or may be 650° C. or higher. It is preferable that the heat treatment be performed under an inert gas atmosphere or a reduced pressure atmosphere for 1 hour or longer, preferably 5 hours or longer, further preferably 10 hours or longer. The temperature is determined in consideration of the heat resistance of the materials of wirings or electrodes positioned in the layer below the barrier film 111; for example, in the case where the heat resistance of the materials is low, the temperature is preferably 550° C. or lower, 600° C. or lower, 650 or lower, or 800° C. or lower. Such heat treatment may be performed at least once but is preferably performed more than once.

It is preferable that the amount of released hydrogen molecules of the insulating film provided in the layer below the barrier film 111, which is measured by thermal desorption spectroscopy analysis (also referred to as TDS analysis), at a substrate surface temperature of 400° C. be lower than or equal to 130%, preferably lower than or equal to 110% of that at 300° C. Alternatively, it is preferable that the amount of released hydrogen molecules measured by TDS analysis at a substrate surface temperature of 450° C. be lower than or equal to 130%, preferably lower than or equal to 110% of that at 350° C.

Water and hydrogen contained in the barrier film 111 itself are also preferably reduced. Alternatively, degasification is preferably reduced. For example, a material where the amount of released hydrogen molecules (M/z=2) at a substrate surface temperature of 20° C. to 600° C., which is measured by TDS analysis, is less than $2\times10^{15}/cm^2$, preferably less than $1\times10^{15}/cm^2$, and further preferably less than $5\times10^{14}/cm^2$ is preferably used for the barrier film 111. Alternatively, a material where the amount of released water molecules (M/z=18) at a substrate surface temperature of 20° C. to 600° C., which is measured by TDS analysis, is less than $1\times10^{16}/cm^2$, preferably less than $5\times10^{15}/cm^2$, and further preferably less than $2\times10^{12}/cm^2$ is preferably used for the barrier film 111.

Furthermore, the heat treatment can also serve as treatment (also referred to as hydrogenation treatment) for terminating, with hydrogen, dangling bonds (also referred to as dangling bonds) of silicon used in the semiconductor layers of the transistor 130a, the transistor 130b, the transistor 230a, and the transistor 230b. By the hydrogenation treatment, part of hydrogen contained in the gate insulating films of the transistor 130a, the transistor 130b, the transistor 230a, and the transistor 230b or other insulating films formed in the layers below the barrier film 111 is released and diffused to the semiconductor layers of the transistor 130a, the transistor 130b, the transistor 230a, and the transistor 230b to terminate dangling bonds in silicon, so that the reliability of the transistor 130a, the transistor 130b, the transistor 230a, and the transistor 230b can be improved.

As a material that can be used for the barrier film 111, a single layer or a stacked layer of an insulating film containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) can be used. Alternatively, aluminum oxide, bismuth oxide, germanium oxide, niobium oxide, silicon oxide, titanium oxide, tungsten oxide, yttrium oxide, zirconium oxide, or gallium oxide may be added to the insulating films, for example Alternatively, the insulating film may be subjected to nitriding treatment to be an oxynitride film. A layer of silicon oxide, silicon oxynitride, or silicon nitride may be stacked over the insulating film Gallium oxide or the like is given. Aluminum oxide is particularly preferable because of its excellent barrier property against water or hydrogen.

For the barrier film 111, a layer of a material which is not permeated with water or hydrogen easily and a layer containing another insulating material may be stacked and used. For example, a layer containing silicon oxide or silicon oxynitride, a layer containing a metal oxide, and the like may be stacked.

Furthermore, for the barrier film 111, a material that is not permeated with oxygen easily is preferably used. The above-described materials have excellent barrier properties against oxygen as well as hydrogen and water. The use of such materials can suppress diffusion of oxygen released when an insulating film 114j is heated to the layers below the barrier film 111. Consequently, the amount of oxygen that is released from the insulating film 114j and is likely to be supplied to the semiconductor layers of the transistor Ta_j and the transistor Tb_j can be increased.

In this manner, the concentration of hydrogen or water contained in each layer provided in the layer below the barrier film 111 is reduced or the hydrogen or water is removed or degasification is suppressed, and furthermore, diffusion of hydrogen or water to the transistor Ta_j and the transistor Tb_j is suppressed by the barrier film 111. Thus, the amount of hydrogen and water contained in the insulating film 114j and the layers in the transistor Ta_j and the transistor Tb_j can be extremely low. For example, the concentration of hydrogen contained in the insulating film 114j, semiconductor layers 101j of the transistor Ta_j and the transistor Tb_j, or a gate insulating film 102j can be reduced to, for example, lower than $5\times10^{18}$ cm$^{-3}$, preferably lower than $1\times10^{18}$ cm$^{-3}$, further preferably lower than $3\times10^{17}$ cm$^{-3}$.

With the above structure, high reliability can be obtained in both of the peripheral circuit 500 including the transistor using silicon as the semiconductor layer and the memory cell array 300 including the transistor using an oxide semiconductor as the semiconductor layer, which can achieve a semiconductor device having extremely high reliability.

Note that in the above description, the example in which the peripheral circuit 500 includes the transistor using silicon as the semiconductor layer is shown; however, the peripheral circuit 500 may include both the transistor using silicon as the semiconductor layer and the transistor using an oxide semiconductor as the semiconductor layer. In that case, for example, after the barrier film 111 is formed over the transistor using silicon as the semiconductor layer, the transistor using an oxide semiconductor as the semiconductor layer may be stacked over the barrier film 111 to form the peripheral circuit 500. Furthermore, the memory cell array 300 including the transistor using an oxide semiconductor as the semiconductor layer may be stacked over the peripheral circuit 500.

Here, an example of a circuit configuration in which a p-channel type transistor using silicon as the semiconductor layer and an n-channel type transistor using an oxide semiconductor as the semiconductor layer are used and which can be used for the peripheral circuit 500 is described.
[CMOS Circuit]

Figure 26A:
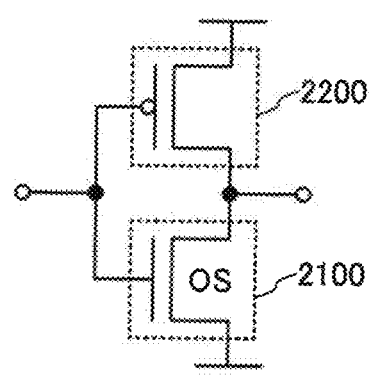
FIGS. 26A and 26B Circuit diagrams of an embodiment.

A circuit diagram in FIG. 26A shows a configuration of what is called a CMOS circuit in which a p-channel type transistor 2200 and an n-channel type transistor 2100 are connected to each other in series and in which gates of them are connected to each other. Note that in drawings, a transistor in which a second semiconductor material is used is denoted by a symbol "OS".
[Analog Switch]

Figure 26B:
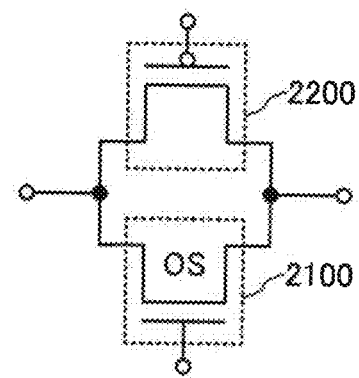

Furthermore, a circuit diagram shown in FIG. 26B shows a configuration in which sources of the transistor 2100 and the transistor 2200 are connected to each other and drains thereof are connected to each other. With such a configuration, the transistors can function as what is called an analog switch.
[Stacked-Layer Structure Example 1]

Next, a stacked-layer structure example of a semiconductor device including the memory cell array 300 and the peripheral circuit 500 is described with reference to FIG. 6.

The memory cell array 300 is provided over the peripheral circuit 500. The memory cell array 300 includes the memory cell CL. The memory cell CL includes c sub memory cells SCL_j (j is a natural number of 1 to c). In FIG. 6, a stacked-layer structure example of the sub memory cell SCL_1 and the sub memory cell SCL_2 is shown; the sub memory cell SCL_3 to the sub memory cell SCL_c are further stacked in order over the sub memory cell SCL_2, though not shown. Note that FIG. 1B is referred to for a circuit diagram of the memory cell array 300.

The sub memory cell SCL_j includes the transistor Ta_j, the transistor Tb_j, and the capacitor Ca_j. The transistor Ta_j and the transistor Tb_j include an oxide semiconductor material. Here, the barrier film 111 is preferably provided between the transistor Tb_j and the peripheral circuit 500 in the case where j=1.

Furthermore, the capacitor Ca_j is provided over the transistor Tb_j. Furthermore, at least part of the capacitor Ca_j is preferably provided to overlap with the transistor Tb_j. Here, a conductive layer 151j which is one of terminals of the capacitor Ca_j is electrically connected to a gate electrode 203j of the transistor Tb_j through a plug 141j. Furthermore, an insulating film 216j is provided between the transistor Tb_j and the capacitor Ca_j.

The transistor Ta_j is provided over the capacitor Ca_j. At least part of the transistor Ta_j is preferably provided to overlap with the capacitor Ca_j. Here, the gate electrode 203j and the conductive layer 151j are electrically connected to a conductive layer 104j_b functioning as the source electrode or the drain electrode of the transistor Ta_j through the plug 141j and a plug 144j. An insulating film 115j included in the capacitor Ca_j is provided between the conductive layer 151j and a conductive layer 152j and forms capacitance. Furthermore, an insulating film 156j is provided between the capacitor Ca_j and the transistor Ta_j. Furthermore, an insulating film 116j is provided over the transistor Ta_j.

A conductive layer 204j_b functioning as the source electrode or the drain electrode of the transistor Tb_j is electrically connected to the source line SL. Here, a plug 143j, a conductive layer 154j, a plug 146j, a plug 148j, and the like may function as the source line SL.

A conductive layer 204j-a functioning as the source electrode or the drain electrode of the transistor Tb_j is electrically connected to a conductive layer 104j_a functioning as the source electrode or the drain electrode of the transistor Ta_j through a plug 142j, a conductive layer 153j, a plug 145j, and the like. Furthermore, the conductive layer 204j_a and the conductive layer 104j_a are electrically connected to the bit line BL. Here, the plug 142j, the conductive layer 153j, the plug 145j, and the like may function as the bit line BL.

Furthermore, the sub memory cell SCL_j and an adjacent sub memory cell SCL_α share the plug 142j, the conductive layer 153j, the plug 145j, the plug 147j, and the like. The sub memory cell SCL_α is electrically connected to the bit line BL through the plug 142j, the conductive layer 153j, the plug 145j, the plug 147j, and the like. Similarly, the sub memory cell SCL_j and an adjacent sub memory cell SCL_β share the plug 143j, the conductive layer 154j, the plug 146j, the plug 148j, and the like. The sub memory cell SCL_β is electrically connected to the source line SL through the plug 143j, the conductive layer 154j, the plug 146j, the plug 148j, and the like. The integration degree of the memory cell array 300 can be increased by sharing plugs and a conductive layer in this manner.

Here, the sub memory cell SCL_α is a sub memory cell included in a memory cell CL_α adjacent to the memory cell CL. Here, an adjacent memory cell refers to a memory cell whose value of x or y in x and y coordinates (x, y) shown in FIG. 1A differs by one. For example, the memory cell CL_α is positioned on coordinates where an x coordinate is smaller by one than that in the memory cell CL. Similarly, for example, the memory cell CL_β is positioned on coordinates where an x coordinate is larger by one than that in the memory cell CL.

The transistor Tb_j included in the sub memory cell SCL_j and a transistor Tb_α included in the sub memory cell SCL_α share the conductive layer 204$j$_a. That is, the conductive layer 204$j$_a functions as one of the source electrode and the drain electrode of the transistor Tb_j, and functions as one of a source electrode and a drain electrode of the transistor Tb_α. Furthermore, the transistor Tb_j and a transistor Tb_β included in the sub memory cell SCL_β share the conductive layer 204$j$_b. That is, the conductive layer 204$j$_b functions as the other of the source electrode and the drain electrode of the transistor Tb_j, and functions as one of a source electrode and a drain electrode of the transistor Tb_β. The integration degree of the memory cell array 300 can be increased by sharing a conductive layer in this manner.

The transistor Ta_j included in the sub memory cell SCL_j and a transistor Ta_α, included in the sub memory cell SCL_α share the conductive layer 104$j$_a. That is, the conductive layer 104$j$_a functions as one of the source electrode and the drain electrode of the transistor Ta_j, and functions as one of a source electrode and a drain electrode of the transistor Ta_α. The integration degree of the memory cell array 300 can be increased by sharing a conductive layer in this manner.

Here, structures of the transistor Ta_j and the transistor Tb_j are described. The transistor Ta_j and the transistor Tb_j are transistors including an oxide semiconductor. An example of a transistor structure that can be used for the transistor Ta_j and the transistor Tb_j is shown in FIGS. 7A to 7E.

Figure 7A:
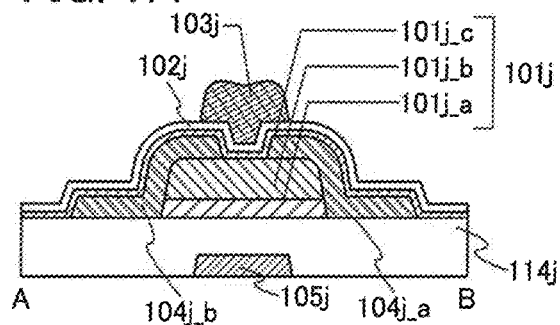
FIGS. 7A to 7E Drawings showing examples of a semiconductor device of one embodiment of the present invention.
Figure 7B:
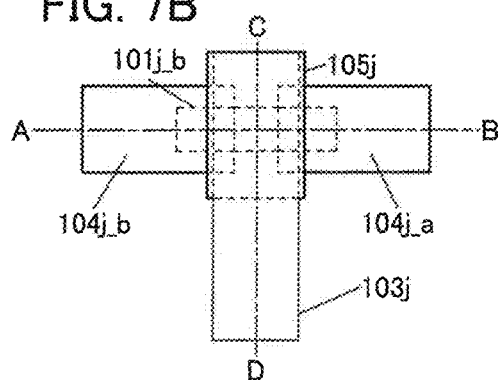
Figure 7C:
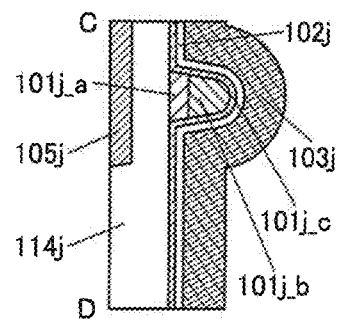

FIG. 7B is a top view of a transistor structure that can be used for the transistors Ta_j and Tb_j, FIG. 7A shows a cross section along dashed-dotted line A-B shown in FIG. 7B, and FIG. 7C shows a cross section along dashed-dotted line C-D shown in FIG. 7B. Here, the transistor Ta_j is shown as an example, but the transistor Tb_j can have a similar structure. Furthermore, for each component of the transistor Tb_j, the description of the transistor Ta_j is referred to. For example, for a semiconductor layer 201$j$, the semiconductor layer 101$j$ is referred to. Furthermore, for a gate insulating film 202$j$, the gate insulating film 102$j$ is referred to. Furthermore, for a gate electrode 203$j$, a gate electrode 103$j$ is referred to. Furthermore, for a conductive layer 204$j$_a and a conductive layer 204$j$_b the conductive layer 104$j$_a and the conductive layer 104$j$_b are referred to. Furthermore, for an insulating film 214$j$, the insulating film 114$j$ is referred to. Furthermore, for a conductive layer 205$j$, a conductive layer 105$j$ is referred to.

The transistor Ta_j includes the semiconductor layer 101$j$ in contact with the upper surface of the insulating film 114$j$, the conductive layer 104$j$_a and the conductive layer 104$j$_b, the gate insulating film 102$j$ over the semiconductor layer 101$j$, and the gate electrode 103$j$ overlapping with the semiconductor layer 101$j$ with the gate insulating film 102$j$ positioned therebetween. Furthermore, an insulating film is provided to cover the transistor Ta_j. Here, although not shown, three layers of an insulating film 112$j$, an insulating film 113$j$, and the insulating film 116$j$ can be stacked and used as the insulating film covering the transistor Ta_j, for example. The insulating film 112$j$, the insulating film 113$j$, and the insulating film 116$j$ are described in a manufacturing method example to be described later. One of the conductive layer 104$j$_a and the conductive layer 104$j$-b functions as the source electrode and the other functions as the drain electrode.

The transistor Ta_j shown in FIGS. 7A to 7C includes a semiconductor layer 101$j$_a, a semiconductor layer 101$j$_b in contact with the upper surface of the semiconductor layer 101$j$_a, the conductive layer 104$j$_a and the conductive layer 104$j$_b that are in contact with the upper surface of the semiconductor layer 101$j$_b and are apart from each other in a region overlapping with the semiconductor layer 101$j$_b, the semiconductor layer 101$j$_c in contact with the upper surface of the semiconductor layer 101$j$_b, the gate insulating film 102$j$ over the semiconductor layer 101$j$_c, and the gate electrode 103$j$ overlapping with the semiconductor layer 101$j$_b with the gate insulating film 102$j$ and the semiconductor layer 101$j$_c positioned therebetween. Furthermore, the transistor Ta_j includes the conductive layer 105$j$ functioning as a second gate electrode. The semiconductor layer 101$j$_a is provided between the insulating film 114$j$ and the semiconductor layer 101$j$_b. Furthermore, the semiconductor layer 101$j$_c is provided between the semiconductor layer 101$j$_b and the gate insulating film 102$j$. Furthermore, the conductive layer 104$j$_a and the conductive layer 104$j$_b are in contact with the upper surface of the semiconductor layer 101$j$_b.

Figure 7D:
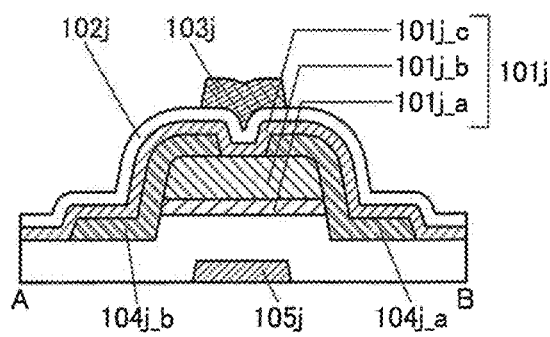
Figure 7E:
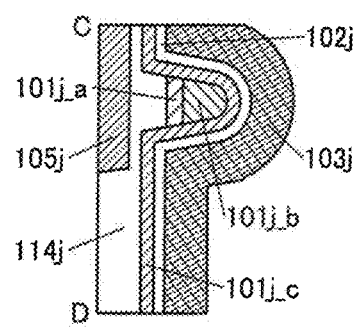

Furthermore, as in cross-sectional views shown in FIG. 7D and FIG. 7E corresponding to FIG. 7A and FIG. 7C, respectively, the insulating film 114$j$ may have a protruding portion and the semiconductor layer 101$j$_a and the semiconductor layer 101$j$_b may be provided over the protruding portion.

Figure 18A:
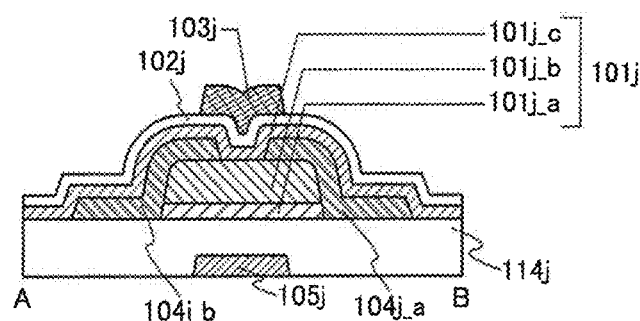
FIGS. 18A to 18E Drawings showing examples of a semiconductor device of one embodiment of the present invention.
Figure 18B:
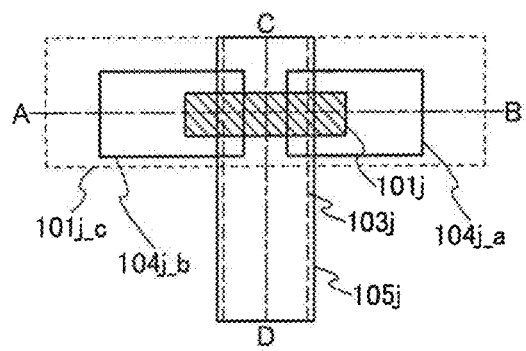
Figure 18C:
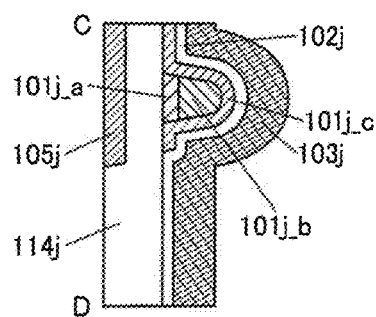

Furthermore, as shown in FIGS. 18A to 18C, for example, in a cross section in FIG. 18C, a structure where the gate insulating film 102$j$ covers an end portion of the semiconductor layer 101$j$_c may be used.

The semiconductor layer 101$j$ of the transistor Ta_j is preferably provided over the insulating film 114$j$. The insulating film 114$j$ preferably includes oxide. In particular, an oxide material from which part of oxygen is released by heating is preferably included. It is preferable that oxide containing oxygen more than oxygen of the stoichiometric composition be used. In the case where an oxide semiconductor is used as the second semiconductor material, oxygen released from the insulating film 114$j$ is supplied to the oxide semiconductor, so that oxygen vacancies in the oxide semiconductor can be reduced. Consequently, changes in the electrical characteristics of the second transistor can be reduced and the reliability of the second transistor can be improved.

It is preferable that the upper surface of the insulating film 114$j$ be planarized by planarization treatment described above.

An oxide material from which part of oxygen is released by heating is preferably used for the insulating film 114$j$.

As the oxide material from which oxygen is released by heating, oxide containing oxygen more than oxygen of the stoichiometric composition is preferably used. Part of oxygen is released by heating from an oxide film containing oxygen more than oxygen of the stoichiometric composition. The oxide film containing oxygen more than oxygen of the stoichiometric composition is an oxide film that releases oxygen molecules the amount of which is more than or equal to $1.0 \times 10^{18}$ atoms/cm$^3$, preferably more than or equal to $3.0 \times 10^{20}$ atoms/cm$^3$ in thermal desorption spectroscopy (TDS: Thermal Desorption Spectroscopy) analysis at a film surface temperature of higher than or equal to 100° C. and lower than or equal to 700° C., preferably higher than or equal to 100° C. and lower than or equal to 500° C.

For example, as such a material, a material containing silicon oxide or silicon oxynitride is preferably used. Alternatively, metal oxide can be used. As the metal oxide, aluminum oxide, aluminum oxynitride, gallium oxide, gallium oxynitride, yttrium oxide, yttrium oxynitride, hafnium oxide, hafnium oxynitride, or the like can be used. Note that in this specification, silicon oxynitride refers to a material that contains more oxygen than nitrogen in its composition, and silicon nitride oxide refers to a material that contains more nitrogen than oxygen in its composition.

Similarly, the semiconductor layer 201*j* included in the transistor Tb_j is preferably provided over the insulating film 214*j*.

Furthermore, the transistor Ta_j preferably includes the conductive layer 105*j*. The conductive layer 105*j* preferably functions as the second gate of the transistor Ta_j.

Figure 19A:
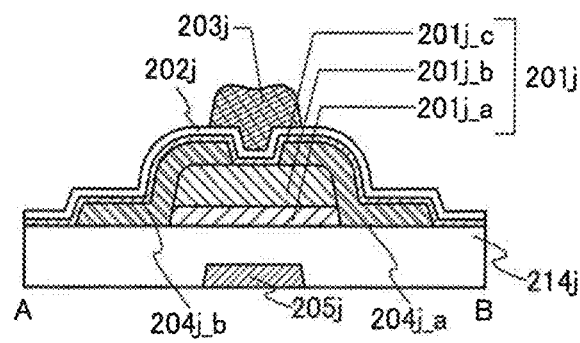
FIGS. 19A to 19E Drawings showing examples of a semiconductor device of one embodiment of the present invention.
Figure 19B:
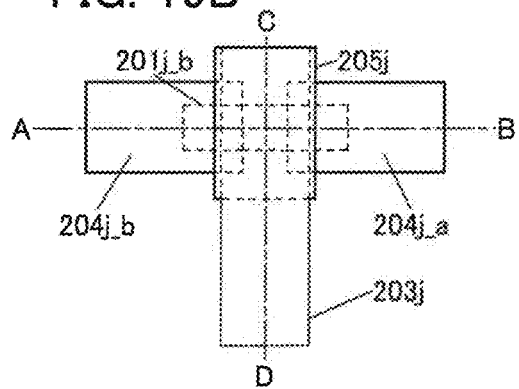
Figure 19C:
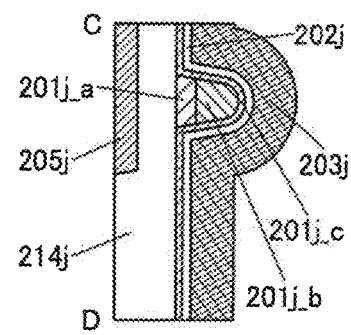

As shown in FIGS. 19A to 19C, the transistor Tb_j includes the semiconductor layer 201*j* in contact with the upper surface of the insulating film 214*j*, the conductive layer 204*j*_a and the conductive layer 204*j*_b, the gate insulating film 202*j* over the semiconductor layer 201*j*, and the gate electrode 203*j* overlapping with the semiconductor layer 201*j* with the gate insulating film 202*j* provided therebetween. Furthermore, an insulating film 212*j*, an insulating film 213*j*, and the insulating film 216*j* are provided to cover the transistor Tb_j. One of the conductive layer 204*j*_a and the conductive layer 204*j*_b functions as the source electrode and the other functions as the drain electrode.

Furthermore, the transistor Tb_j may include the conductive layer 205*j*. The conductive layer 205*j* may function as the second gate of the transistor Tb_j.

Here, in the case where voltages are applied between electrodes of the conductive layer 105*j* included in the transistor Ta_j and the conductive layer 205*j* included in the transistor Tb_j, the voltages may be different. Here, a difference between a voltage applied to the conductive layer 105*j* and a source voltage is referred to as Vbg_1, and a difference between a voltage applied to the conductive layer 205*j* and a source voltage is referred to as Vbg_2. By increasing absolute values of Vbg_1 and Vbg_2, lower off-state current can be achieved in some cases. On the other hand, when the absolute values of Vbg_1 and Vbg_2 are increased too much, a rising voltage of on-state current is increased, so that the transistors can be operated at low current voltage. Therefore, considering that off-state current of the transistor Ta_j is preferably lower than that of the transistor Tb_j, the absolute value of Vbg_1 may be larger than the absolute value of Vbg_2, for example. By making the absolute values of the Vbg_1 and Vbg_2 differ in this manner, retention characteristics of the semiconductor device can be improved, and power consumption can be reduced. Furthermore, the operation speed of the semiconductor device can be increased.

Note that the semiconductor layer 101*j* may be formed of a single layer, or may be formed with a stacked-layer structure of the semiconductor layer 101*j*_a, the semiconductor layer 101*j*_b, and the semiconductor layer 101*j*_c as in the example illustrated in FIGS. 7A to 7E. Similarly, the semiconductor layer 201*j* may be formed of a single layer or may be formed with a stacked-layer structure of a semiconductor layer 201*j*_a, a semiconductor layer 201*j*_b, and a semiconductor layer 201*j*_c.

For the insulating film 112*j*, as in the case of the barrier film 111, a material to which water and hydrogen do not easily diffuse is preferably used. Furthermore, in particular, a material that is not permeated with oxygen easily is preferably used for the insulating film 112*j*. Note that the insulating film 112*j* may have a stacked-layer structure of two or more layers. In this case, for example, the insulating film 112*j* may have a stacked-layer structure of two layers in which, for example, silicon oxide, silicon oxynitride, silicon nitride oxide, silicon nitride, aluminum oxide, aluminum oxynitride, aluminum nitride oxide, aluminum nitride, or the like is used for the lower layer. Furthermore, a material to which water and hydrogen do not easily diffuse is preferably used for the upper layer, as in the case of the barrier film 111. Furthermore, an insulating film provided in the lower layer may be an insulating film from which oxygen is released by heating as in the case of the insulating film 114*j*, so that oxygen is supplied also from above the semiconductor layer 101*j* through the gate insulating film 102*j*.

By covering the semiconductor layer 101*j* with the insulating film 112*j* including a material that is not permeated with oxygen easily, release of oxygen from the semiconductor layer 101*j* to a portion over the insulating film 112*j* can be suppressed. Furthermore, oxygen released from the insulating film 114*j* can be confined below the insulating film 112*j*; thus, the amount of oxygen to be supplied to the semiconductor layer 101*j* can be increased.

Furthermore, the insulating film 112*j* that is not permeated with water or hydrogen easily can suppress entry of water or hydrogen, which is an impurity for an oxide semiconductor, from the outside so that change in electrical characteristics of the transistor Ta_j can be suppressed and a highly reliable transistor can be achieved.

Note that an insulating film from which oxygen is released by heating like the insulating film 114*j* may be provided below the insulating film 112*j* to supply oxygen also from a portion over the semiconductor layer 101*j* through the gate insulating film 102*j*.

For the insulating film 212*j* over the transistor Tb_j, the description of the insulating film 112*j* may be referred to.

As shown in FIG. 7A, a side surface of the semiconductor layer 101*j*_b of the transistor Ta_j is in contact with the conductive layer 104*j*_a and the conductive layer 104*j*_b. Furthermore, the semiconductor layer 101*j*_b can be electrically surrounded by an electric field of the gate electrode 103*j* (a structure in which a semiconductor is electrically surrounded by an electric field of a conductor is referred to as a surrounded channel (s-channel) structure). Therefore, a channel is formed in the entire semiconductor layer 101*j*_b (bulk) in some cases. In the s-channel structure, a large amount of current can flow between a source and a drain of a transistor, so that a current at the time of conduction (on-state current) can be increased.

It can be said that the s-channel structure is suitable for a miniaturized transistor because a high on-state current can be obtained. A semiconductor device including the transistor can have a high integration degree and high density because the transistor can be miniaturized. For example, the transistor includes a region where the channel length is preferably less than or equal to 40 nm, further preferably less than or equal to 30 nm, still further preferably less than or equal to 20 nm, and the transistor includes a region where the channel width is preferably less than or equal to 40 nm, further preferably less than or equal to 30 nm, still further preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

Meanwhile, in a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a "surrounded channel width (SCW: Surrounded Channel Width)" in some cases. Further, in this specification, in the case where the term "channel width" is simply used, it denotes a surrounded channel width or an apparent channel width in some cases. Alternatively, in this specification, in the case where the term "channel width" is simply used, it denotes an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electron field-effect mobility, a current value per channel width, and the like of a transistor are obtained by calculation, a surrounded channel width is used for the calculation in some cases. In those cases, a value different from one in the case where an effective channel width is used for the calculation may be obtained.

It is preferable that the semiconductor layer 101$j$ and the semiconductor layer 201$j$ include a semiconductor having a wider energy gap than silicon. The semiconductor layer 101$j$ preferably includes an oxide semiconductor. A semiconductor material having a wider energy gap and a lower carrier density than silicon is preferably used because off-state current of the transistor can be reduced.

The use of such a material for the semiconductor layer makes it possible to provide a highly reliable transistor in which a change in the electrical characteristics is suppressed.

Note that a preferable mode and a formation method of an oxide semiconductor that can be used for the semiconductor layer are described in detail in an embodiment later.

Note that in this specification and the like, the carrier density of a substantially intrinsic oxide semiconductor layer is lower than $1 \times 10^{17}/cm^3$, lower than $1 \times 10^{15}/cm^3$, lower than $1 \times 10^{13}/cm^3$, lower than $8 \times 10^{11}/cm^3$, lower than $1 \times 10^{11}/cm^3$, or lower than $1 \times 10^{10}/cm^3$, and is higher than or equal to $1 \times 10^{-9}/cm^3$. With a highly purified intrinsic oxide semiconductor layer, stable electric characteristics can be imparted to the transistor.

When an In-Ga-Zn-based oxide having an atomic ratio of In:Ga:Zn=1:1:1, 2:1:3, 3:1:2, or 4:2:3 is used for the semiconductor layer 101$j$_b, for example, an In-Ga-Zn-based oxide having an atomic ratio of In:Ga:Zn=1:3:2, 1:3:4, 1:3:6, 1:6:4, 1:6:8, 1:6:10, 1:9:6, 1:2:3, or the like can be used for the semiconductor layer 101$j$_a or the semiconductor layer 101$j$_c. Note that the atomic ratio of each of the semiconductor layer 101$j$_b, the semiconductor layer 101$j$_a, and the semiconductor layer 101$j$_c may vary within a range of ±20% of the above-described atomic ratio as an error. For the semiconductor layer 101$j$_a and the semiconductor layer 101$j$_c, materials with the same composition or materials with different compositions may be used.

Furthermore, when an In-M-Zn-based oxide is used for the semiconductor layer 101$j$_b, a target for forming the semiconductor film serving as the semiconductor layer 101$j$_b is preferably an oxide containing metal elements in the atomic ratio satisfying the following: given that the atomic ratio of metal elements in the target is In:M:Zn=$x_1$:$y_1$:$z_1$, a value of $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, 2:1:3, 3:1:2, and the like.

Furthermore, when an In-M-Zn-based oxide is used for the semiconductor layer 101$j$_a and the semiconductor layer 101$j$_c, a target for forming oxide semiconductor films to be the semiconductor layer 101$j$_a and the semiconductor layer 101$j$_c is preferably an oxide containing metal elements at the atomic ratio satisfying the following: given that the atomic ratio of metal elements in the target is In:M:Zn=$x_2$:$y_2$:$z_2$, $x_2/y_2$ is less than $x_1/y_1$ and a value of $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, 1:3:6, 1:3:8, and the like.

In the case where an oxide semiconductor is formed by a sputtering method, a film having an atomic ratio different from the atomic ratio of the target may be formed. In particular, the atomic ratio of zinc in a film is smaller than the atomic ratio thereof in the target in some cases. Specifically, the proportion of zinc in the film is approximately 40 atomic % to 90 atomic % of that of zinc in the target in some cases.

For the conductive layer 104j_a and the conductive layer 104j_b, a single-layer structure or a stacked-layer structure of metal such as aluminum, titanium, chromium, nickel, copper, yttrium, zirconium, molybdenum, silver, tantalum, or tungsten or an alloy containing it as its main component is used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 102j may be formed with a single layer or a stacked layer of, for example, silicon oxide, silicon oxynitride, silicon nitride oxide, aluminum oxide, hafnium oxide, gallium oxide, Ga-Zn-based metal oxide, silicon nitride, and the like.

Furthermore, for the gate insulating film 102j, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or yttrium oxide may be used.

Furthermore, the gate insulating film 102j can be formed using an oxide insulating film such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide, a nitride insulating film such as silicon nitride, silicon nitride oxide, aluminum nitride, or aluminum nitride oxide, or a film of a mixed material of these.

Furthermore, as the gate insulating film 102j, an oxide insulating film that contains more oxygen than oxygen in the stoichiometric composition is preferably used, as in the case of the insulating film 114j.

Note that when a specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower); thus, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In either case, it is preferable that the semiconductor device be not exposed to temperatures of 125° C. or higher for one hour or more after the treatment.

The gate electrode 103j can be formed using, for example, a metal selected from aluminum, chromium, copper, tantalum, titanium, molybdenum, and tungsten; an alloy containing the above-described metal as a component; an alloy containing above-described metals in combination; or the like. Furthermore, one or more metals selected from manganese and zirconium may be used. Alternatively, a semiconductor typified by polycrystalline silicon doped with an impurity element such as phosphorus, or a silicide such as nickel silicide may be used. Furthermore, the gate electrode 103j may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more selected from titanium, tantalum, tungsten, molybdenum, chromium, neodymium, and scandium are combined may be used.

Furthermore, for the gate electrode 103j, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. It is also possible to have a stacked-layer structure of the above light-transmitting conductive material and the above metal.

Furthermore, for the conductive layer 105j, a material similar to that used for the gate electrode 103j may be used.

Furthermore, an In-Ga-Zn-based oxynitride semiconductor film, an In-Sn-based oxynitride semiconductor film, an In-Ga-based oxynitride semiconductor film, an In-Zn-based oxynitride semiconductor film, a Sn-based oxynitride semiconductor film, an In-based oxynitride semiconductor film, a film of metal nitride (such as InN or ZnN), or the like may be provided between the gate electrode 103j and the gate insulating film 102*j*. These films have a work function higher than or equal to 5 eV, preferably higher than or equal to 5.5 eV, which is higher than the electron affinity of an oxide semiconductor; thus, the threshold voltage of a transistor including an oxide semiconductor can be shifted in the positive direction, and a switching element having what is called normally-off characteristics can be obtained. For example, in the case of using an In-Ga-Zn-based oxynitride semiconductor film, an In-Ga-Zn-based oxynitride semiconductor film having a higher nitrogen concentration than at least the semiconductor layer 101*j*, specifically an In-Ga-Zn-based oxynitride semiconductor film having a nitrogen concentration higher than or equal to 7 at. %, is used.

Note that the structure shown in FIG. 7A is an example in which the edge portions of the gate insulating film 102*j* and the semiconductor layer 101*j*_c are processed so as to be substantially aligned with each other, and the gate electrode 103*j* is processed so as to be positioned on the inner side than the gate insulating film; alternatively, the edge portions of the gate insulating film 102*j*, the semiconductor layer 101*j*_c, and the gate electrode 103*j* may be processed so as to be substantially aligned with one another. Alternatively, the edge portions of the gate insulating film 102*j*, the semiconductor layer 101*j*_c, and the gate electrode may be processed so as not to be aligned with one another.

Furthermore, examples of different structures of the transistor Ta_j and the transistor Tb_j are briefly described using FIG. 18D, FIG. 18E, FIG. 19D, and FIG. 19E. Here, although the transistor Ta_j is described, a similar structure can be used for the transistor Tb_j.

Figure 18D:
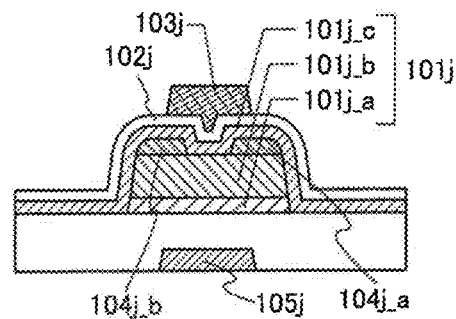

In forming the semiconductor layer 101*j*_a and the semiconductor layer 101*j*_b, a conductive film 104 is formed, a resist mask is formed, the conductive film 104 is etched, and then a semiconductor layer to be the semiconductor layer 101*j*_a and a semiconductor layer to be the semiconductor layer 101*j*_b are formed by etching. After that, the conductive film 104 is processed again to form the semiconductor layer 104*j*_a and the semiconductor layer 104*j*_b, so that a structure as shown in FIG. 18D can be obtained.

Figure 18E:
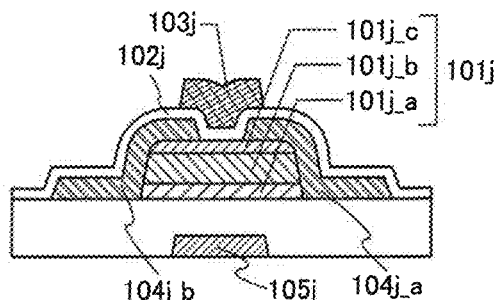

Alternatively, the semiconductor layer 101*j*_c may be provided in contact with lower surfaces of the conductive layer 104*j*_a and the conductive layer 104*j*_b as shown in FIG. 18E. Such a structure enables films used for the semiconductor layer 101*j*_a, the semiconductor layer 101*j*_b, and the semiconductor layer 101*j*_c to be formed successively without contact with the air and therefore can reduce defects at each interface.

Figure 19D:
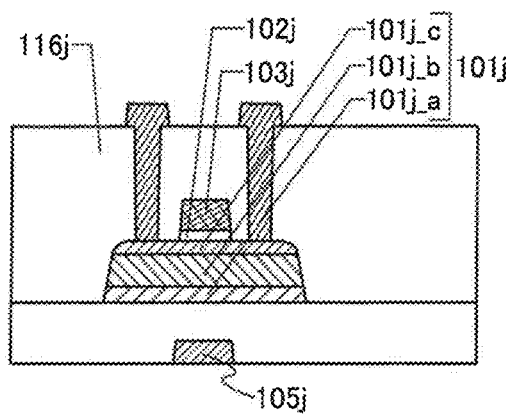

Alternatively, the transistor Ta_j may have a structure shown in FIG. 19D. In the example shown in FIG. 19D, opening portions are provided in the insulating film 116*j* and plugs are formed, so that a source electrode and a drain electrode are obtained. Furthermore, the transistor Ta_j may include the insulating film 112*j* and the insulating film 113*j* below the insulating film 116*j*.

Figure 19E:
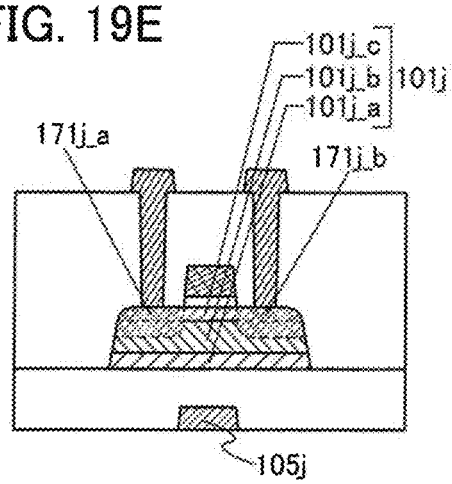

Alternatively, low-resistance regions may be provided in the semiconductor layer 101*j* as shown in FIG. 19E. First, a semiconductor film to be the semiconductor layer 101*j* is formed over the insulating film 114*j*, and then, a resist mask or the like is formed and etching is performed to form the semiconductor layer 101*j*. Next, an insulating film to be the gate insulating film 102*j* and a conductive film to be the gate electrode 103*j* are formed, a resist mask or the like is formed, and then etching is performed to form the gate electrode 103*j* and the gate insulating film 102*j*.

Then, a low-resistance region 171*j*_a and a low-resistance region 171*j*_b are formed. A semiconductor layer having high carrier density has low resistance. As ways to increase the carrier density, for example, addition of an impurity, formation of oxygen vacancies, and the like can be given. For example, as a way to increase the carrier density, an element may be added by ion implantation. As the element which can be used, one or more kinds selected from argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added. The low-resistance region 171*j*_a and the low-resistance region 171*j*_b are, for example, regions each containing any of the above impurities in the semiconductor layer 101*j* at a concentration of higher than or equal to $5 \times 10^{19}$ atoms/cm$^3$, preferably higher than or equal to $1 \times 10^{20}$ atoms/cm$^3$, further preferably higher than or equal to $2 \times 10^{20}$ atoms/cm$^3$, still further preferably higher than or equal to $5 \times 10^{20}$ atoms/cm$^3$.

There is a possibility that, for example, unnecessary hydrogen can be trapped in such a low-resistance region. The trap of unnecessary hydrogen in the low-resistance layer can reduce the hydrogen concentration of the channel region, and as a result, the transistor Ta_j can have favorable characteristics.

In the examples shown in FIG. 7A to 7E, FIGS. 18A to 18E, and FIGS. 19A to 19E, the structure in which the semiconductor layer 101*j*_a and the semiconductor layer 101*j*_c are provided in contact with the semiconductor layer 101*j*_b is described; however, a structure without one or both of the semiconductor layer 101*j*_a and the semiconductor layer 101*j*_c may be employed.

The above is the description of the transistor Ta_j and the transistor Tb_j.

The insulating film 116*j* covering the transistor Ta_j functions as a planarization layer which covers an uneven shape of a layer thereunder. Furthermore, the insulating film 113*j* may have a function as a protective film when the insulating film 116*j* is formed. The insulating film 113*j* is not necessarily provided.

Similarly, the insulating film 216*j* covering the transistor Tb_j functions as a planarization layer which covers an uneven shape of a layer thereunder. Furthermore, the insulating film 213*j* may have a function as a protective film when the insulating film 216*j* is formed. The insulating film 213*j* is not necessarily provided.

Furthermore, the description of the insulating film 116*j* may be referred to for the insulating film 156*j* covering the capacitor Ca_j.

The plug 147*j* and the like that are electrically connected to the conductive layer 104*j*_a and the like are embedded in the insulating film 112*j*, the insulating film 113*j*, and the insulating film 116*j*.

Furthermore, the plug 141*j* and the like that are electrically connected to the gate electrode 203*j*, the conductive layer 151*j*, and the like are embedded in the insulating film 212*j*, the insulating film 213*j*, and the insulating film 216*j*.

Furthermore, as illustrated in FIG. 6, the insulating film 137 which contains the same material as the barrier film 111 may be provided over the insulating film 136 containing hydrogen. This structure can effectively suppresses water or hydrogen remaining in the insulating film 136 containing hydrogen from diffusing upward. In that case, heat treatment for removing water or hydrogen may performed twice or more in total: before formation of the insulating film 137, and after formation of the insulating film 137 and before formation of the barrier film 111.

A conductive material such as a metal material, an alloy material, or a metal oxide material can be used as a material for the plug 141j to the plug 148j, the conductive layer 151j to the conductive layer 154j, and the like. It is particularly preferable to use a high-melting-point material that has both heat resistance and conductivity, such as tungsten or molybdenum, and it is particularly preferable to use tungsten. Furthermore, a material such as titanium nitride or titanium and another material may be stacked. For example, use of titanium nitride or titanium can improve adhesion with the opening portion. Furthermore, it is preferable that the plug 141j to the plug 148j, the conductive layer 151j to the conductive layer 154j, and the like be provided so as to be embedded in the insulating films and the upper surfaces thereof be each planarized.

Oxide semiconductor layers are repeatedly stacked to form a semiconductor layer in the transistor Ta_j and the transistor Tb_j, whereby c sub memory cells SCL can be stacked as shown in FIG. 1A, FIG. 6, and the like. Accordingly, the capacity per area can be increased.

In a conventional transistor using silicon, germanium, or a compound thereof, in particular, in an element having a short channel length, it is preferable that a gate electric field be strengthened in order to reduce a short-channel effect, and the thickness of a gate insulating film is preferably reduced in order to strengthen the gate electric field.

In contrast, a transistor using an oxide semiconductor film is an accumulation-type transistor in which electrons are majority carriers. Therefore, the influence of DIBL (Drain-Induced Barrier Lowering) as a short-channel effect is smaller than in an inversion-type transistor having a pn junction. In other words, the transistor using an oxide semiconductor film is resistant to a short-channel effect.

The transistor using an oxide semiconductor film can have a thicker gate insulating film than a conventional transistor including silicon or the like because of its high resistance to a short-channel effect. For example, a gate insulating film with a thickness as large as approximately 10 nm can be used in a minute transistor having a channel length and a channel width of 50 nm or less. Here, when the gate insulating film is thick, parasitic capacitance can be small. Thus, dynamic behavior of a circuit may be improved. Furthermore, when the gate insulating film is thick, leakage current and power consumption may be low.

Furthermore, a drain electric field is strengthened with a reduction in the channel length; thus, a reduction in reliability due to hot-carrier degradation noticeably occurs in a conventional transistor using silicon or the like, in particular, having a short channel width. In contrast, in some cases, avalanche breakdown or the like is less likely to occur in the case of using an oxide semiconductor than in a conventional transistor using silicon or the like, because, for example, an oxide semiconductor has a wide energy gap (e.g., 2.5 eV or more in an oxide semiconductor containing indium, gallium, and zinc) and thus electrons are less likely to be excited, and the effective mass of a hole is large. Therefore, it may be possible to inhibit hot-carrier degradation or the like due to avalanche breakdown.

When the gate insulating film is thick, the withstand voltage of the gate insulating film can be increased, so that the transistor can be driven at a higher gate voltage. In addition, hot-carrier degradation is inhibited, whereby the transistor can be driven at a high drain voltage without lengthening of the channel length. Thus, the reliability of the transistor in a circuit supplied with high voltage can be increased, and the channel length can be reduced, so that the integration degree of the circuit can be increased.

In a transistor using an intrinsic or substantially intrinsic oxide semiconductor film, when the distance between the source electrode and the drain electrode is sufficiently short, the energy at the bottom of the valence band is low because of the electric fields of the source and the drain, so that the energy at the bottom of the valence band is close to the Fermi level. This phenomenon is called a Conduction Band Lowering Effect (CBL effect). Owing to the CBL effect, a drain current starts to flow at a low gate voltage that is close to 0 V in the Vg-Id characteristics, so that the driving voltage of the transistor may be reduced.

Here, a CAAC-OS film is preferably used as the oxide semiconductor film. It is preferable that the CAAC-OS film have a high CAAC proportion. An increase in the CAAC proportion enables, for example, a reduction in influence of carrier scattering in the transistor, resulting in high field-effect mobility. Furthermore, furthermore, the influence of a grain boundary can be reduced; as a result, variation in on-state characteristics of the transistor can be reduced. Thus, a highly reliable semiconductor device can be obtained. Furthermore, use of the transistor with small variation can reduce driving voltage to reduce power consumption. In addition, for example, a CAAC-OS film having a low density of defects can be obtained. Alternatively, a CAAC-OS film with a small amount of impurities can be obtained. A reduction in the density of defects makes it possible to obtain extremely low off-state current characteristics, for example. The CAAC-OS film is described later.

Here, the semiconductor layer $101j\_b$ included in the transistor Ta_j and the semiconductor layer $201j\_b$ included in the transistor Tb_j may be formed using different materials. For example, in the case where an In-M-Zn oxide is used for the semiconductor layer $101j\_b$ and the semiconductor layer $201j\_b$, materials differing in the atomic ratio of indium to an element M and zinc may be used.

Furthermore, transistors having different structures may be used for the transistor Ta_j and the transistor Tb_j. Furthermore, the transistor Ta_j and the transistor Tb_j may have different channel widths. Similarly, the transistor Ta_j and the transistor Tb_j may have different channel lengths.

Furthermore, the semiconductor layer 101j included in the transistor Ta_j and the semiconductor layer 201j included in the transistor Tb_j preferably include an oxide semiconductor including In, the element M, and Zn. The case is described in which the atomic ratio of In to M and Zn in the oxide semiconductor included in the semiconductor layer 101j satisfies In:M:Zn=a:b:c, whereas the atomic ratio of In to M and Zn in the oxide semiconductor included in the semiconductor layer 201j satisfies In:M:Zn=d:e:f. Here, for example, it is preferable that $a/(a+b+c)$ be smaller than $d/(d+e+f)$. When the percentage of indium content is increased, overlaps of the s orbitals are increased; therefore, the mobility of oxide in which the percentage of indium content is high is higher than that of oxide in which the percentage of indium content is low. Therefore, when oxide having a high indium content is used as the oxide semiconductor film, carrier mobility can be increased. However, when the percentage of indium content is decreased, off-state current can be reduced in some cases, which is preferable.

[Stacked-Layer Structure Example2]

Figure 8:
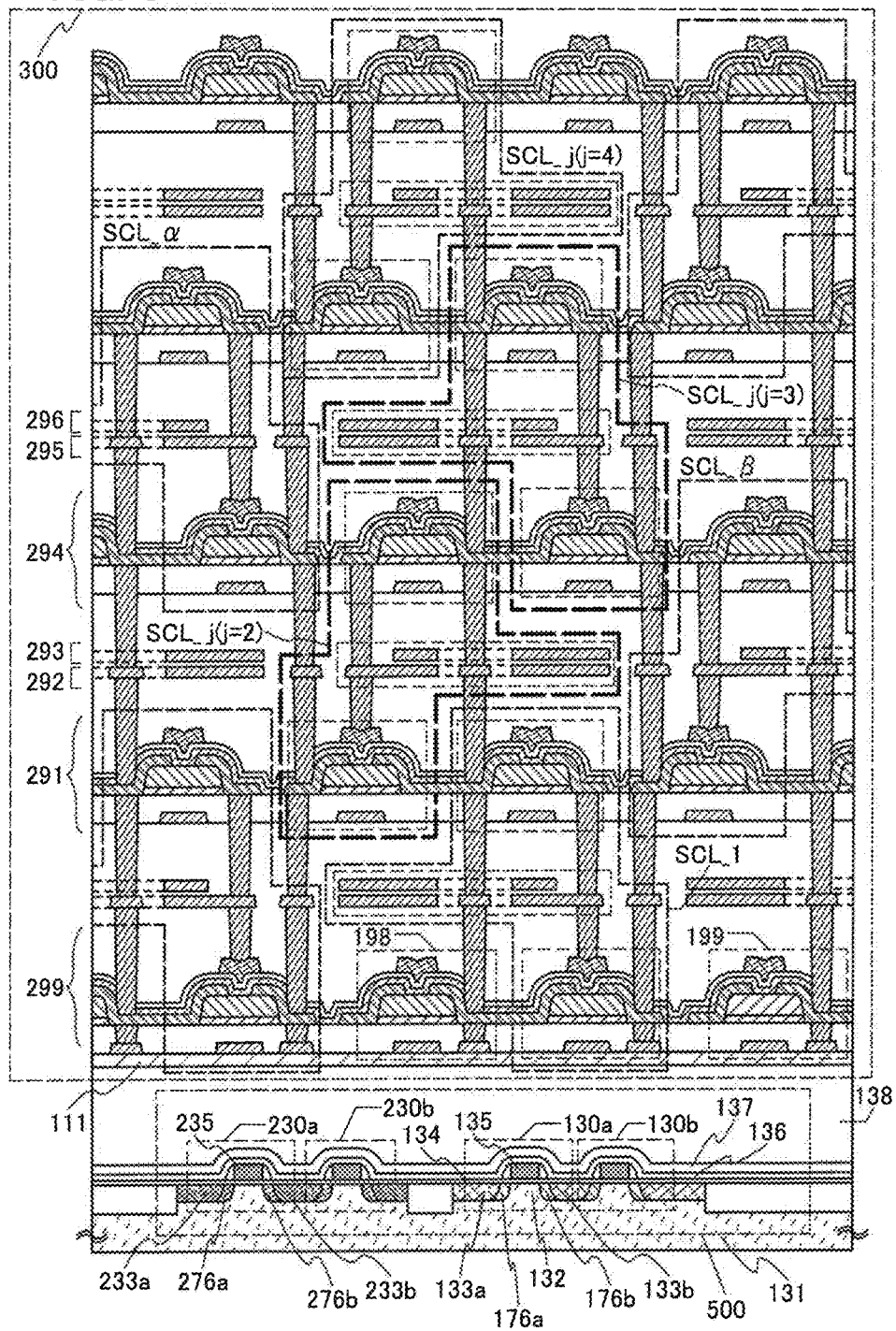
FIG. 8 A drawing showing an example of a semiconductor device of one embodiment of the present invention.

Furthermore, a stacked-layer structure shown in FIG. 8 is an example of the stacked-layer structure of the semiconductor device which is different from that shown in FIG. 6. The semiconductor device shown in FIG. 8 includes a memory cell array 300 and the peripheral circuit 500. Note that although FIG. 8 shows layers stacked up to j=4, layers of sub memory cells of j=5 or more may be stacked in reality; the number of stacked layers is preferably as large as possible because the integration degree of the memory can be increased accordingly. For a circuit diagram of the memory cell array 300 shown in FIG. 8, for example, FIG. 4 is referred to. Here, in FIG. 8, the interface between films and the like are partly omitted to make the diagram easy to understand.

Figure 10:
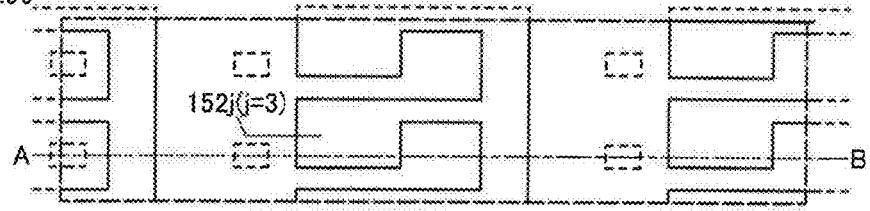
FIG. 10 A drawing showing an example of a semiconductor device of one embodiment of the present invention.
Figure 10:
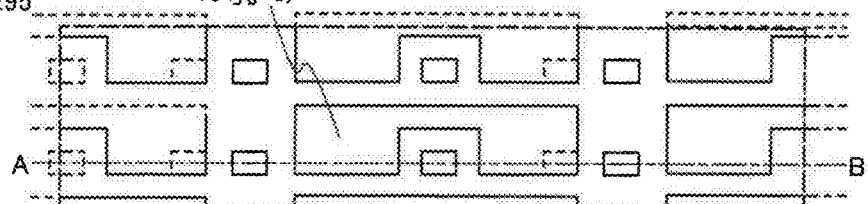
Figure 10:
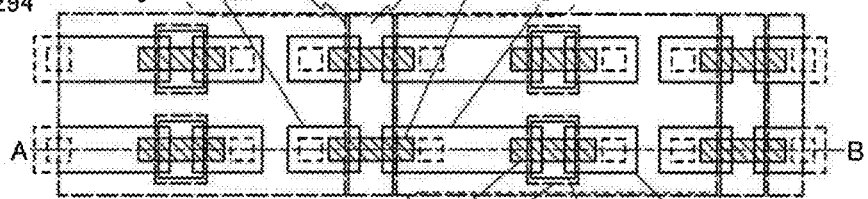
Figure 10:
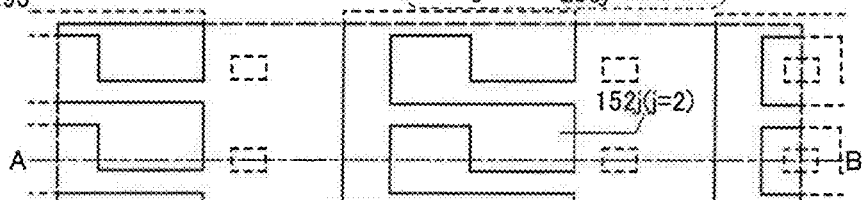
Figure 10:
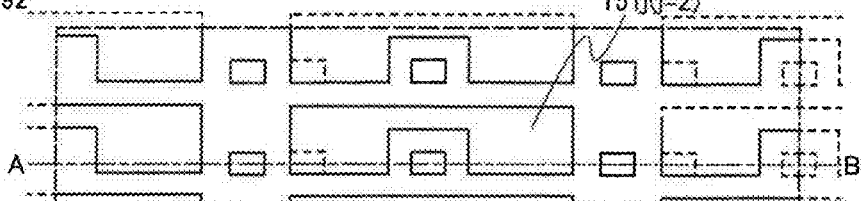
Figure 10:
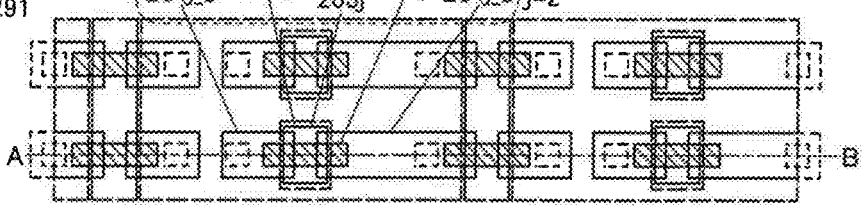

Here, a layer 291 shown in FIG. 8 includes transistors. Furthermore, a layer 292 and a layer 293 shown in FIG. 8 include conductive layers. Furthermore, a layer 294 shown in FIG. 8 includes transistors. Furthermore, a layer 295 and a layer 296 shown in FIG. 8 include conductive layers. Top views of the layer 291 to the layer 296 shown in FIG. 8 are shown in FIG. 10.

A transistor, a capacitor, a transistor, a transistor, a capacitor, and a transistor are stacked in this order in FIG. 6, whereas a transistor, a capacitor, a transistor, and a capacitor are stacked in this order in FIG. 8 by arranging sub memory cells in a staggered configuration. Thus, the process can be simplified.

Figure 9:
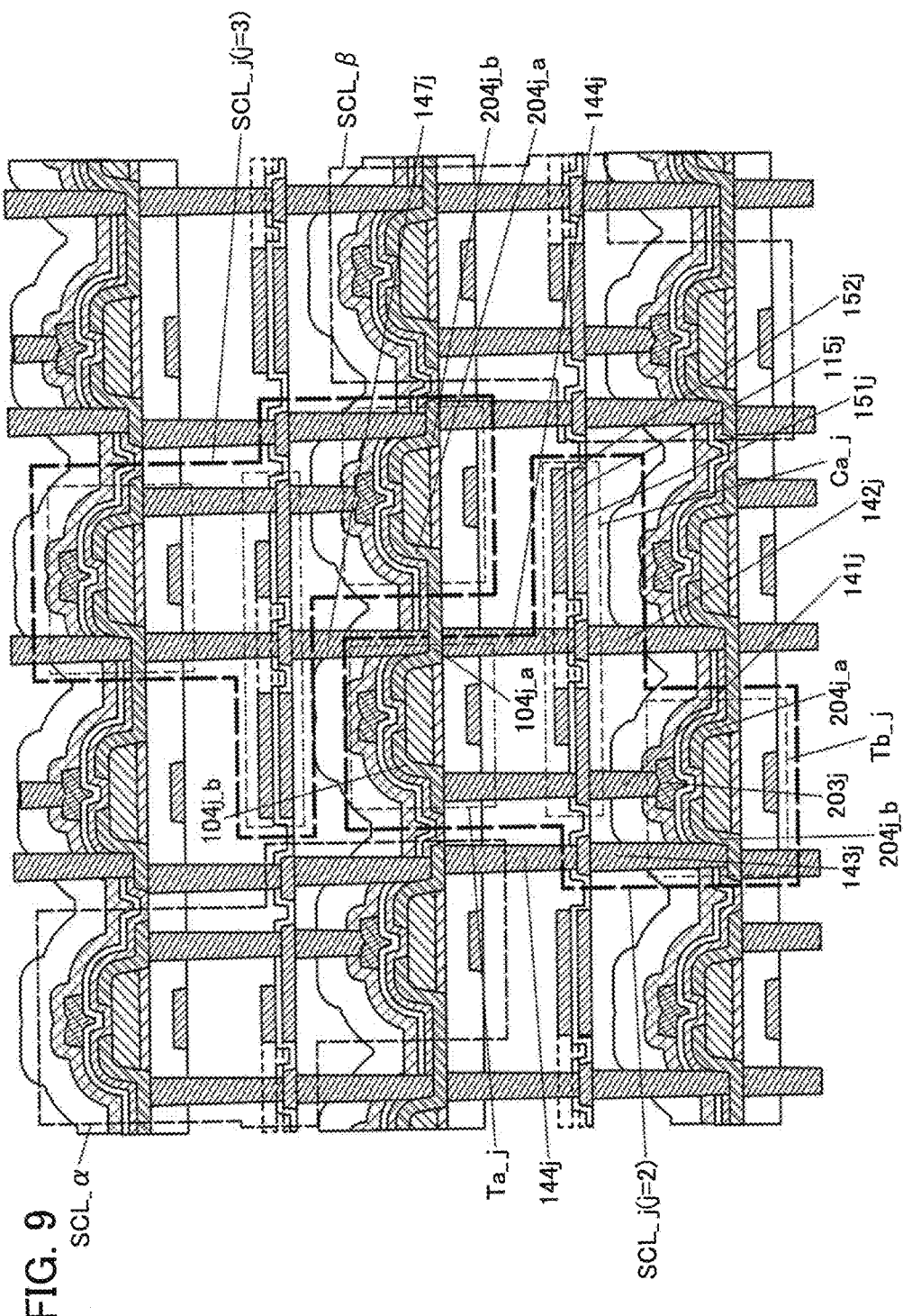
FIG. 9 A drawing showing an example of a semiconductor device of one embodiment of the present invention.

FIG. 9 is an enlarged view of part of FIG. 8. The capacitor Ca_j is provided over the transistor Tb_j. Furthermore, at least part of the capacitor Ca_j is preferably provided to overlap with the transistor Tb_j. Furthermore, part of the capacitor Ca_j may be provided to overlap with a transistor included in an adjacent sub memory cell. In an example shown in FIG. 9, for example, a capacitor Ca_□ included in the sub memory cell SCL_3 is provided to overlap with a transistor Ta_2 included in the sub memory cell SCL_2, so that the integration degree of the memory cell array 300 can be increased.

Furthermore, the sub memory cell SCL_2 and the sub memory cell SCL_3 have structures symmetrical to each other in FIG. 9. With such a structure, the sub memory cells can be arranged in a staggered configuration, and the capacitor can be formed over the transistor in the adjacent sub memory cell, whereby the integration degree can be increased. Furthermore, by the arrangement in a staggered configuration, the process can be more simplified than that of FIG. 6. That is, the sub memory cells stacked one above the other include transistors formed in the same layer. Specifically, for example, the transistor Ta_j(j=m-1) included in the sub memory cell SCL_j(j=m-1) and the transistor Tb_j(j=m) included in the sub memory cell SCL_j (j=m) are formed in the same layer. That is, for example, the transistor Ta_j(j=m-1) and the transistor Tb_(j=m) are formed over and in contact with a first insulating film That is, for example, the semiconductor layer 101j(j=m-1) included in the transistor Ta_j(j=m-1) and the semiconductor layer 201j(j=m) included in the transistor Tb_j(j=m) are formed over and in contact with the first insulating film. Furthermore, the memory cell array 300 includes the first insulating film in contact with the semiconductor layer 101j(j=m-1) and the semiconductor layer 201j(j=m). Furthermore, for example, a second insulating film is formed to be over and in contact with the gate electrode 103j(j=m-1) included in the transistor Ta_j(j=m-1) and the gate electrode 203j(j=m) included in the transistor Tb_j(j=m). Furthermore, the memory cell array 300 includes the second insulating film in contact with the gate electrode 103j(j=m-1) and the gate electrode 203j(j=m). Here, m is a natural number of 2 or more.

In this manner, transistors included in adjacent sub memory cells arranged one above the other are partly formed in the same layer, whereby the memory cell array 300 can be manufactured by fewer steps. Manufacturing by fewer steps can increase yield. Furthermore, because the number of layers to be stacked can be reduced, parasitic capacitance in the whole circuit can be reduced.

In addition, with the increase in the number of stacked layers, the films are possibly peeled or broken due to film stress of insulating films, conductive films, semiconductor films, and the like. Therefore, when the number of layers to be stacked is reduced, the malfunction of the semiconductor device due to film peeling or the like can be suppressed.

The conductive layer 151j which is one of the terminals of the capacitor Ca_j is electrically connected to the gate electrode 203j of the transistor Tb_j through the plug 141j.

The transistor Ta_j is provided over the capacitor Ca_j. Furthermore, at least part of the transistor Ta_j is preferably provided to overlap with the capacitor Ca_j. Here, the gate electrode 203j and the conductive layer 151j are electrically connected to the conductive layer 104j_b functioning as the source electrode or the drain electrode of the transistor Ta_j through the plug 141j and the plug 144j. The insulating film 115j included in the capacitor Ca_j is provided between the conductive layer 151j and the conductive layer 152j and forms capacitance.

The conductive layer 204j_b functioning as the source electrode or the drain electrode of the transistor Tb_j is electrically connected to the source line SL.

The conductive layer 204j_a functioning as the source electrode or the drain electrode of the transistor Tb_j is electrically connected to the conductive layer 104j_a functioning as the source electrode or the drain electrode of the transistor Ta_j through the plug 142j and the like. Furthermore, the conductive layer 204j_a and the conductive layer 104j_a are electrically connected to the bit line BL.

Furthermore, the sub memory cell SCL_j and an adjacent sub memory cell preferably share a conductive layer, a plug, and the like. For example, the conductive layer 204j_a functioning as the source electrode or the drain electrode of the transistor Tb_j included in the sub memory cell SCL_2 and the source electrode or the drain electrode of the transistor Ta_j included in an adjacent sub memory cell SC_1 are shared. Furthermore, the conductive layer 104j_a functioning as the source electrode or the drain electrode of the transistor Ta_j included in the sub memory cell SCL_2 and the source electrode or the drain electrode of the transistor Tb_j included in the sub memory cell SCL_3 are shared. The integration degree of the memory cell array 300 can be increased by sharing the conductive layer in this manner.

Furthermore, the transistor 198 and the transistor 199 shown in FIG. 8 are what is called dummy transistors not included in any of sub memory cells. Therefore, the transistor 198 and the transistor 199 are generally considered unnecessary for a memory cell array. However, providing the transistor 198 and the transistor 199 enables the layer 299 to be formed using the same mask as that for the layer 294 or the like. Therefore, the number of masks that are necessary can be reduced, leading to the cost reduction. Furthermore, in a lithography process, particularly in the case where a minute pattern is formed, a change in the distance between lines or the like may lead to a variation in finished line width or the like in some cases. Therefore, in the case where a lithography process is used for the manufacture of the memory cell array 300, the layer 294 and the layer 299 are preferably formed using the same mask, because conditions such as a distance between patterns can be shared and a minute pattern is easily formed in the layer 294 and the layer 299, and furthermore, sizes of semiconductor layers, conductive layers, gate electrodes, and the like of finished transistors can be uniform. Furthermore, a distance between transistors, between a transistor and a wiring, and between wirings does not vary much; therefore, interference of an electric field such as capacity between wirings can be uniform, and a variation in characteristics between sub memories can be reduced in some cases. Note that a gate electrode and a conductive layer which are included in each of the transistor 198 and the transistor 199 are not necessarily connected to another transistor or a wiring. In that case, the formation of an unnecessary plug and wiring can be omitted. Furthermore, although not shown in FIG. 8, it is preferable that a dummy transistor be similarly provided in the uppermost layer of the memory cell array 300.

Here, the transistor 198 and the transistor 199 which are dummy transistors may be connected to part of the write word line WWL, the read word line RWL, the bit line BL, the floating node FN, and the source line SL, or may be connected to none of them.

For example, the transistor 198 and the transistor 199 which are dummy transistors may be connected to only the source line SL, or may be connected to the source line SL and the bit line BL.

Furthermore, for example, the transistor 198 and the transistor 199 which are dummy transistors are connected to one of terminals of a capacitor, and the other of the terminals of the capacitor is not necessarily connected to the write word line WWL.

Here, in FIG. 8, the layer 299 and the layer 294 preferably include the same number of transistors, for example Alternatively, transistors having substantially the same shape are preferably included.

Furthermore, in FIG. 8, the layer 299 and the layer 294 preferably include the same number of semiconductor layers, for example Alternatively, semiconductor layers having substantially the same shape are preferably included.

Furthermore, in FIG. 8, the layer 299 and the layer 294 preferably include the same number of gate electrodes, for example. Alternatively, gate electrodes having substantially the same shape are preferably included.

[Stacked-Layer Structure Example 3]

Figure 11A:
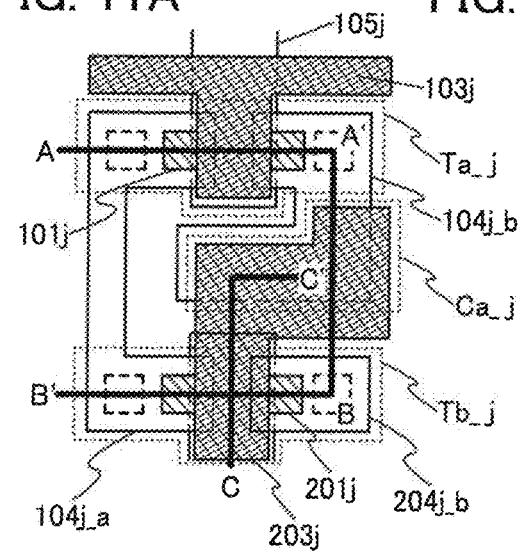
FIGS. 11A to 11C Drawings showing an example of a semiconductor device of one embodiment of the present invention.
Figure 11C:
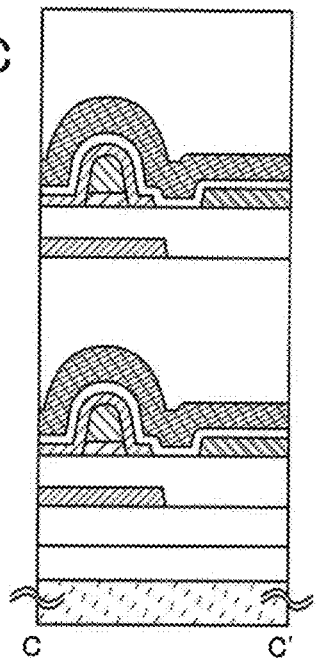
Figure 11B:
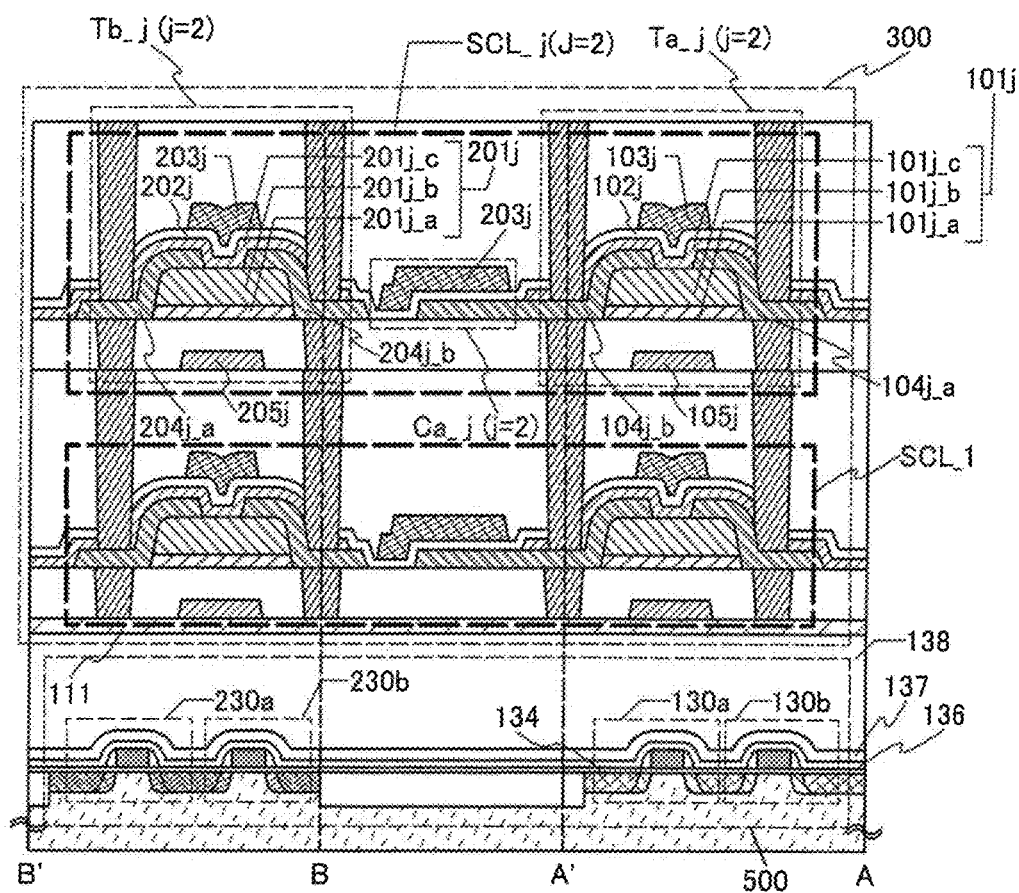

Furthermore, a stacked-layer structure shown in FIGS. 11A to 11C is an example of the stacked-layer structure of the semiconductor device which is different from that shown in FIG. 6 and FIG. 8. FIG. 11A shows a top view of a sub memory cell included in a memory cell array 300. Furthermore, FIG. 11B shows a cross section along A-A', a cross section along A'-B, and a cross section along B-B' shown in FIG. 11A. Furthermore, FIG. 11C shows a cross section along C-C' shown in FIG. 11A. The semiconductor device shown in FIG. 11B includes the memory cell array 300 and the peripheral circuit 500. Note that although FIG. 11 shows layers stacked up to j=2, layers of sub memory cells of j=3 or more may be stacked in reality; the number of stacked layers is preferably as large as possible because the integration degree of a memory can be increased accordingly. For a circuit diagram of the memory cell array 300 shown in FIG. 8, for example, FIG. 1B is referred to.

In the structure shown in FIG. 11B, one of the terminals of the capacitor Ca_j can serve as the gate electrode 203j; therefore, the process can be simplified.

[Stacked-Layer Structure Example 4]

Figure 12:
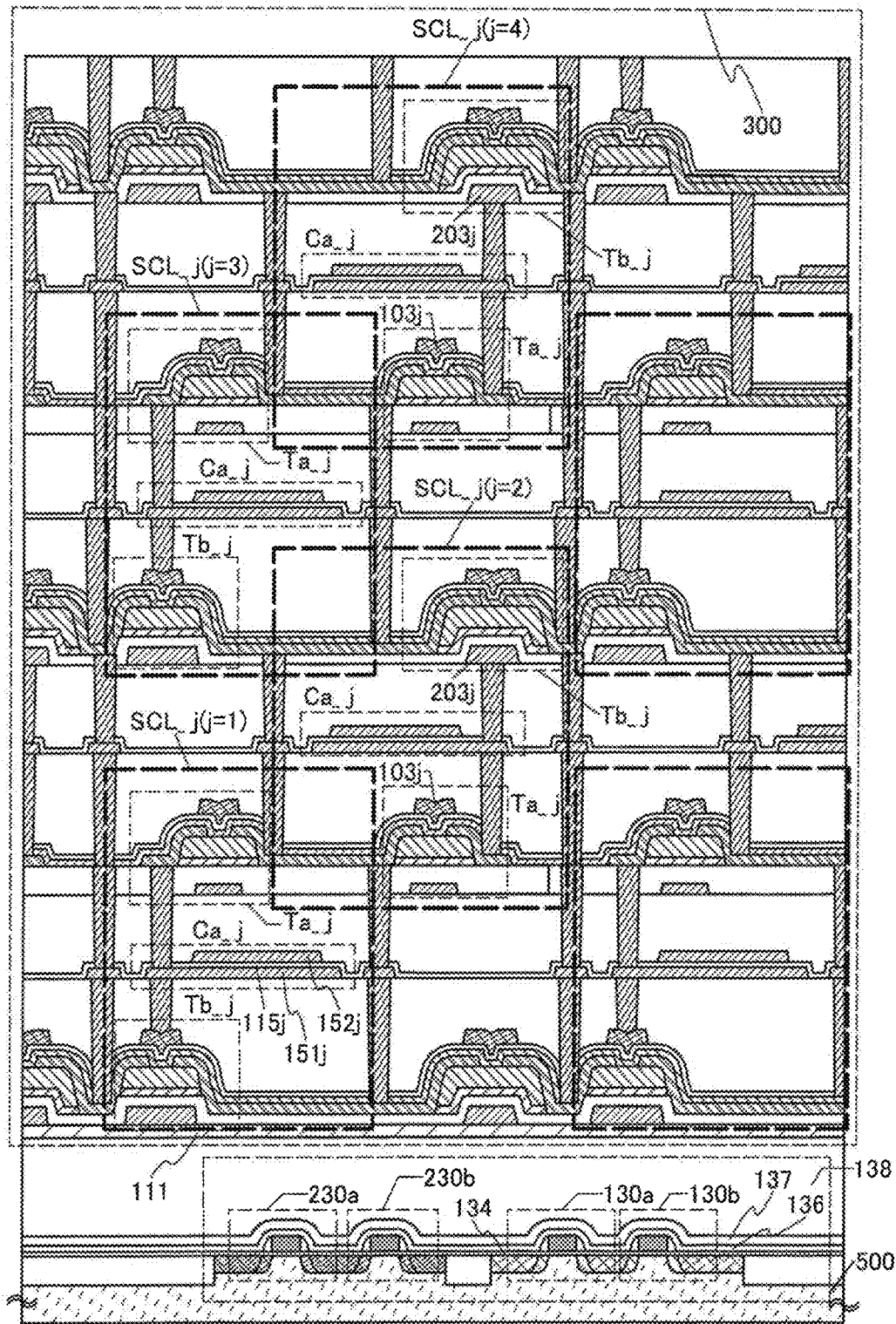
FIG. 12 A drawing showing an example of a semiconductor device of one embodiment of the present invention.

Furthermore, a stacked-layer structure shown in FIG. 12 is an example of the stacked-layer structure of the semiconductor device which is different from that shown in FIG. 6, FIG. 8, and FIGS. 11A to 11C. Furthermore, the stacked-layer structure shown in FIG. 12 is an example of the stacked-layer structure of the semiconductor device which is different from that shown in FIG. 6. The semiconductor device shown in FIG. 12 includes a memory cell array 300 and the peripheral circuit 500. Note that although FIG. 12 shows layers stacked up to j=4, layers of sub memory cells of j=5 or more may be stacked in reality; the number of stacked layers is preferably as large as possible because the integration degree of a memory can be increased accordingly. For a circuit diagram of the memory cell array 300 shown in FIG. 12, for example, FIG. 4 is referred to.

The memory cell array 300 shown in FIG. 12 is the same as that in FIG. 8 in that the sub memory cells are arranged in a staggered configuration. Of sub memory cells SCL1 to SCL4 shown in FIG. 12, SCL2 and SCL4 differ from those in the other structures in that the gate electrode 203$j$ located below the semiconductor layer 101$j$ of the transistor Tb_j, what is called a bottom gate, is electrically connected to the capacitor Ca_j. Furthermore, the stacking order of two transistors and a capacitor also differs from that in the other structures in that the capacitor Ca_j is located over the transistor Ta_j and that the transistor Tb_j is located over the capacitor Ca_j.

Meanwhile, in the SCL_1 and the SCL_3, the gate electrode 203$j$ positioned over the semiconductor layer 101$j$ of the transistor Tb_j is electrically connected to the capacitor Ca_j. Furthermore, regarding the stacking order of two transistors and a capacitor, the capacitor Ca_j is positioned over the transistor Tb_j and the transistor Ta_j is positioned over the capacitor Ca_j. That is, in the example shown in FIG. 12, the structure of the sub memory cell SCL_j varies depending on whether j is an odd number or an even number. Furthermore, in the example shown in FIG. 12, the transistor Ta_j and the transistor Tb_j are not necessarily formed in the same layer, which is preferable because the manufacture is simple in the case where the semiconductor layer 101$j$ included in the transistor Ta_j and the semiconductor layer 201$j$ included in the transistor Tb_j are formed using oxide semiconductor layers differing in the constituent elements or the atomic ratio, for example The above is the description of the structural example

[Manufacturing Method Example]

An example of a method for manufacturing the semiconductor device described in the above structure example is described below with reference to FIGS. 13A to 13E, FIGS. 14A to 14C, FIGS. 15A to 15C, and FIGS. 16A and 16B.

First, the semiconductor substrate 131 is prepared. As the semiconductor substrate 131, for example, a single crystal silicon substrate (including a p-type semiconductor substrate or an n-type semiconductor substrate), a compound semiconductor substrate containing silicon carbide or gallium nitride, or the like can be used. Furthermore, an SOI substrate may be used as the semiconductor substrate 131. The case where single crystal silicon is used for the semiconductor substrate 131 is described below.

Next, an element isolation layer (not illustrated) is formed in the semiconductor substrate 131. The element isolation layer may be formed by a LOCOS (Local Oxidation of Silicon) method, a STI (Shallow Trench Isolation) method, mesa isolation, or the like.

In the case where a p-type transistor and an n-type transistor are formed on the same substrate, an n-well or a p-well may be formed in part of the semiconductor substrate 131. For example, a p-well may be formed by adding an impurity element imparting p-type conductivity, such as boron, to an n-type semiconductor substrate 131, and an n-type transistor and a p-type transistor may be formed on the same substrate.

Next, an insulating film to be the gate insulating film 134 is formed over the semiconductor substrate 131. For example, a surface of the semiconductor substrate 131 is oxidized to form a silicon oxide film. Alternatively, a stacked-layer structure of a silicon oxide film and a silicon oxynitride film may be formed by forming silicon oxide by a thermal oxidation method and then nitriding a surface of a film of the silicon oxide by nitridation treatment. Alternatively, silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), rare-earth oxide such as lanthanum oxide, or the like may be used.

The insulating film may be formed by deposition using a sputtering method, a CVD (Chemical Vapor Deposition) method (including a thermal CVD method, an MOCVD (Metal Organic CVD) method, a PECVD (Plasma Enhanced CVD) method, or the like), an MBE (Molecular Beam Epitaxy) method, an ALD (Atomic Layer Deposition) method, a PLD (Pulsed Laser Deposition) method, or the like.

Next, a conductive film to be the gate electrode 135 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Alternatively, a stacked-layer structure including a film of metal nitride and a film of the above metal may be used. As metal nitride, tungsten nitride, molybdenum nitride, or titanium nitride can be used. When the metal nitride film is provided, adhesiveness of the metal film can be increased, and separation can be prevented.

The conductive film can be formed by a sputtering method, an evaporation method, a CVD method (including a thermal CVD method, an MOCVD method, a PECVD method, and the like), or the like. Furthermore, a thermal CVD method, an MOCVD method, or an ALD method is preferable in order to reduce plasma damage.

Next, a resist mask is formed over the conductive film by a lithography method or the like and unnecessary portions of the conductive film are removed. Then, the resist mask is removed; thus, the gate electrode 135 can be formed.

Here, a method for processing a film to be processed is described. In the case of finely processing a film to be processed, a variety of fine processing techniques can be used. For example, a method may be used in which a resist mask formed by a photolithography method or the like may be subjected to slimming treatment. Alternatively, a method may be used in which a dummy pattern is formed by a photolithography method or the like, the dummy pattern is provided with a sidewall and is then removed, and a film to be processed is etched using the remaining sidewall as a resist mask. In order to achieve a high aspect ratio, anisotropic dry etching is preferably used for etching of a film to be processed. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which these are mixed can be used. Alternatively, ultraviolet light, KrF laser light, ArF laser light, or the like can be used. Exposure may be performed by liquid immersion exposure technique. As the light for the exposure, extreme ultra-violet light (EUV: Extreme Ultra-violet) or X-rays may be used. Instead of the light for the exposure, an electron beam can be used. It is preferable to use extreme ultra-violet light, X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed by covering a step in a layer lower than that to planarize a surface by a spin coating method or the like, and thus can reduce variation in thickness of the resist mask provided in a layer upper than the organic resin film In the case where a particularly minute process is performed, a material functioning as an anti-reflection film against light for exposure is preferably used for the organic resin film. As an organic resin film with such a function, a BARC (Bottom Anti-Reflection Coating) film and the like can be given as examples. The organic resin film may be removed at the same time as the removal of the resist mask or after the resist mask is removed.

After the gate electrode 135 is formed, a sidewall covering the side surface of the gate electrode 135 may be formed. The sidewall can be formed in such a manner that an insulating film thicker than the gate electrode 135 is formed and subjected to anisotropic etching so that only a portion of the insulating film on the side surface of the gate electrode 135 remains.

FIGS. 13A to 13E illustrate an example in which etching of the gate insulating film is not performed at the time of formation of the sidewall; however, the insulating film to be the gate insulating film 134 may be etched at the same time as formation of the sidewall. In this case, the gate insulating film 134 is provided below the gate electrode 135 and the sidewall.

Next, an element imparting n-type conductivity, such as phosphorus, or an element imparting p-type conductivity, such as boron, is added to a region of the semiconductor substrate 131 where the gate electrode 135 (and the sidewall) is not provided. A schematic cross-sectional view at this stage corresponds to FIG. 13A.

Next, the insulating film 136 is formed, and then, first heat treatment is performed to activate the aforementioned element which imparts conductivity.

For the insulating film 136, a stacked layer or a single layer of, for example, silicon oxide, silicon oxynitride, silicon nitride oxide, silicon nitride, aluminum oxide, aluminum oxynitride, aluminum nitride oxide, aluminum nitride, or the like may be used. The insulating film 136 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage.

The first heat treatment can be performed at a temperature higher than or equal to 400° C. and lower than the strain point of the substrate in an inert gas atmosphere of a rare gas, a nitrogen gas, or the like or in a reduced-pressure atmosphere.

At this stage, the transistor 130a, the transistor 130b, the transistor 230a, and the transistor 230b are formed.

Figure 13A:
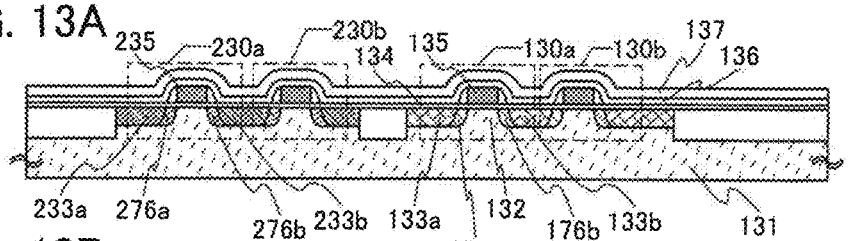
FIGS. 13A to 13E Drawings showing a method for manufacturing a semiconductor device of one embodiment of the present invention.
Figure 13B:
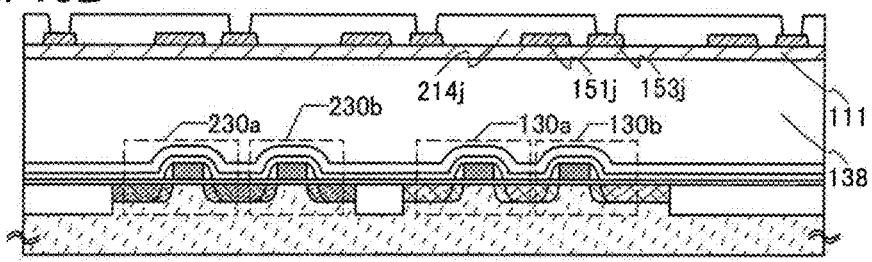
Figure 13C:
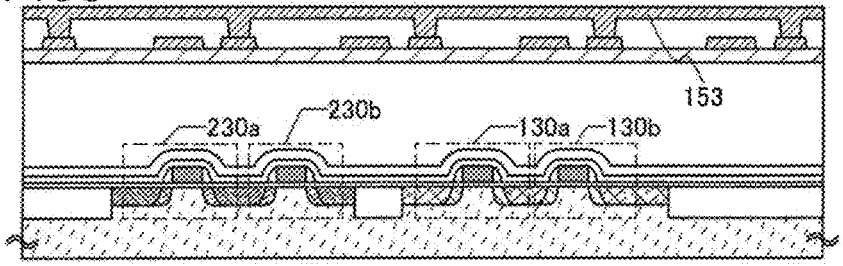

Next, the insulating film 137 is formed, so that a cross section shown in FIG. 13A is obtained. Next, the insulating film 138 is formed.

The insulating film 137 can be formed using the material that can be used for the insulating film 136, and is preferably formed using silicon nitride containing oxygen and hydrogen (SiNOH) because the amount of hydrogen released by heating can be increased. Alternatively, the insulating film 138 can be formed using the material that can be used for the insulating film 136, and is preferably formed using silicon oxide with high step coverage that is formed by reacting TEOS (Tetra-Ethyl-Ortho-Silicate), silane, or the like with oxygen, nitrous oxide, or the like.

The insulating film 137 and the insulating film 138 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. Furthermore, a thermal CVD method, an MOCVD method, or an ALD method is preferable in order to reduce plasma damage.

Next, the upper surface of the insulating film 138 is planarized by a CMP method or the like. As the insulating film 138, a planarization film may be used. At this time, a CMP method or the like is not necessarily used for planarization. The planarization film can be formed by, for example, an atmospheric pressure CVD method, a coating method, or the like. As a film which can be formed by an atmospheric pressure CVD method, BPSG (Boron Phosphorus Silicate Glass) and the like can be given as examples. Furthermore, as a film which can be formed by a coating method, HSQ (hydrogen silsesquioxane) and the like can be given as examples.

After that, second heat treatment is performed so that dangling bonds in the semiconductor layer 132 are terminated by hydrogen released from the insulating film 137. Furthermore, by the second heat treatment, water and hydrogen in the layers are released; thus, the water content and the hydrogen content can be reduced.

The second heat treatment can be performed under the conditions given as an example in the above description of the stacked-layer structure. For example, the conditions described for the first heat treatment or the like can be used.

Next, the barrier film 111 is formed. The barrier film 111 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage.

Next, a conductive film to be the conductive layer 105$j$, the conductive layer 153$j$, and the like is formed over the barrier film 111. The conductive film to be the conductive layer 105$j$, the conductive layer 153$j$, and the like can be formed by, for example, a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage.

Next, a resist mask is formed, and an unnecessary portion of the conductive film to be the conductive layer 105$j$, the conductive layer 153$j$, and the like is removed by etching. After that, the resist mask is removed, so that the conductive layer 105$j$, the conductive layer 153$j$, and the like are formed.

Then, the insulating film 214$j$ is formed. The insulating film 214$j$ can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage. Note that for the insulating film 214$j$, the description of the insulating film 114$j$ may be referred to.

To make the insulating film 214$j$ contain excess oxygen, the insulating film 214$j$ may be deposited in an oxygen atmosphere, for example Alternatively, a region containing excess oxygen may be formed by introducing oxygen into the insulating film 214$j$ that has been formed, or both of the methods may be combined.

For example, oxygen (at least including any of oxygen radicals, oxygen atoms, and oxygen ions) is introduced into the insulating film 214$j$ that has been formed, whereby a region containing excess oxygen is formed. As a method for introducing oxygen, an ion implantation method, an ion doping method, a plasma immersion ion implantation method, plasma treatment, or the like can be used.

A gas containing oxygen can be used for oxygen introduction treatment. As the gas containing oxygen, oxygen, dinitrogen monoxide, nitrogen dioxide, carbon dioxide, carbon monoxide, and the like can be used. Furthermore, a rare gas may be included in the gas containing oxygen for the oxygen introduction treatment. Furthermore, hydrogen or the like may be included. For example, a mixed gas of carbon dioxide, hydrogen, and argon may be used.

After the insulating film 214$j$ is formed, planarization treatment using a CMP method or the like may be performed in order to increase the planarity of the upper surface thereof.

Next, a plug for connection with the source electrode, the drain electrode, or the like of the transistor Tb_j may be formed over the conductive layer 153$j$ and the like. First, an opening portion is provided in the insulating film 214$j$ (see FIG. 13B). Next, a conductive film 153 to be the plug is formed to fill the opening portion (see FIG. 13C). For the formation of the conductive film 153, the conductive film to be the conductive layer 105$j$, or the like may be referred to, for example.

Figure 13D:
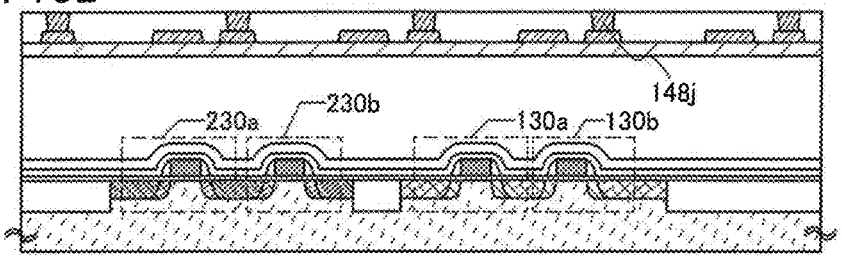
Figure 13E:
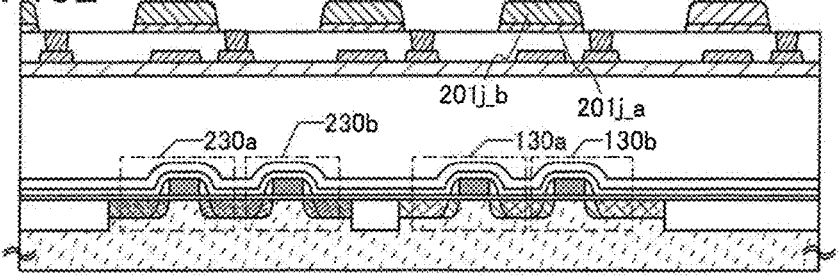

Next, planarization treatment is performed on the conductive film 153 so that the surface of the insulating film 214$j$ is exposed, whereby the plug 148$j$ and the like are formed (see FIG. 13D).

Next, the transistors such as the transistor Tb_j are formed over the insulating film 214$j$. Note that the method for manufacturing the transistor Tb_j can be referred to for a method for manufacturing the transistor Ta_j.

A semiconductor film to be the semiconductor layer 201$j$_a and the like and a semiconductor film to be the semiconductor layer 201$j$_b and the like are sequentially formed. The semiconductor films are preferably formed successively without contact with the air. A semiconductor to be the semiconductor layer 201*j*_a and a semiconductor to be the semiconductor layer 201*j*_b can be formed by a sputtering method, a CVD method, an MBE method, a PLD method, an ALD method, or the like.

Note that in the case where In-Ga-Zn oxide layers are formed as the semiconductor to be the semiconductor layer 201*j*_a and the like and the semiconductor to be the semiconductor layer 201*j*_b and the like by an MOCVD method, trimethylindium, trimethylgallium, dimethylzinc, and the like may be used as the source gases. Note that the source gases are not limited to the above-described combination, and triethylindium or the like may be used instead of trimethylindium. Furthermore, triethylgallium or the like may be used instead of trimethylgallium. Furthermore, diethylzinc or the like may be used instead of dimethylzinc.

After the oxide film and the semiconductor film are formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the heat treatment may be performed in an inert gas atmosphere and then performed in an atmosphere containing an oxidizing gas at 10 ppm or more in order to compensate released oxygen. The heat treatment may be performed directly after the formation of the semiconductor films or may be performed after the semiconductor films are processed into the island-shaped semiconductor layers 201*j*_a and 201*j*_b and the like. By the heat treatment, oxygen can be supplied to the semiconductor films from the insulating film 214*j* and the oxide film; thus, oxygen vacancies in the semiconductor films can be reduced.

Then, a resist mask is formed, and an unnecessary portion is removed by etching. Then, the resist mask is removed; thus a stacked-layer structure including the island-shaped semiconductor layers 201*j*_a and 201*j*_b and the like can be formed (see FIG. 13E). Note that part of the insulating film 214*j* might be etched in the etching of the semiconductor films to reduce the thickness of the insulating film 214*j* in a region which is not covered with the semiconductor layer 201*j*_a, the semiconductor layer 201*j*_b, and the like. For this reason, it is preferable that the insulating film 214*j* be formed thick in advance so as not to be removed by the etching.

After that, a conductive film 204*j* is formed. The conductive film 204*j* can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage.

Next, a resist mask is formed, and an unnecessary portion of the conductive film 204*j* is removed by etching. After that, the resist mask is removed; thus, the conductive layer 204*j*_a, the conductive layer 204*j*_b, and the like are formed (see FIG. 14A). Here, in some cases, part of the upper portions of the semiconductor layer 201*j*_b and the insulating film 114*j* and the like are etched in the etching of the conductive film and the thickness of a portion where the conductive layer 204*j*_a and the conductive layer 204*j*_b do not overlap therewith is reduced. For this reason, it is preferable that the semiconductor film and the like to be the semiconductor layer 201*j*_b be formed thick in advance in consideration of the etching depth.

Next, the gate insulating film 202*j* and the semiconductor layer 201*j*_c are formed. The gate insulating film 202*j* and the semiconductor layer 201*j*_c may be formed in such a manner that after films to be the gate insulating film 202*j* and the semiconductor layer 201*j*_c are formed, a resist mask is formed, and processing is performed by etching. Next, a conductive film to be the gate electrode 203*j* is formed. After that, a resist mask is formed, the conductive film is processed by etching, and the resist mask is then removed; thus, the gate electrode 203*j* is formed (see FIG. 14B). A semiconductor to be the semiconductor layer 101*j*_c can be formed by a sputtering method, a CVD method, an MBE method, a PLD method, an ALD method, or the like.

Note that in the case where an In-Ga-Zn oxide layer is formed as the semiconductor to be the semiconductor layer 101*j*_c by an MOCVD method, trimethylindium, trimethylgallium, dimethylzinc, and the like may be used as source gases. Note that the source gases are not limited to the above-described combination, and triethylindium or the like may be used instead of trimethylindium. Furthermore, triethylgallium or the like may be used instead of trimethylgallium. Furthermore, diethylzinc or the like may be used instead of dimethylzinc.

At this stage, the transistors such as the transistor Tb_j are formed.

Then, the insulating film 212*j* is formed. The insulating film 212*j* can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be improved. Furthermore, a thermal CVD method, an MOCVD method, or an ALD method is preferable in order to reduce plasma damage.

After the insulating film 212*j* is formed, fifth heat treatment is preferably performed. By the heat treatment, oxygen can be supplied from the insulating film 214*j* and the like to the semiconductor layer 201*j* to reduce oxygen vacancies in the semiconductor layer 201*j*. Furthermore, at this time, oxygen released from the insulating film 214*j* is blocked by the barrier film 111 and the insulating film 212*j* and does not diffuse to a layer lower than the barrier film 111 and a layer upper than the insulating film 212*j*; therefore, the oxygen can be effectively confined. Thus, the amount of oxygen to be supplied to the semiconductor layer 201*j* can be increased, so that oxygen vacancies in the semiconductor layer 201*j* can be effectively reduced.

Furthermore, the insulating film 212*j* may have a stacked-layer structure of two or more layers. In this case, for example, the insulating film 212*j* may have a stacked-layer structure of two layers in which, for example, silicon oxide, silicon oxynitride, silicon nitride oxide, silicon nitride, aluminum oxide, aluminum oxynitride, aluminum nitride oxide, aluminum nitride, or the like is used for the lower layer. Furthermore, a material to which water and hydrogen do not easily diffuse is preferably used for the upper layer, as in the case of the barrier film 111. Furthermore, an insulating film provided in the lower layer may be an insulating film from which oxygen is released by heating as in the case of the insulating film 214*j*, so that oxygen may be supplied also from above the semiconductor layer 101*j* through the gate insulating film 102*j*.

Figure 14A:
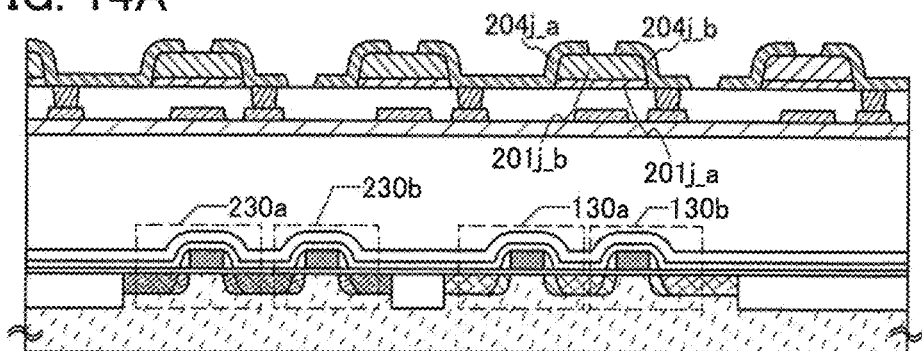
FIGS. 14A to 14C Drawings showing the method for manufacturing a semiconductor device of one embodiment of the present invention.
Figure 14B:
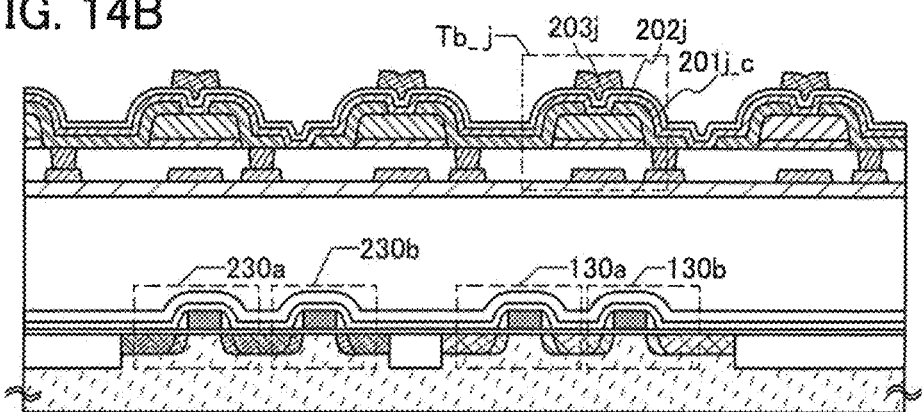
Figure 14C:
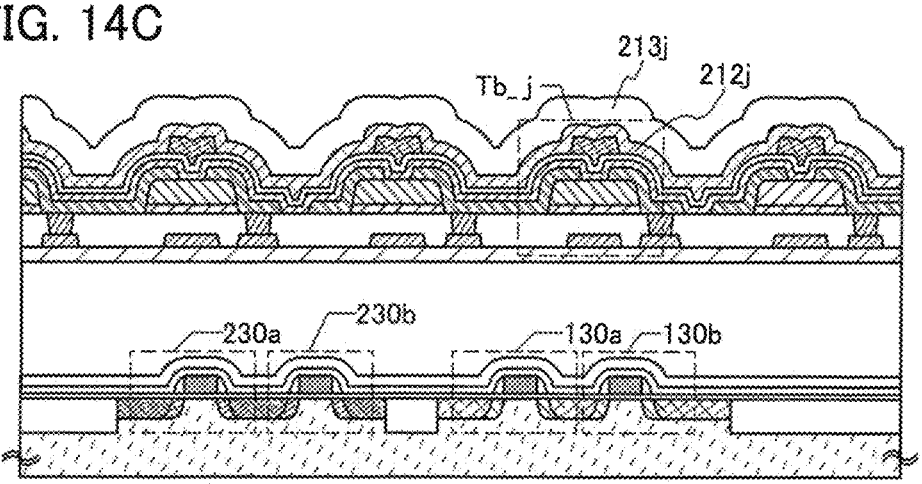

Next, the insulating film 213*j* is formed (see FIG. 14C). The insulating film 213*j* can be formed of a stacked layer or a single layer of, for example, silicon oxide, silicon oxynitride, silicon nitride oxide, silicon nitride, aluminum oxide, aluminum oxynitride, aluminum nitride oxide, aluminum nitride, or the like. The insulating film 113j can be formed by a sputtering method, a CVD method (including a thermal CVD method, an MOCVD method, a PECVD method, and the like), an MBE method, an ALD method, a PLD method, or the like, for example In particular, it is preferable to form the film by a CVD method, further preferably a plasma CVD method because coverage can be favorable. Furthermore, a thermal CVD method, an MOCVD method, or an ALD method is preferable in order to reduce plasma damage.

Note that the insulating films 112j, 113j, the insulating film 212j, and the insulating film 213j are not shown in FIG. 6, FIGS. 7A to 7E, FIG. 8, FIG. 9, FIGS. 11A to 11C, FIG. 12, and FIGS. 18A to 18E in order to avoid complexity.

Next, the insulating film 216j is formed. The insulating film 216j can be formed of a stacked layer or a single layer of, for example, silicon oxide, silicon oxynitride, silicon nitride oxide, silicon nitride, aluminum oxide, aluminum oxynitride, aluminum nitride oxide, aluminum nitride, or the like. The insulating film 216j can be formed by a sputtering method, a CVD method (including a thermal CVD method, an MOCVD method, a PECVD method, and the like), an MBE method, an ALD method, a PLD method, or the like, for example In the case where an organic insulating material such as an organic resin is used for the insulating film 216j, a coating method such as a spin coating method may be used for the formation. Furthermore, after the insulating film 216j is formed, planarization treatment is preferably performed on the upper surface thereof. Furthermore, the material and formation method for the insulating film 138 may be used for the insulating film 216j.

Figure 15A:
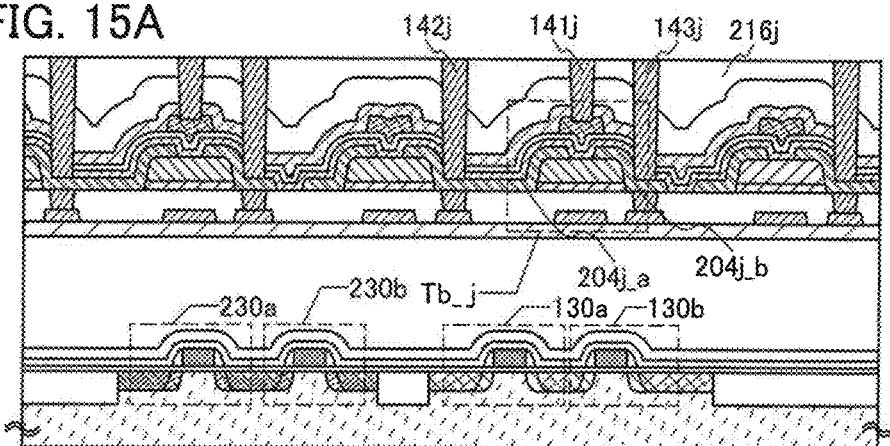
FIGS. 15A to 15C Drawings showing the method for manufacturing a semiconductor device of one embodiment of the present invention.
Figure 15B:
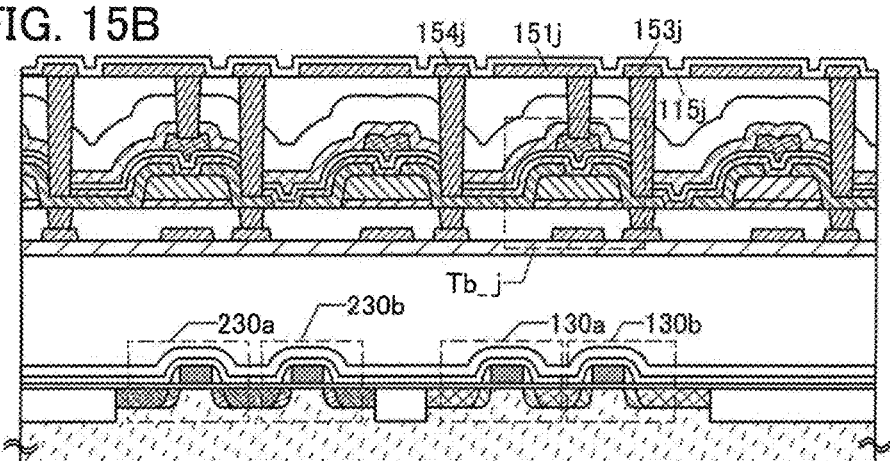
Figure 15C:
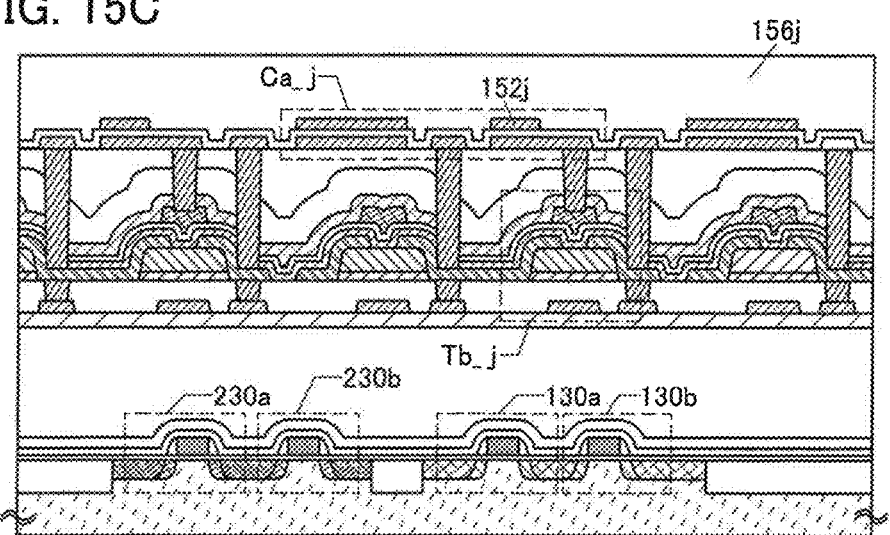

Next, opening portions that reach the conductive layer 204j_a, the conductive layer 204j_b, and the like are provided in the insulating film 216j, the insulating film 213j, the insulating film 212j, the gate insulating film 202j, and the semiconductor layer 201j_c, a conductive film to be the plug 141j, the plug 142j, the plug 143j, and the like is formed so as to fill the opening portions, and planarization treatment is performed so that the surface of the insulating film 216j is exposed, whereby the plug 141j, the plug 142j, the plug 143j, and the like are formed (see FIG. 15A).

Next, a conductive film to be the conductive layers 151j, 153j, 154j, and the like is formed over the insulating film 216j, the plug 141j, and the like, a mask is formed, and etching is performed to form the conductive layers 151j, 153j, 154j, and the like. Then, the insulating film 115j is formed (see FIG. 15B). The insulating film 115j can function as an insulating film of the capacitor Ca_j. For a material and the like that can be used for the insulating film 115j, the description of the gate insulating film 202j can be referred to, for example Next, the conductive layer 152j and the like are formed over the insulating film 115j, in a manner similar to that of the conductive layer 151j (see FIG. 15C). For a material and the like that can be used for the conductive layers 151j, 153j, 154j, the conductive layer 152j, and the like, the description of the conductive layer 205j can be referred to, for example In this way, the capacitor Ca_j can be formed.

Next, the insulating film 156j is formed over the conductive layer 152j and the insulating film 115j. The upper surface of the insulating film 156j may be planarized. Description of the insulating film 216j is referred to for the insulating film 156j.

Next, the transistor Ta_j is formed over the insulating film 156j. First, the conductive layer 105j and the like are formed over the insulating film 156j. The conductive layer 105j and the like can be formed in a manner similar to that of the conductive layer 205j. Next, the insulating film 114j is formed (see FIG. 16A). The insulating film 114j can be formed in a manner similar to that of the insulating film 214j.

Next, opening portions are provided in the insulating film 156j and the insulating film 114j, a conductive film is formed so as to fill the opening portions, and a surface of the conductive film is planarized so that the insulating film 114j is exposed, whereby the plug 144j, the plug 145j, and the like are formed.

Figure 16A:
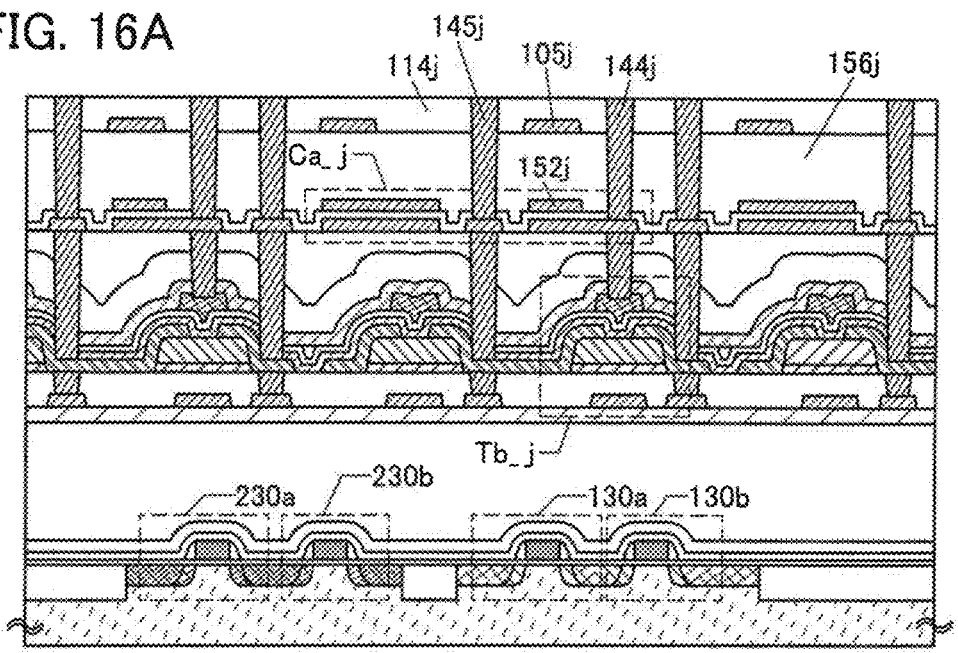
FIGS. 16A and 16B Drawings showing the method for manufacturing a semiconductor device of one embodiment of the present invention.
Figure 16B:
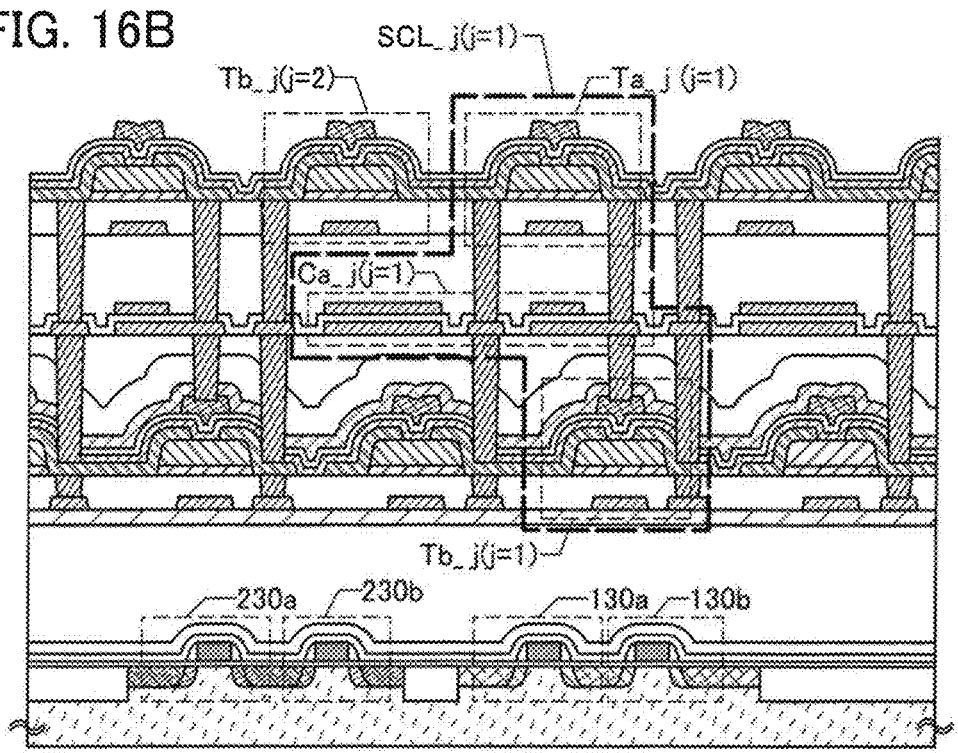

Next, the transistor Ta_j and the like are formed (see FIG. 16B). For the formation of the transistor Ta_j, the description of the transistor Tb_j can be referred to. Here, as shown in FIG. 16B, the transistor Ta_j(j=1) included in the sub memory cell SCL_1 and the transistor Tb_j(j=2) included in the sub memory cell SCL_2 can be formed at the same time.

Next, the capacitor Ca_j, the transistor Ta_j, and the like are formed repeatedly in a similar manner; thus, a semiconductor element shown in FIG. 8 can be formed.

The structure described in this embodiment can be used in appropriate combination with the structure described in the other embodiment.

(Embodiment 2)

In this embodiment, an oxide semiconductor which can be favorably used for the transistor Ta_j and the transistor Tb_j described in Embodiment 1 is described. Note that for the transistor Tb_j, the description of the transistor Ta_j is referred to. Furthermore, for the semiconductor layer 201j_a, the semiconductor layer 201j_b, and the semiconductor layer 201j_c, the description of the semiconductor layer 101j_a, the semiconductor layer 101j_b, and the semiconductor layer 101j_c can be referred to, respectively. Note that it is not necessary to use the same material for the semiconductor layer 101j_a and the semiconductor layer 201j_a. That is, in the case where an In-M-Zn oxide is used for the semiconductor layer 101j_a and the semiconductor layer 201j_a, for example, it is not necessary to use materials having the same atomic ratio of indium to the element M and zinc. Furthermore, for example, it is not necessary to use materials having the same energy gap for the semiconductor layer 101j_a and the semiconductor layer 201j_a. Furthermore, the same applies to the semiconductor layer 101j_b and the semiconductor layer 201j_b, or the semiconductor layer 101j_c and the semiconductor layer 201j_c.

Here, an example in which three layers, i.e., the semiconductor layer 101j_a, the semiconductor layer 101j_b, and the semiconductor layer 101j_c are stacked and used as the oxide semiconductor as illustrated in FIG. 6 and the like is described; however, the oxide semiconductor that can be used to the transistor Ta_j may be a single layer. Alternatively, a structure in which one or two of the semiconductor layer 101j_a, the semiconductor layer 101j_b, and the semiconductor layer 101j_c are not provided may be employed.

The semiconductor layer 101j_b is, for example, an oxide semiconductor containing indium. The semiconductor layer 101j_b has high carrier mobility (electron mobility) by containing indium, for example. Furthermore, the semiconductor layer 101j_b preferably contains the element M. The element M is preferably aluminum, gallium, yttrium, tin, or the like. Other elements which can be used as the elementM are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The elementM is an element having a high bonding energy with oxygen, for example.

The element M is an element whose bonding energy with oxygen is higher than that of indium, for example. Alternatively, the elementM is an element having a function of widening the energy gap of the oxide semiconductor, for example. Furthermore, the semiconductor layer 101j_b preferably contains zinc. An oxide semiconductor may be crystallized easily when containing zinc.

Note that the semiconductor layer 101j_b is not limited to the oxide semiconductor containing indium. The semiconductor layer 101j_b may be, for example, an oxide semiconductor which does not contain indium and contains zinc, such as a zinc tin oxide or a gallium tin oxide, an oxide semiconductor containing gallium, or an oxide semiconductor containing tin.

For the semiconductor layer 101j_b, an oxide with a wide energy gap is used. The energy gap of the semiconductor layer 101j_b is, for example, 2.5 eV or larger and 4.2 eV or smaller, preferably 2.8 eV or larger and 3.8 eV or smaller, more preferably 3 eV or larger and 3.5 eV or smaller.

For example, the semiconductor layer 101j_a and the semiconductor layer 101j_c are each an oxide semiconductor which includes one or more kinds of elements other than oxygen that are included in the semiconductor layer 101j_b. Since the semiconductor layer 101j_a and the semiconductor layer 101j_c each include one or more kinds of elements or two or more kinds of elements other than oxygen included in the semiconductor layer 101j_b, an interface state is less likely to be formed at the interface between the semiconductor layer 101j_a and the semiconductor layer 101j_b and the interface between the semiconductor layer 101j_b and the semiconductor layer 101j_c.

The semiconductor layer 101j_a, the semiconductor layer 101j_b, and the semiconductor layer 101j_c preferably contain at least indium. Note that in the case where the semiconductor layer 101j_a is an In-M-Zn oxide, when a summation of In and M is assumed to be 100 atomic %, it is preferable that In be less than 50 atomic % and M be greater than 50 atomic %; it is more preferable that In be less than 25 atomic % and M be greater than 75 atomic %, respectively. Furthermore, in the case where the semiconductor layer 101j_b is an In-M-Zn oxide, when a summation of In and M is assumed to be 100 atomic %, it is preferable that In be greater than 25 atomic % and M be less than 75 atomic %; it is more preferable that In be greater than 34 atomic % and M be less than 66 atomic %. Furthermore, in the case where the semiconductor layer 101j_c is an In-M-Zn oxide, when a summation of In and M is assumed to be 100 atomic %, it is preferable that In be less than 50 atomic % and M be greater than 50 atomic %; it is more preferable that In be less than 25 atomic % and M be greater than 75 atomic %. Note that an oxide that is a type the same as that of the semiconductor layer 101j_a may be used for the semiconductor layer 101j_c.

As the semiconductor layer 101j_b, an oxide which has higher electron affinity than the semiconductor layer 101j_a and the semiconductor layer 101j_c is used. For example, as the semiconductor layer 101j_b, an oxide having an electron affinity higher than those of the semiconductor layers 101j_a and 101j_c by 0.07 eV or higher and 1.3 eV or lower, preferably 0.1 eV or higher and 0.7 eV or lower, or more preferably 0.15 eV or higher and 0.4 eV or lower is used. Note that the electron affinity refers to an energy gap between the vacuum level and the bottom of the conduction band.

Note that an indium gallium oxide has a small electron affinity and a high oxygen-blocking property. Therefore, the semiconductor layer 101j_c preferably contains indium gallium oxide. The gallium atomic ratio [In/(In+Ga)] is, for example, higher than or equal to 70%, preferably higher than or equal to 80%, further preferably higher than or equal to 90%.

The semiconductor layer 101j_c preferably contains gallium oxide. When the gallium oxide is contained in the semiconductor layer 101j_c, lower off-state current can be obtained in some cases.

When an electric field is applied to the gate electrode of the transistor, a channel is formed in the semiconductor layer 101j_b having the highest electron affinity among the semiconductor layer 101j_a, the semiconductor layer 101j_b, and the semiconductor layer 101j_c.

Figure 25A:
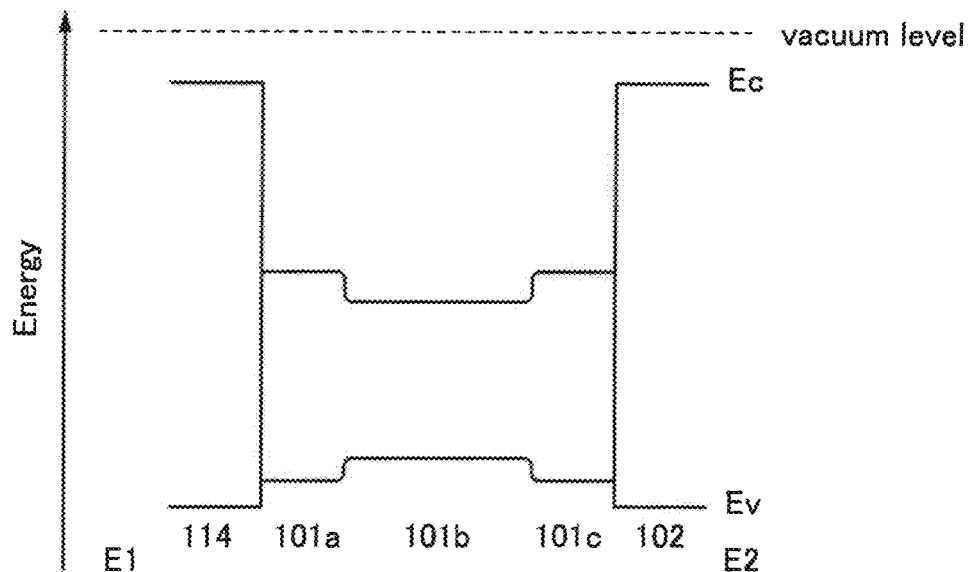

Here, a band structure is shown in FIG. 25A. A vacuum level (denoted by vacuum level), and an energy of the bottom of the conduction band (denoted by Ec) and an energy of the top of the valence band (denoted by Ev) of each of the layers are shown in FIG. 25A.

Here, a mixed region of the semiconductor layer 101j_a and the semiconductor layer 101j_b might exist between the semiconductor layer 101j_a and the semiconductor layer 101j_b. Furthermore, a mixed region of the semiconductor layer 101j_b and the semiconductor layer 101j_c might exist between the semiconductor layer 101j_b and the semiconductor layer 101j_c. The mixed region has a low density of interface states. For that reason, the stack including the semiconductor layer 101j_a, the semiconductor layer 101j_b, and the semiconductor layer 101j_c has a band structure where energy at each interface and in the vicinity of the interface is changed continuously (also referred to as continuous junction).

Note that FIG. 25A illustrates the case where the Ec of the semiconductor layer 101j_a and the second semiconductor layer 101j_c are equal to each other; however, they may be different from each other. For example, Ec of the semiconductor layer 101j_a may be higher than that of the semiconductor layer 101j_c.

Figure 25B:
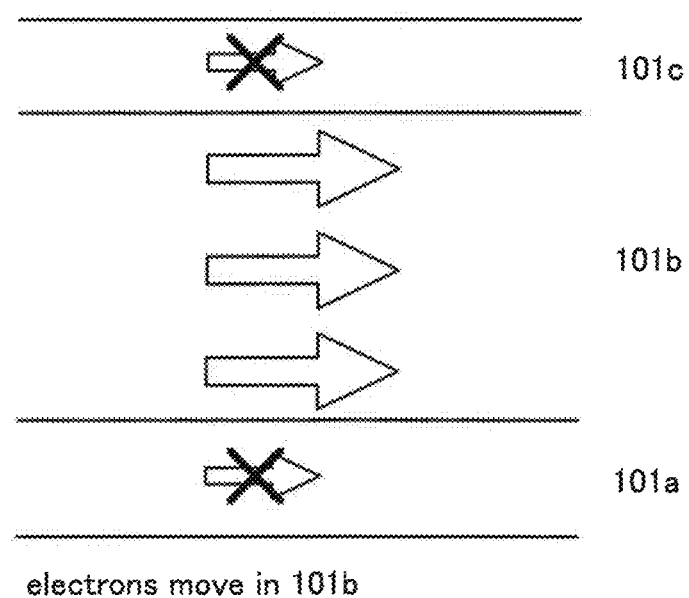

At this time, electrons mainly move not in the semiconductor layer 101j_a and the semiconductor layer 101j_c but in the semiconductor layer 101j_b (see FIG. 25B). As described above, when the interface state density at the interface between the semiconductor layer 101j_a and the semiconductor layer 101j_b and the interface state density at the interface between the semiconductor layer 101j_b and the semiconductor layer 101j_c are lowered, the on-state current of the transistor can be increased without interruption of the movement of electrons in the semiconductor layer 101j_b.

Note that in the case where the transistor has an s-channel structure, the channel is formed in the entire region of the semiconductor layer 101j_b. Therefore, as the thickness of the semiconductor layer 101j_b is increased, the size of the channel region is increased. That is, the thicker the semiconductor layer 101j_b is, the larger the on-state current of the transistor is. For example, the semiconductor layer 101j_b may have a region with a thickness of greater than or equal to 20 nm, preferably greater than or equal to 40 nm, further preferably greater than or equal to 60 nm, and still further preferably greater than or equal to 100 nm. Note that there is a possibility that the production efficiency of the semiconductor device is decreased; therefore, for example, the semiconductor layer 101j_b includes a region with a thickness of, for example, less than or equal to 300 nm, preferably less than or equal to 200 nm, further preferably less than or equal to 150 nm.

Moreover, the thickness of the semiconductor layer 101j_c is preferably as small as possible to increase the on-state current of the transistor. For example, the semiconductor layer 101j_c may include a region with a thickness of less than 10 nm, preferably less than or equal to 5 nm, further preferably less than or equal to 3 nm. Meanwhile, the semiconductor layer 101j_c has a function of blocking entry of elements other than oxygen (such as hydrogen and silicon) included in the adjacent insulator into the semiconductor layer 101j_b where a channel is formed. Thus, the semiconductor layer 101j_c preferably has a certain thickness. For example, the semiconductor layer 101j_c may include a region with a thickness of greater than or equal to 0.3 nm, preferably greater than or equal to 1 nm, and more preferably greater than or equal to 2 nm. The semiconductor layer 101j_c preferably has an oxygen blocking property to inhibit outward diffusion of oxygen released from the gate insulating film 102j and the like.

To improve reliability, preferably, the thickness of the semiconductor layer 101j_a is large and the thickness of the semiconductor layer 101j_c is small. For example, the semiconductor layer 101j_a may include a region with a thickness of greater than or equal to 10 nm, preferably greater than or equal to 20 nm, further preferably greater than or equal to 40 nm, and still further preferably greater than or equal to 60 nm. When the thickness of the semiconductor layer 101j_a is made large, a distance from an interface between the adjacent insulator and the semiconductor layer 101j_a to the semiconductor layer 101j_b where a channel is formed can be large. Since the production efficiency of the semiconductor device might be decreased, the semiconductor layer 101j_a has a region with a thickness of, for example, less than or equal to 200 nm, preferably less than or equal to 120 nm, further preferably less than or equal to 80 nm.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that treatment be performed so that oxygen be added to the oxide semiconductor to fill oxygen vacancies increased by the dehydration treatment (dehydrogenation treatment) performed on the oxide semiconductor film. In this specification and the like, supplying oxygen to an oxide semiconductor film may be expressed as oxygen adding treatment, or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be an i-type (intrinsic) oxide semiconductor film or a substantially i-type (intrinsic) oxide semiconductor film which is extremely close to an i-type. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$A, further preferably less than or equal to $1\times10^{-21}$ A at 85° C. Note that an off state of a transistor refers to, in the case of an n-channel type transistor, a state where the gate voltage is sufficiently lower than the threshold voltage. Specifically, the transistor is in an off state when the gate voltage is lower than the threshold voltage by 1 V or more, 2 V or more, or 3 V or more.

<Structure of Oxide Semiconductor>

The structure of an oxide semiconductor is described below.

An oxide semiconductor is classified into a single crystal oxide semiconductor and a non-single-crystal oxide semiconductor other than that. Non-single-crystal oxide semiconductors include CAAC-OS (C Axis Aligned Crystalline Oxide Semiconductor), a polycrystalline oxide semiconductor, an nc-OS (nanocrystalline oxide semiconductor), an amorphous-like oxide semiconductor (a-like OS: amorphous like oxide semiconductor), an amorphous oxide semiconductor, and the like.

From another perspective, an oxide semiconductor is classified into an amorphous oxide semiconductor and a crystalline oxide semiconductor other than that. Crystalline oxide semiconductors include a single crystal oxide semiconductor, a CAAC-OS, a polycrystalline oxide semiconductor, an nc-OS, and the like.

It is known that an amorphous structure is generally defined as being metastable and unfixed, and being isotropic and having no non-uniform structure, for example. In other words, it can be called a structure that has a flexible bond angle and a short-range order but does not have a long-range order.

From the opposite viewpoint, an inherently stable oxide semiconductor cannot be referred to as a completely amorphous (completely amorphous) oxide semiconductor. Moreover, an oxide semiconductor that is not isotropic (having a periodic structure in a microscopic region, for example) cannot be referred to as a completely amorphous oxide semiconductor. Note that an a-like OS has a periodic structure in a microscopic region, but at the same time has a void (also referred to as a void) and has an unstable structure. For this reason, it can be said that it is close to an amorphous oxide semiconductor in terms of a physical property.

<CAAC-OS>

First, a CAAC-OS is described.

A CAAC-OS is one of oxide semiconductors having a plurality of c-axis aligned crystal parts (also referred to as pellets).

When a combined analysis image (also referred to as a high-resolution TEM image) of a bright-field image and a diffraction pattern of a CAAC-OS is observed with a transmission electron microscope (TEM: Transmission Electron Microscope), a plurality of pellets can be observed. However, in the high-resolution TEM image, a boundary between pellets, that is, a grain boundary (also referred to as a grain boundary) cannot be clearly observed. Thus, in the CAAC-OS, a reduction in electron mobility due to the grain boundary is less likely to occur.

Figure 20A:
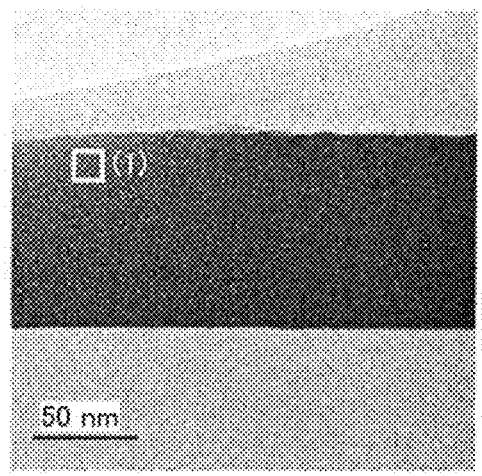
FIGS. 20A to 20D Cs-corrected high-resolution TEM images of a cross section of a CAAC-OS and a cross-sectional schematic view of the CAAC-OS.

The CAAC-OS observed with a TEM is described below. FIG. 20A shows a high-resolution TEM image of a cross section of the CAAC-OS which is observed from a direction substantially parallel to the sample surface. A spherical aberration corrector (Spherical Aberration Corrector) function was used for the observation of the high-resolution TEM image. The high-resolution TEM image using a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 20B:
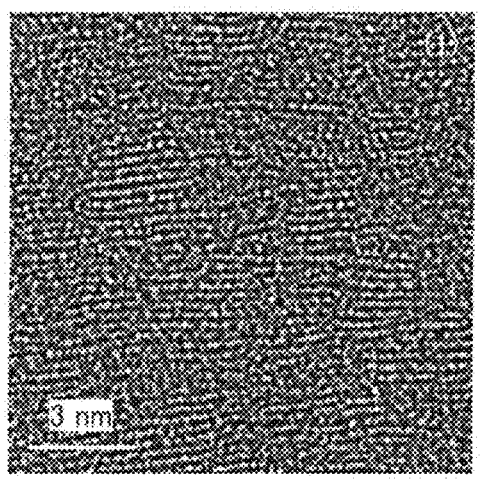

FIG. 20B is an enlarged Cs-corrected high-resolution TEM image of a region (1) in FIG. 20A. It can be confirmed from FIG. 20B that metal atoms are arranged in a layered manner in a pellet. Each metal atom layer reflects unevenness of a surface over which a film of the CAAC-OS is formed (hereinafter, the surface is referred to as a formation surface) or a top surface thereof, and is arranged parallel to the formation surface or the top surface of the CAAC-OS.

Figure 20C:
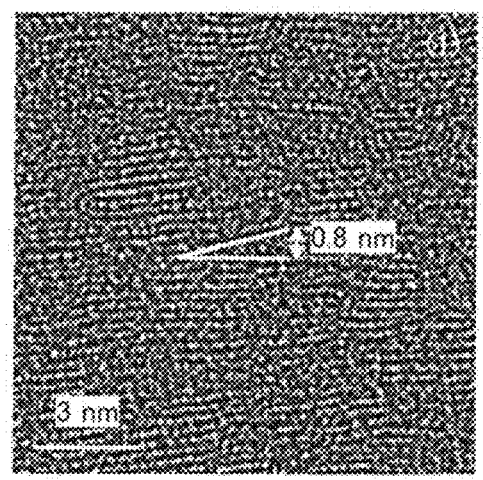

As shown in FIG. 20B, the CAAC-OS has a characteristic atomic arrangement. The characteristic atomic arrangement is denoted by an auxiliary line in FIG. 20C. FIG. 20B and FIG. 20C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc: nanocrystal). Furthermore, a CAAC-OS can be referred to as an oxide semiconductor including CANC (C-Axis Aligned Nanocrystals).

Figure 20D:
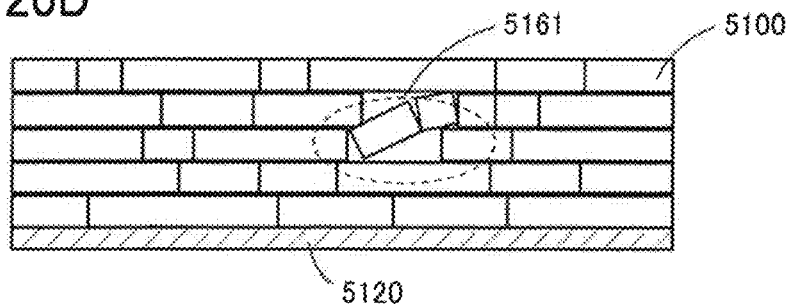

Here, according to the Cs-corrected high-resolution TEM images, the schematic arrangement of pellets 5100 of a CAAC-OS over a substrate 5120 is schematically illustrated by such a structure in which bricks or blocks are stacked (see FIG. 20D). The part in which the pellets are tilted as observed in FIG. 20C corresponds to a region 5161 shown in FIG. 20D.

Figure 21A:
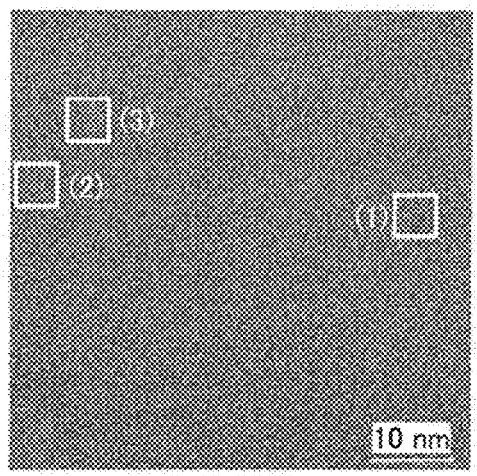
FIGS. 21A to 21D Cs-corrected high-resolution TEM images of a plane of a CAAC-OS.
Figure 21B:
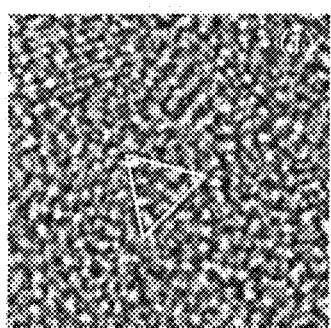
Figure 21C:
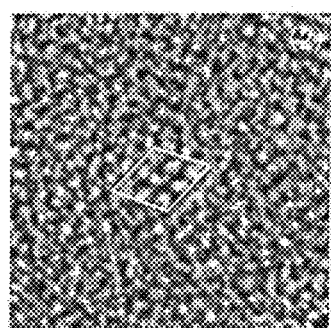
Figure 21D:
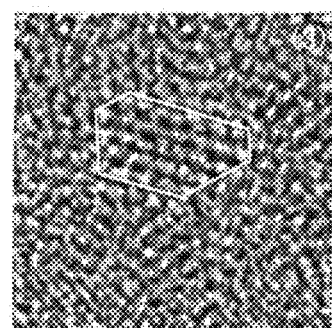

FIG. 21A shows a Cs-corrected high-resolution TEM image of a plane of the CAAC-OS observed from a direction substantially perpendicular to the sample surface. FIG. 21B, FIG. 21C, and FIG. 21D are enlarged Cs-corrected high-resolution TEM images of a region (1), a region (2), and a region (3) in FIG. 21A, respectively. It can be confirmed from FIG. 21B, FIG. 21C, and FIG. 21D that metal atoms are arranged in a triangular, quadrangular, or hexagonal configuration in a pellet. However, there is no regularity of arrangement of metal atoms between different pellets.

Figure 22A:
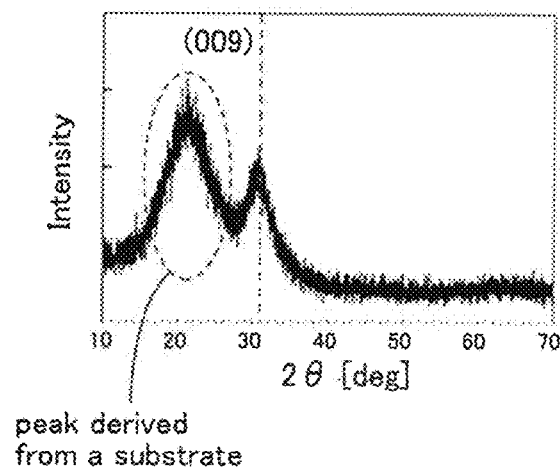
FIGS. 22A to 22C Drawings illustrating structural analysis of a CAAC-OS and a single crystal oxide semiconductor by XRD.

Next, a CAAC-OS analyzed by X-ray diffraction (XRD: X-Ray Diffraction) is described. For example, when the structure of a CAAC-OS including an InGaZnO$_4$ crystal is analyzed by an out-of-plane method, a peak appears at a diffraction angle (2θ) of around 31° as shown in FIG. 22A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 22B:
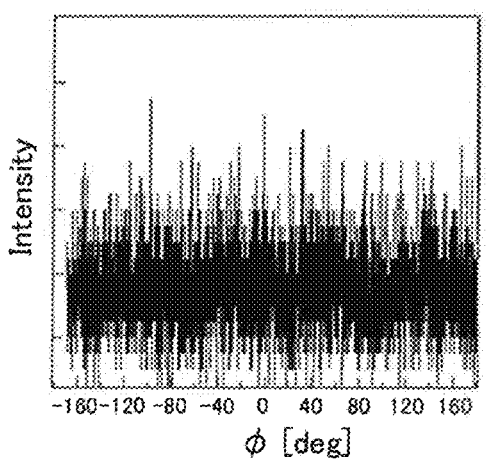
Figure 22C:
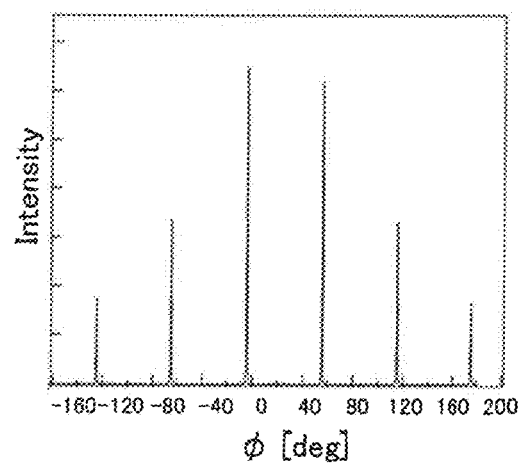

On the other hand, in structural analysis by an in-plane method in which an X-ray is incident on the CAAC-OS in a direction substantially perpendicular to its c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 22B, a clear peak is not observed. In contrast, in the case of a single crystal oxide semiconductor of InGaZnO$_4$, when φ scan is performed with 2θ fixed at around 56°, as shown in FIG. 22C, six peaks which are derived from crystal planes equivalent to the (110) plane are observed. Accordingly, the structural analysis using XRD shows that the directions of a-axes and b-axes are irregularly oriented in the CAAC-OS.

Figure 23A:
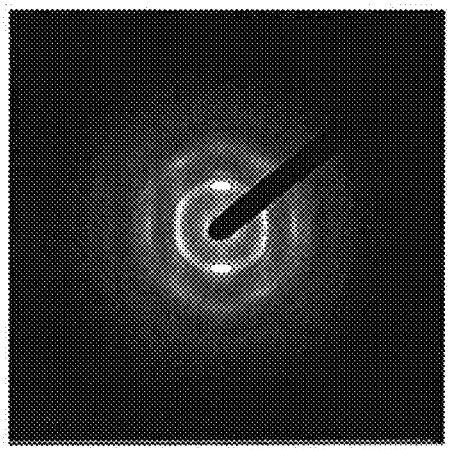
FIGS. 23A and 23B Drawings showing electron diffraction patterns of a CAAC-OS.
Figure 23B:
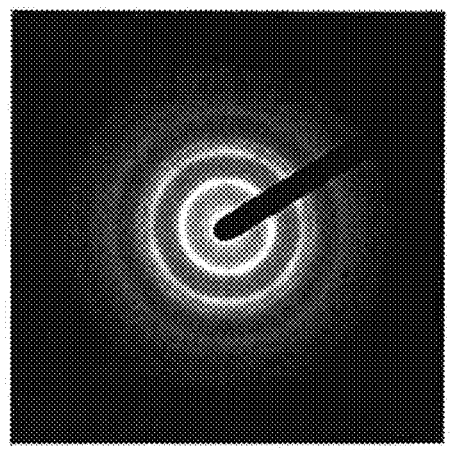

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) as shown in FIG. 23A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23B shows a diffraction pattern obtained in such a manner that an electron beam with a probe diameter of 300 nm is incident on the same sample in a direction perpendicular to the sample surface. As shown in FIG. 23B, a ring-like diffraction pattern is observed. Thus, the electron diffraction also indicates that the a-axes and b-axes of the pellets included in the CAAC-OS do not have regular alignment. Note that the first ring in FIG. 23B is considered to be derived from the (010) plane, the (100) plane, and the like of the InGaZnO$_4$ crystal. Furthermore, the second ring in FIG. 23B is considered to be derived from the (110) plane and the like.

As described above, the CAAC-OS is an oxide semiconductor with high crystallinity. Entry of impurities, formation of defects, or the like might decrease the crystallinity of an oxide semiconductor. From the opposite viewpoint, the CAAC-OS has small amounts of impurities and defects (e.g., oxygen vacancies).

Note that the impurity is an element other than the main components of the oxide semiconductor, such as hydrogen, carbon, silicon, or a transition metal element. For example, an element, such as silicon, that has higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8\times10^{11}/cm^3$, preferably lower than $1\times10^{11}/cm^3$, more preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a clear crystal part is not observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part with a size greater than 10 nm and less than or equal to 100 nm is referred to as a microcrystalline oxide semiconductor in some cases. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is subjected to analysis by an out-of-plane method using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Moreover, a plurality of spots are shown in a ring-like region in some cases.

Since there is no regularity of crystal orientation between the pellets (nanocrystals) as mentioned above, the nc-OS can also be referred to as an oxide semiconductor including RANC (Random Aligned nanocrystals) or an oxide semiconductor including NANC (Non-Aligned nanocrystals).

The nc-OS is an oxide semiconductor that has high regularity as compared with an amorphous oxide semiconductor. Therefore, the nc-OS is likely to have a lower density of defect states than an a-like OS or an amorphous oxide semiconductor. Note that there is no regularity of crystal orientation between different pellets in the nc-OS. Therefore, the nc-OS has a higher density of defect states than the CAAC-OS.

<a-like OS>

An a-like OS is an oxide semiconductor having a structure intermediate between the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as sample A), an nc-OS (referred to as sample B), and a CAAC-OS (referred to as sample C) are prepared as samples subjected to electron irradiation. Each of the samples is an In-Ga-Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In-O layers and six Ga-Zn-O layers are stacked in the c-axis direction. Accordingly, the distance between the adjacent layers is equivalent to the lattice spacing on the (009) plane (also referred to as d value), and the value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 24:
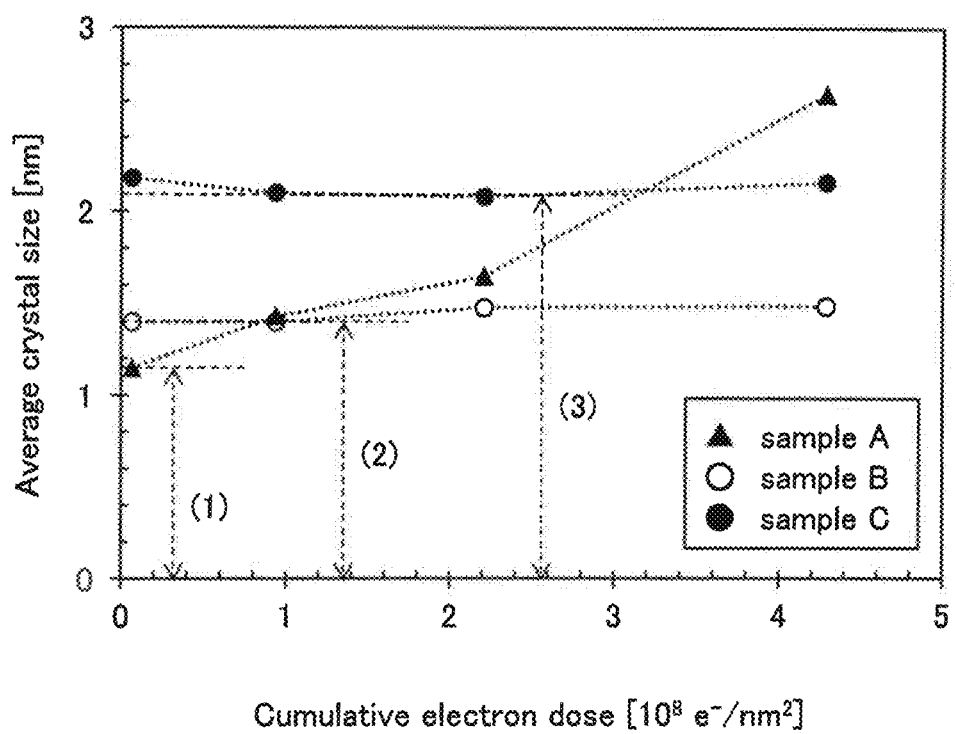
FIG. 24 A drawing showing a change of crystal parts of an In-Ga-Zn oxide owing to electron irradiation.

FIG. 24 shows the average size of crystal parts (at 22 points to 45 points) in each sample. Note that the crystal part size corresponds to the length of a lattice fringe. FIG. 24 indicates that the crystal part size in the a-like OS increases with the cumulative electron dose. Specifically, as shown by (1) in FIG. 24, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 24, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

Furthermore, the a-like OS has a lower density than the nc-OS and the CAAC-OS because it includes a void. Specifically, the density of the a-like OS is higher than or equal to 78.6% and lower than 92.3% of the density of a single crystal having the same composition. The density of each of the nc-OS and the CAAC-OS is higher than or equal to 92.3% and lower than 100% of the density of a single crystal having the same composition. It is difficult to deposit an oxide semiconductor having a density of lower than 78% of the density of the single crystal.

For example, in the case of an oxide semiconductor satisfying In:Ga:Zn=1:1:1 [atomic ratio], the density of single crystal $InGaZnO_4$ with a rhombohedral crystal structure is 6.357 g/cm$^3$. Accordingly, for example, in the case of the oxide semiconductor satisfying In:Ga:Zn=1:1:1 [atomic ratio], the density of the a-like OS is higher than or equal to 5.0 g/cm$^3$ and lower than 5.9 g/cm$^3$. Furthermore, for example, in the case of the oxide semiconductor satisfying In:Ga:Zn=1:1:1 [atomic ratio], the density of each of the nc-OS and the CAAC-OS is higher than or equal to 5.9 g/cm$^3$ and lower than 6.3 g/cm$^3$.

Note that single crystals with the same composition do not exist in some cases. In that case, single crystals with different compositions are combined at an adequate ratio, which makes it possible to calculate density equivalent to that of a single crystal with the desired composition. The density of a single crystal having the desired composition can be calculated using a weighted average according to the combination ratio of the single crystals with different compositions. Note that it is preferable to use as few kinds of single crystals as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The case where an oxide semiconductor contains indium, an element M, and zinc is considered. Here, the element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. A favorable range of the atomic ratio of indium to the element M and zinc, x:y:z, of the oxide semiconductor is described.

It is known that there is a homologous series (homologous series) represented by InMO$_3$(ZnO)$_m$ (m is a natural number) as an oxide containing indium, the element M, and zinc. Here, for example, the case where the element M is Ga is considered.

For example, a compound represented by ZnM$_2$O$_4$, such as ZnGa$_2$O$_4$, is known as a compound having a spinel crystal structure, for example Furthermore, for example, when a composition is in the neighborhood of ZnGa$_2$O$_4$, that is, values of x, y and z are close to (x,y,z)=(0,1,2), a spinel crystal structure is likely to be formed or mixed. Here, the oxide semiconductor is preferably a CAAC-OS. Furthermore, it is preferable that the CAAC-OS have no spinel crystal structure in particular. In addition, to increase carrier mobility, the percentage of In content is preferably increased. In an oxide semiconductor containing indium, the element M, and zinc, the s orbital of heavy metal mainly contributes to carrier transfer, and when the percentage of indium content in the oxide semiconductor is increased, overlaps of the s orbitals are increased; therefore, the mobility of oxide in which the percentage of indium content is high is higher than that of oxide in which the percentage of indium content is low. Therefore, when oxide having a high indium content is used as the oxide semiconductor, carrier mobility can be increased.

For example, to increase carrier mobility, it is preferable to increase the proportion of indium atoms. For example, in the case where the atomic ratio of indium, the element M, and zinc contained in the oxide semiconductor is represented by x:y:z, it is preferable that x be 1.75 or more times as large as y.

Furthermore, to further increase the CAAC proportion of the oxide semiconductor, the proportion of zinc atoms is preferably increased. For example, when the atomic ratio of an In-Ga-Zn oxide is within the range which allows a solid solution range, the CAAC proportion can be further increased. The range which allows a solid solution range tends to be widened when the ratio of the number of zinc atoms to the total number of indium and gallium atoms is increased. Therefore, when the ratio of the number of zinc atoms to the total number of indium and gallium atoms is increased, the CAAC proportion of the oxide semiconductor can be further increased in some cases. For example, in the case where the atomic ratio of indium, the element M, and zinc contained in the oxide semiconductor is represented by x:y:z, it is preferable that z be 0.5 or more times as large as x+y. On the other hand, to increase the atomic ratio of indium and increase carrier mobility, it is preferable that z be two or less times as large as x+y.

Consequently, a spinel crystal structure is hardly observed or is not observed by nanobeam electron diffraction. Thus, an excellent CAAC-OS can be obtained. Furthermore, carrier scattering or the like at the boundary between a CAAC structure and a spinel crystal structure can be reduced; therefore, when the oxide semiconductor is used for a transistor, a transistor having high field-effect mobility can be obtained. In addition, a transistor having high reliability can be obtained.

As a result, an oxide semiconductor having a high CAAC proportion can be obtained. That is, a high-quality CAAC-OS can be obtained. Furthermore, a CAAC-OS having no region or a very few regions in which a spinel crystal structure is observed can be obtained. For example, a high-quality CAAC-OS has a proportion of CAAC of higher than or equal to 50%, preferably higher than or equal to 80%, more preferably higher than or equal to 90%, still more preferably higher than or equal to 95% and lower than or equal to 100%.

Furthermore, in the case where a film of an oxide semiconductor is formed by a sputtering method, a film having an atomic ratio different from that of a target may be formed. Especially for zinc, the atomic ratio of zinc in a film is smaller than the atomic ratio of the target in some cases. Specifically, the film has an atomic ratio of zinc of 40 atomic % to approximately 90 atomic % of the atomic ratio of zinc in the target in some cases.

Therefore, the atomic ratio of zinc in the target is preferably higher than the atomic ratio of zinc in the oxide semiconductor obtained by a sputtering method.

Note that a plurality of films may be stacked in the oxide semiconductor. Furthermore, the plurality of films may differ in the CAAC proportion. In addition, the CAAC proportion of at least one of the stacked films is, for example, 90% higher, further preferably 95% or higher, still further preferably 97% or higher and 100% or lower.

A CAAC-OS film can be formed, for example, by the following method.

A CAAC-OS film is formed, for example, by a sputtering method using a polycrystalline oxide semiconductor sputtering target. As a sputtering method, an RF sputtering method, a DC sputtering method, an AC sputtering method, or the like can be used. To improve uniformity of film thickness distribution of the oxide semiconductor film, film composition distribution, and crystallinity distribution, a DC sputtering method or an AC sputtering method is preferably used rather than an RF sputtering method.

By increasing the substrate temperature during deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when sputtered particles reach the substrate, migration occurs on the substrate, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the entry of impurities during the deposition, the crystal state can be prevented from being broken by the impurities. For example, the concentration of impurities (hydrogen, water, carbon dioxide, nitrogen, and the like) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, a CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature during the deposition is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. Under the reduced pressure, the concentration of impurities in the first oxide semiconductor film can be reduced for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature during the deposition is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. Under the reduced pressure, the concentration of impurities in the second oxide semiconductor film can be reduced for a shorter time.

As described above, a CAAC-OS film with a total thickness of greater than or equal to 10 nm can be formed.

At least part of this embodiment can be implemented in combination with the other embodiment described in this specification as appropriate.

(Embodiment 3)

In this embodiment, an RF tag including a memory device such as the memory cell array 300 illustrated in the above embodiment is described with reference to FIG. 27. Here, the memory device may include a structure including a row selection driver, a column selection driver, an A/D converter, and the like that are connected to the memory cell array.

The RF tag of this embodiment includes a memory circuit, stores necessary data in the memory circuit, and transmits and receives data to/from the outside by using contactless means, for example, wireless communication. With these features, the RF tag can be used for an individual authentication system or the like in which the individual information of an object or the like is read to recognize the object. Note that extremely high reliability is required for these applications.

A configuration of the RF tag is described with reference to FIG. 27. FIG. 27 is a block diagram illustrating a configuration example of an RF tag.

Figure 27:
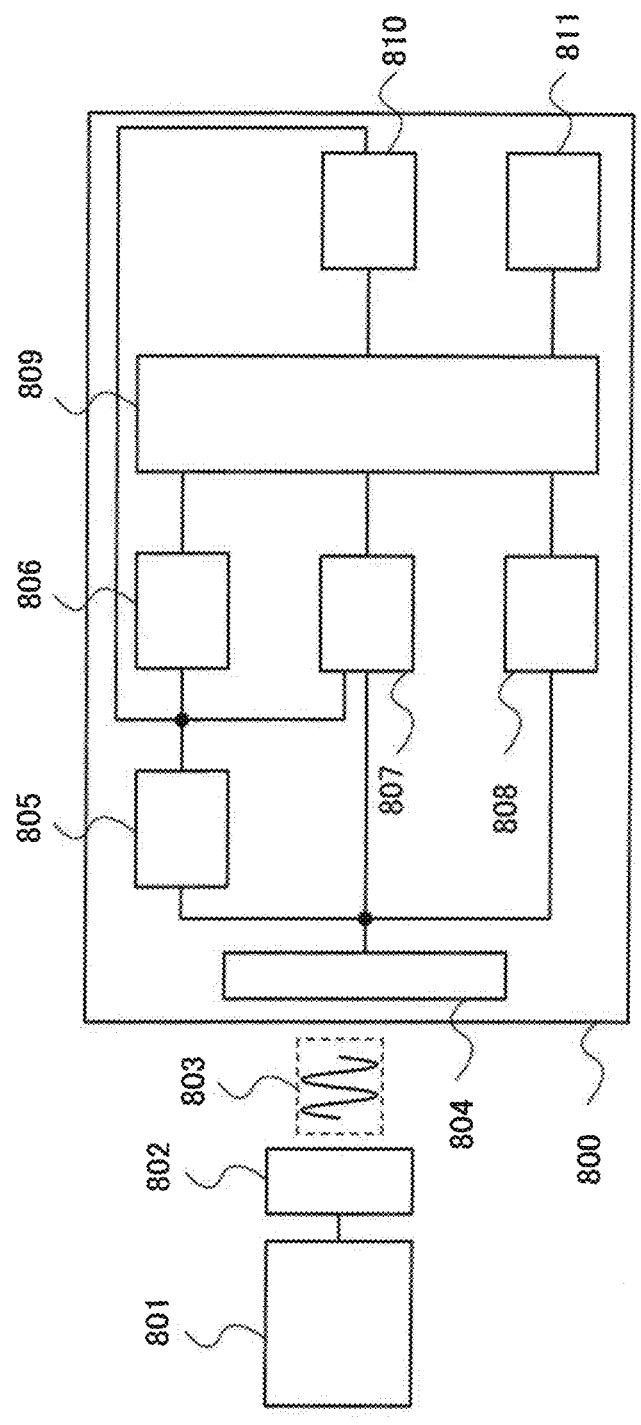
FIG. 27 A configuration example of an RF tag of an embodiment.

As shown in FIG. 27, an RF tag 800 includes an antenna 804 that receives a radio signal 803 that is transmitted from an antenna 802 connected to a communication device 801 (also referred to as an interrogator, a reader/writer, or the like). The RF tag 800 further includes a rectifier circuit 805, a constant voltage circuit 806, a demodulation circuit 807, a modulation circuit 808, a logic circuit 809, a memory circuit 810, and a ROM 811. Note that a material that enables a reverse current to be low enough, for example, an oxide semiconductor may be used for a transistor having a rectifying function included in the demodulation circuit 807. This can suppress the phenomenon of a rectifying function becoming weaker due to a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communication is performed by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 is an object for exchanging the radio signal 803 with the antenna 802 that is connected to the communication device 801. Furthermore, the rectifier circuit 805 is a circuit for generating an input potential by rectification, for example, half-wave voltage doubler rectification of an input alternating signal generated by reception of a radio signal at the antenna 804 and smoothing of the rectified signal with a capacitor provided in a later stage. Note that a limiter circuit may be provided on an input side or an output side of the rectifier circuit 805. The limiter circuit is a circuit for controlling electric power so that electric power that is higher than or equal to certain electric power is not input to a circuit in a later stage if the amplitude of the input alternating signal is high and an internal generation voltage is high.

The constant voltage circuit 806 is a circuit for generating a stable power supply voltage from an input potential and supplies it to each circuit. Note that the constant voltage circuit 806 may include a reset signal generation circuit. The reset signal generation circuit is a circuit for generating a reset signal of the logic circuit 809 by utilizing rise of the stable power supply voltage.

The demodulation circuit 807 is a circuit for demodulating the input alternating signal by envelope detection to generate the demodulated signal. Furthermore, the modulation circuit 808 is a circuit for performing modulation in accordance with data to be output from the antenna 804.

The logic circuit 809 is a circuit for analyzing and processing the demodulated signal. The memory circuit 810 is a circuit for holding the input data and includes a row decoder, a column decoder, a memory region, and the like. Furthermore, the ROM 811 stores an identification number (ID) or the like and outputs it in accordance with processing.

Note that the above-described circuits may be selected as appropriate as needed.

Here, the memory circuit described in the above embodiment can be used as the memory circuit 810. Since the memory circuit of one embodiment of the present invention can retain data even when not powered, it can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Furthermore, since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer writes identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with the other embodiment described in this specification as appropriate.

(Embodiment 4)

In this embodiment, a CPU including a memory device including at least the memory cell array 300 described in the embodiment is described. Here, the memory device may include a structure including a row selection driver, a column selection driver, an A/D converter, and the like that are connected to the memory cell array.

Figure 28:
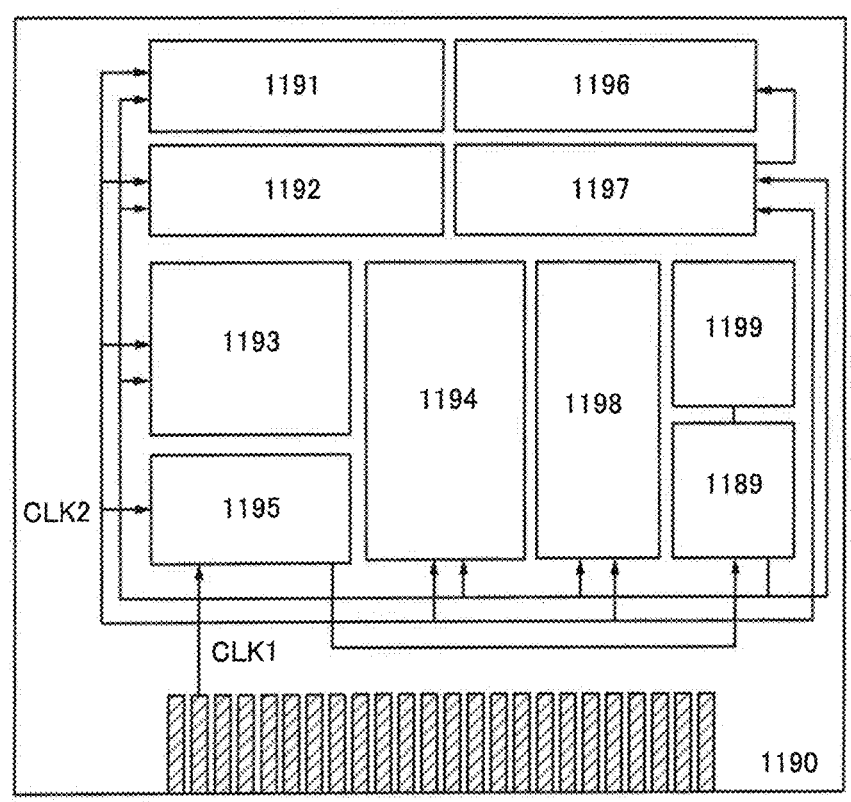
FIG. 28 A configuration example of a CPU of an embodiment.

FIG. 28 is a block diagram illustrating a configuration of an example of a CPU at least partly including the memory device described in the aforementioned embodiment.

The CPU illustrated in FIG. 28 includes, over a substrate 1190, an ALU 1191 (ALU: Arithmetic Logic Unit, arithmetic circuit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration is simplified, and an actual CPU has a variety of configurations depending on the application. For example, the CPU may have a configuration including a plurality of cores that operate in parallel; each of the cores has a structure including the CPU or the arithmetic circuit illustrated in FIG. 28. Furthermore, the number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

Furthermore, the timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 28, a memory cell is provided in the register 1196. For the memory cell of the register 1196, the transistor described in the aforementioned embodiment can be used.

In the CPU illustrated in FIG. 28, the register controller 1197 selects operation of retaining data in the register 1196 in accordance with an instruction from the ALU 1191. That is, whether data is retained by a flip-flop or by a capacitor in the memory cell included in the register 1196 is selected. When data retaining by the flip-flop is selected, a power supply voltage is supplied to the memory cell in the register 1196. When data retaining by the capacitor is selected, the data is rewritten in the capacitor, and supply of a power supply voltage to the memory cell in the register 1196 can be stopped.

Figure 29:
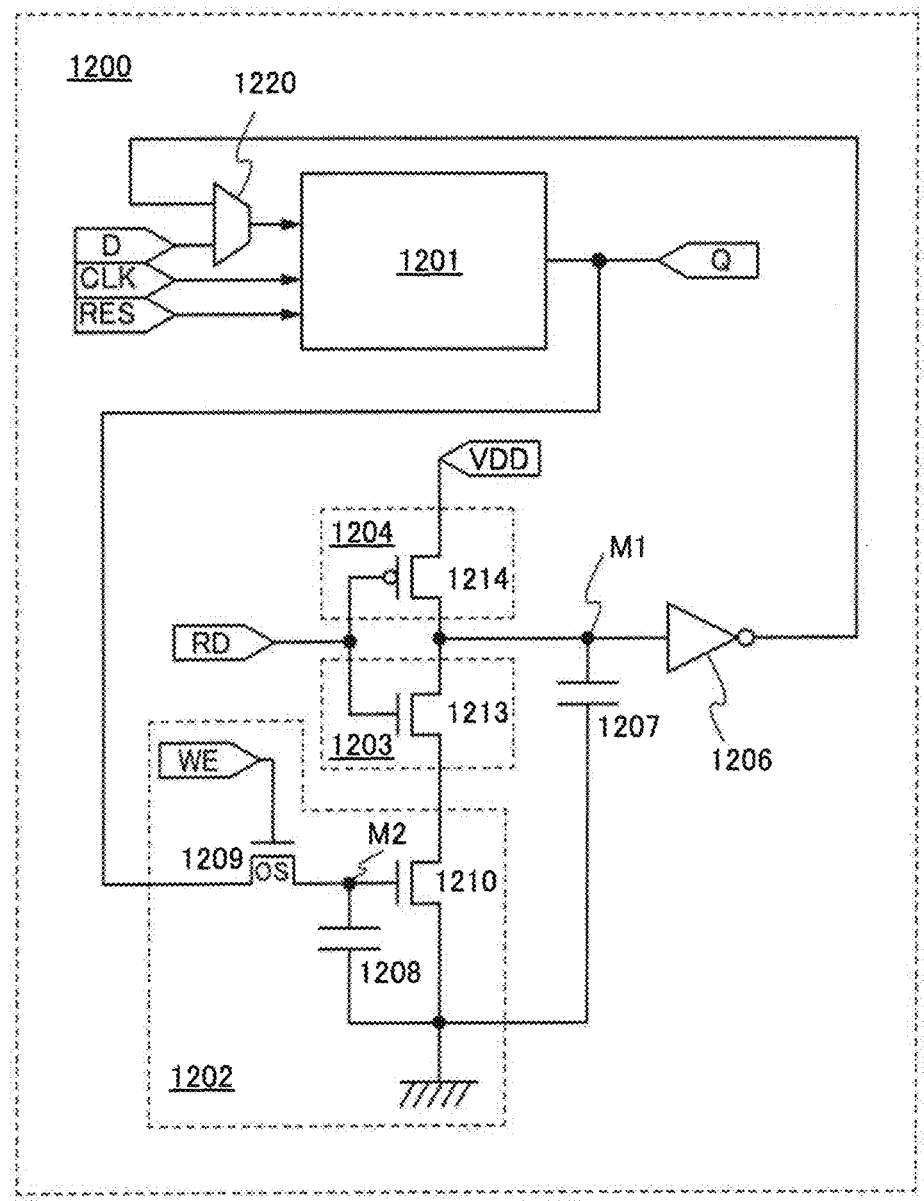
FIG. 29 A circuit diagram of a memory element of an embodiment.

FIG. 29 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed. The transistor 1209 is preferably a transistor in which a channel is formed in an oxide semiconductor layer.

Here, the memory device described in the aforementioned embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is composed of a transistor 1213 having one conductivity type (e.g., an n-channel type) and the switch 1204 is composed of a transistor 1214 having a conductivity type opposite to the one conductivity type (e.g., a p-channel type). Here, a first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on state or the off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on state or the off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node Ml. To the other of the pair of electrodes of the capacitor 1207, a constant potential can be input. For example, a low power supply potential (e.g., GND) or a high power supply potential (e.g., VDD) can be input. The other of the pair of electrodes of the capacitor 1207 is electrically connected to the wiring that can supply a low power supply potential (e.g., a GND line). To the other of the pair of electrodes of the capacitor 1208, a constant potential can be input. For example, a low power supply potential (e.g., GND) or a high power supply potential (e.g., VDD) can be input. The other of the pair of electrodes of the capacitor 1208 is electrically connected to the wiring that can supply a low power supply potential (e.g., a GND line).

Note that the capacitor 1207 and the capacitor 1208 can be omitted as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE; when the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example illustrated in FIG. 29, a signal output from the second terminal of the switch 1203 (the other of the source and the drain of the transistor 1213) is input to the circuit 1201 through the logic element 1206 and the circuit 1220; however, it is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

Furthermore, in FIG. 29, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 29, for example, a flip-flop circuit can be used. Furthermore, as the logic element 1206, for example, an inverter, a clocked inverter, or the like can be used.

In a period during which the memory element 1200 is not supplied with the power supply voltage, the semiconductor device of one embodiment of the present invention can retain data stored in the circuit 1201 by the capacitor 1208 that is provided in the circuit 1202.

Furthermore, the off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Furthermore, since the memory element is characterized by performing pre-charge operation with the switch 1203 and the switch 1204, the time required for the circuit 1201 to retain original data again after the supply of the power supply voltage is restarted can be shortened.

Furthermore, in the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, return to the same state as that before the power supply is stopped is possible shortly after the supply of the power supply voltage is restarted. Thus, the power supply can be stopped even for a short time in the entire processor or one or a plurality of logic circuits included in the processor, resulting in lower power consumption.

Although the memory element 1200 is used in a CPU in this embodiment, the memory element 1200 can also be used in an LSI such as a DSP (Digital Signal Processor), a custom LSI, or a PLD (Programmable Logic Device), and an RF-ID (Radio Frequency Identification).

Note that in this specification and the like, a transistor can be formed using a variety of substrates, for example The type of a substrate is not limited to a certain type. As an example of the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like is given. As an example of a glass substrate is barium borosilicate glass, aluminoborosilicate glass, soda lime glass, or the like is given. As an example of a flexible substrate, an attachment film, a base material film, or the like, the following is given. For example, plastic typified by polyethylene terephthalate (PET), polyethylene naphthalate (PEN), or polyether sulfone (PES) is given. Another example is a synthetic resin such as acrylic, or the like. Another example is polypropylene, polyester, polyvinyl fluoride, polyvinyl chloride, or the like. Another example is polyamide, polyimide, aramid, epoxy, an inorganic vapor deposition film, paper, or the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. Note that for the above separation layer, a structure of a stacked-layer structure of inorganic films, which are a tungsten film and a silicon oxide film, a structure in which an organic resin film of polyimide or the like is formed over a substrate, or the like can be used, for example.

In other words, a transistor may be formed using one substrate, and then transferred to another substrate, so that the transistor is provided over the another substrate. As an example of a substrate to which a transistor is transferred, in addition to the above-described substrate over which the transistor can be formed, a paper substrate, a cellophane substrate, an aramid film substrate, a polyimide film substrate, a stone substrate, a wood substrate, a cloth substrate (including a natural fiber (silk, cotton, hemp), a synthetic fiber (nylon, polyurethane, polyester), a regenerated fiber (acetate, cupra, rayon, regenerated polyester), or the like), a leather substrate, a rubber substrate, or the like. When such a substrate is used, a transistor with excellent properties or a transistor with low power consumption can be formed, a device with high durability can be manufactured, high heat resistance can be provided, or reduction in weight or thickness can be achieved.

For example, in this specification and the like, when it is explicitly described that X and Y are connected, the case where X and Y are electrically connected, the case where X and Y are functionally connected, and the case where X and Y are directly connected are included therein. Accordingly, a connection relationship other than those shown in drawings and texts is also included without limitation to a predetermined connection relationship, for example, the connection relationship shown in the drawings and the texts.

Here, X and Y each denote an object (e.g., a device, an element, a circuit, a wiring, an electrode, a terminal, a conductive film, a layer).

For example, in the case where X and Y are electrically connected, one or more elements that enable electrical connection between X and Y (e.g., a switch, a transistor, a capacitor, an inductor, a resistor, a diode, a display element, a light-emitting element, a load) can be connected between X and Y. Note that a switch has a function of being controlled to be on or off. That is, a switch has a function of determining whether current flows or not by being turned on (on state) or turned off (off state). Alternatively, the switch has a function of selecting and changing a current path.

As an example of the case where X and Y are functionally connected, one or more circuits that enable functional connection between X and Y (for example, a logic circuit (e.g., an inverter, a NAND circuit, or a NOR circuit), a signal converter circuit (e.g., a DA converter circuit, an AD converter circuit, or a gamma correction circuit), a potential level converter circuit (e.g., a power supply circuit (a step-up circuit, a step-down circuit, or the like), a level shifter circuit for changing the potential level of a signal), a voltage source, a current source, a switching circuit, an amplifier circuit (e.g., a circuit that can increase signal amplitude, the amount of current, or the like, an operational amplifier, a differential amplifier circuit, a source follower circuit, a buffer circuit), a signal generation circuit, a memory circuit, or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using the following expressions.

For example, the expression "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order", the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", or the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order" can be employed. When the connection order in a circuit configuration is defined by an expression similar to these examples, a source (or a first terminal or the like) and a drain (or a second terminal or the like) of a transistor can be distinguished from each other to specify the technical scope. Note that these expressions are examples and it is not limited to the expressions. Here, X, Y, Z1, and Z2 each denote an object (e.g., a device, an element, a circuit, a wiring, an electrode, a terminal, a conductive film, or a layer).

At least part of this embodiment can be implemented in combination with the other embodiment described in this specification as appropriate.

(Embodiment 5)

The semiconductor device of one embodiment of the present invention can be used for display devices, personal computers, or image reproducing devices provided with recording media (typically, devices that reproduce the content of recording media such as DVDs: Digital Versatile Discs and have displays capable of displaying the reproduced images). In addition, as electronic appliances that can employ the semiconductor device of one embodiment of the present invention, cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like are given. FIGS. 30A to 30F illustrate specific examples of these electronic appliances.

Figure 30A:
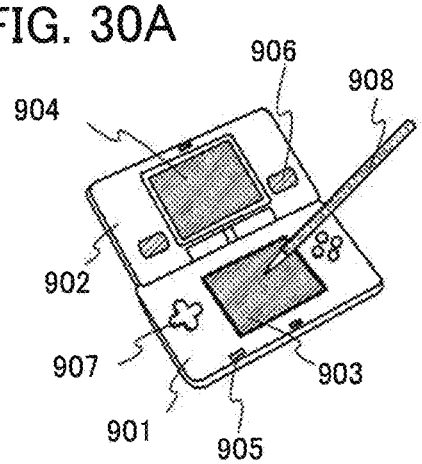
FIGS. 30A to 30F Electronic appliances of an embodiment.

FIG. 30A is a portable game machine, which includes a housing 901, a housing 902, a display portion 903, a display portion 904, a microphone 905, a speaker 906, an operation key 907, a stylus 908, and the like. Note that although the portable game machine in FIG. 30A has the two display portions 903 and 904, the number of display portions included in a portable game machine is not limited to this.

Figure 30B:
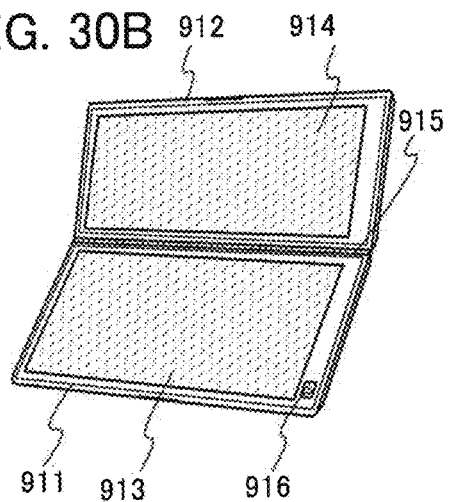

FIG. 30B is a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. Furthermore, a display device with a position input function may be used as at least one of the first display portion 913 and the second display portion 914. Note that the position input function can be added by providing a touch panel for a display device. Alternatively, the position input function can be added by provision of a photoelectric conversion element called a photosensor for a pixel portion of a display device.

Figure 30C:
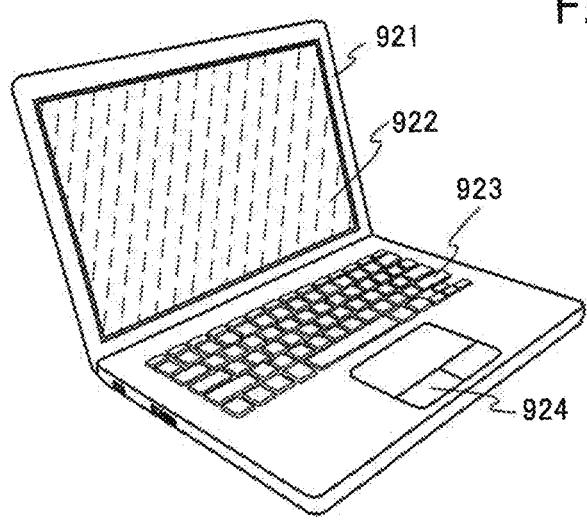

FIG. 30C is a notebook type personal computer, which includes a housing 921, a display portion 922, a keyboard 923, a pointing device 924, and the like.

Figure 30D:
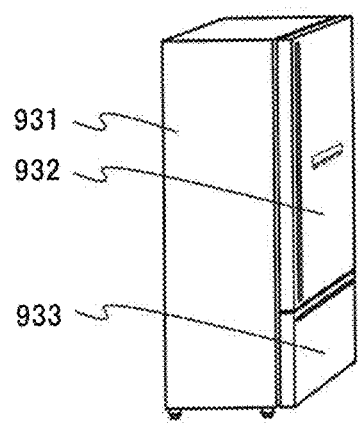

FIG. 30D is an electric refrigerator-freezer, which includes a housing 931, a refrigerator door 932, a freezer door 933, and the like.

Figure 30E:
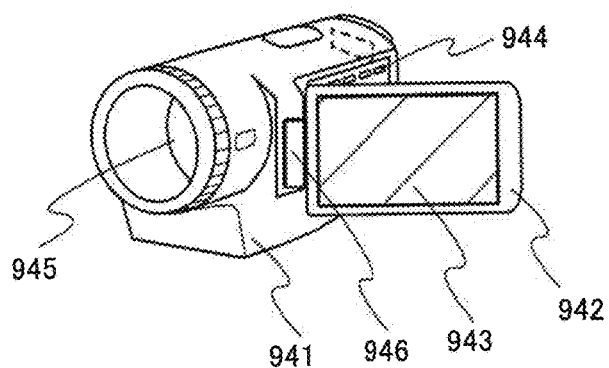

FIG. 30E is a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. Furthermore, the first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 30F:
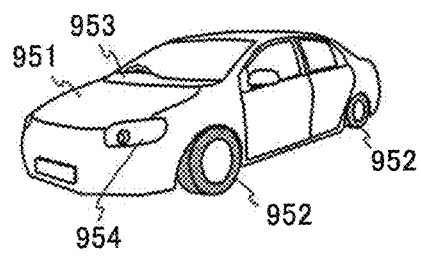
Figure 31A:
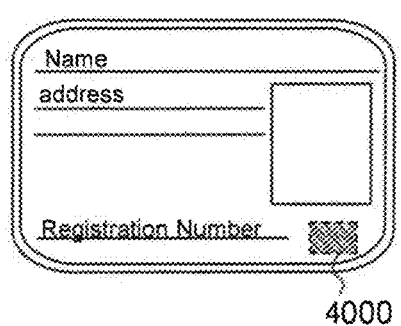
FIGS. 31A to 31F Application examples of an RF tag of an embodiment.
Figure 31B:
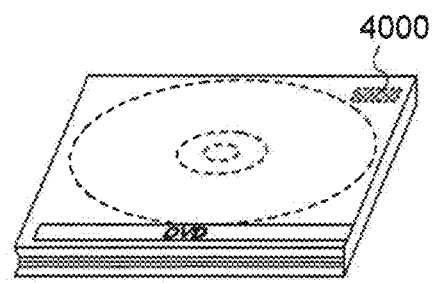
Figure 31C:
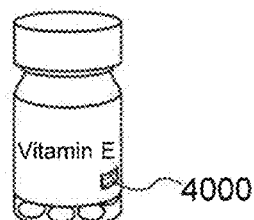
Figure 31D:
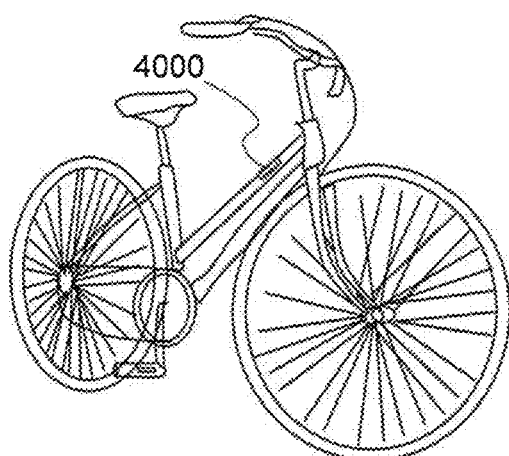
Figure 31E:
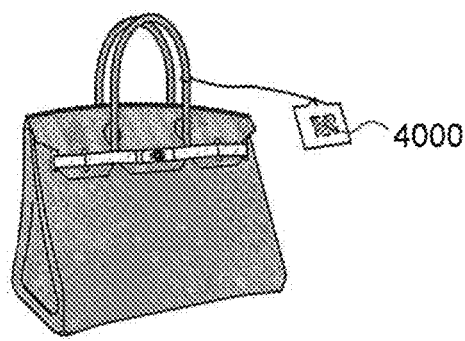
Figure 31F:
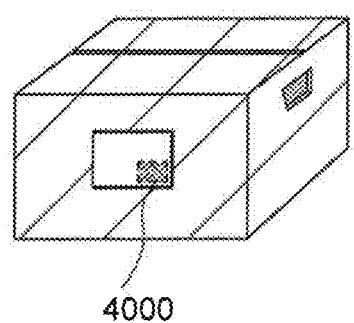

FIG. 30F is an ordinary vehicle, which includes a car body 951, wheels 952, a dashboard 953, lights 954, and the like.

At least part of this embodiment can be implemented in combination with the other embodiment described in this specification as appropriate.

(Embodiment 6)

In this embodiment, application examples of an RF tag of one embodiment of the present invention are described with reference to FIGS. 31A to 31F. The RF tag is widely used and can be provided for, for example, products such as bills, coins, securities, bearer bonds, documents (driver's licenses, residence cards, or the like; see FIG. 31A), packaging containers (wrapping paper, bottles, or the like; see FIG. 31C), recording media (DVDs, video tapes, or the like; see FIG. 31B), vehicles (bicycles or the like; see FIG. 31D), personal belongings (bags, glasses, or the like), foods, plants, animals, human bodies, clothing, household goods, medical supplies such as medicine or chemicals, or electronic appliances (e.g., liquid crystal display devices, EL display devices, television sets, or cellular phones), or tags on products (see FIG. 31E or FIG. 31F).

An RF tag 4000 of one embodiment of the present invention is fixed to a product by being attached to a surface thereof or embedded therein. For example, it is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Furthermore, vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, it can be preferably used for application in which data is not frequently written or read, because data can be retained for an extremely long period even in the state where power is not supplied.

At least part of this embodiment can be implemented in combination with the other embodiment described in this specification as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by, for example, the maximum and minimum values is described, the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first to a fifth transistors is illustrated. In that case, it can be specified that the circuit does not include a sixth transistor in the invention. It can be specified that the circuit does not include a capacitor. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range", "a value preferably satisfies a certain condition", or the like is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is popssible: Company A manufactures and sells transmitting devices, and Company B manufactures and sells receiving devices. As another example, in the case of a light-emitting device including a transistor and a light-emitting element, the following case is possible: Company A manufactures and sells semiconductor devices in which transistors are formed, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device; those embodiments of the invention are clear and can be regarded as being disclosed in this specification or the like. Another example is as follows: in the case of a light-emitting device including a transistor and a light-emitting element, even when this specification or the like does not include a description of the case where a semiconductor device in which the transistor is formed is used alone or the case where a light-emitting device including the light-emitting element is used alone, one embodiment of the invention can be constituted by only the semiconductor device in which the transistor is formed and another embodiment of the invention can be constituted by only the light-emitting device including the light-emitting element; those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when portions to be connected are not specified. Further, in the case where the content in which a portion to be connected is specified is disclosed in this specification and the like, it can be determined that one embodiment of the invention in which a portion to be connected is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the portion to which a circuit is connected is specified. Alternatively, it might be possible for those skilled in the art to specify the invention when at least a function of a circuit is specified. In other words, when a function of a circuit is specified, one embodiment of the invention can be clear. Further, it can be determined that one embodiment of the invention whose function is specified is disclosed in this specification and the like. Therefore, when a portion to which a circuit is connected is specified, the circuit is disclosed as one embodiment of the invention even when a function is not specified, and one embodiment of the invention can be constituted. Alternatively, when a function of a circuit is specified, the circuit is disclosed as one embodiment of the invention even when a portion to which a circuit is connected is not specified, and one embodiment of the invention can be constituted.

Note that in this specification and the like, in a diagram or a text described in one embodiment, it is possible to take out part of the diagram or the text and constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N (N is an integer) circuit elements (e.g., transistors or capacitors) are provided, it is possible to constitute one embodiment of the invention by taking out M (M is an integer, where M<N) circuit elements (e.g., transistors or capacitors). As another example, it is possible to constitute one embodiment of the invention by taking out M (M is an integer, where M<N) layers from a cross-sectional view in which N (N is an integer) layers are provided. As another example, it is possible to constitute one embodiment of the invention by taking out M (M is an integer, where M<N) elements from a flow chart in which N (N is an integer) elements are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E"

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

REFERENCE SIGNS LIST

101$j$: semiconductor layer,
101$j$_a: semiconductor layer,
101$j$_b: semiconductor layer,
101$j$_c: semiconductor layer,
102$j$: gate insulating film,
103$j$: gate electrode,
104: conductive film,
104$j$_a: conductive layer,
104$j$_b: conductive layer,
105$j$: conductive layer,
111: barrier film,
112$j$: insulating film,
113$j$: insulating film,
114$j$: insulating film,
115$j$: insulating film,
116$j$: insulating film,
130$a$: transistor,
130$b$: transistor,
131: semiconductor substrate,
132: semiconductor layer,
133$a$: low-resistance layer,
133$b$: low-resistance layer,
134: gate insulating film,
135: gate electrode,
136: insulating film,
137: insulating film,
138: insulating film,
141$j$: plug,
142$j$: plug,
143$j$: plug,
144$j$: plug,
145$j$: plug,
146$j$: plug,
147$j$: plug,
148$j$: plug,
151$j$: conductive layer,
152$j$: conductive layer,
153: conductive film,
153$j$: conductive layer,
154$j$: conductive layer,
156$j$: insulating film,
171$j$_a: low-resistance region,
171$j$_b: low-resistance region,
176$a$: region,
176$b$: region,
190: transistor,
198: transistor,
199: transistor,
201$j$: semiconductor layer,
201$j$_a: semiconductor layer,
201$j$_b: semiconductor layer,
201$j$_c: semiconductor layer,
202$j$: gate insulating film,
203$j$: gate electrode,
204$j$: conductive film,
204$j$_a: conductive layer,
204$j$_b: conductive layer,
205$j$: conductive layer,
212$j$: insulating film,
213$j$: insulating film,
214$j$: insulating film,
216$j$: insulating film,
230$a$: transistor,
230$b$: transistor,
232: semiconductor layer,
233$a$: low-resistance layer,
233$b$: low-resistance layer,
235: gate electrode,
300: memory cell array,
500: peripheral circuit,
700: semiconductor device,
800: RF tag,
801: communication device,
802: antenna,
803: radio signal,
804: antenna,
805: rectifier circuit,
806: constant voltage circuit,
807: demodulation circuit,
808: modulation circuit,
809: logic circuit,
810: memory circuit,
811: ROM,
901: housing,
902: housing,
903: display portion,
904: display portion,
905: microphone,
906: speaker,
907: operation key,
908: stylus,
911: housing,
912: housing,
913: display portion,
914: display portion,
915: joint,
916: operation key,
921: housing,
922: display portion,
923: keyboard,
924: pointing device, 931: housing,
932: refrigerator door,
933: freezer door,
941: housing,
942: housing,
943: display portion,
944: operation key,
945: lens,
946: joint,
951: car body,
952: wheel,
953: dashboard,
954: light,
1189: ROM interface,
1190: substrate,
1191: ALU,
1192: ALU controller,
1193: instruction decoder,
1194: interrupt controller,
1195: timing controller,
1196: register,
1197: register controller,
1198: bus interface,
1199: ROM,
1200: memory element,
1201: circuit,
1202: circuit,
1203: switch,
1204: switch,
1206: logic element,
1207: capacitor,
1208: capacitor,
1209: transistor,
1210: transistor,
1213: transistor,
1214: transistor,
1220: circuit,
2100: transistor,
2200: transistor,
4000: RF tag,
5100: pellet,
5120: substrate,
5161: region.

This application is based on Japanese Patent Application serial no. 2014-045406 filed with Japan Patent Office on Mar. 7, 2014, the entire contents of which are hereby incorporated by reference.

The invention claimed is:

1. A semiconductor device comprising:
a memory cell including first to cth sub memory cells (c is a natural number greater than or equal to 2),
wherein a jth sub memory cell includes a transistor and a capacitor (j is a natural number of 1 to c),
wherein a semiconductor layer in the transistor includes an oxide semiconductor,
wherein one of terminals of the capacitor is electrically connected to one of a source electrode and a drain electrode of the transistor,
wherein, when j≥2, the jth sub memory cell is arranged over a j-1th sub memory cell, and
wherein a bit line is electrically connected to the jth sub memory cell and the j-1th sub memory cell.

2. The semiconductor device according to claim 1, wherein the transistor has an off-state current lower than or equal to 10 zA per micrometer of channel width at room temperature.

3. The semiconductor device according to claim 1, wherein the bit line includes a plug.

4. The semiconductor device according to claim 1, wherein the memory cell is provided over a semiconductor substrate, and
wherein the bit line extends in a direction perpendicular or substantially perpendicular to the semiconductor substrate.

5. The semiconductor device according to claim 1, wherein the bit line extends in a direction in which a layer including the j-1th sub memory cell and a layer including the jth sub memory cell are stacked.

6. The semiconductor device according to claim 1, wherein the memory cell is provided over a peripheral circuit including a transistor including silicon in a semiconductor layer.

7. The semiconductor device according to claim 1, wherein the oxide semiconductor includes In, Ga, and Zn.

8. The semiconductor device according to claim 1, wherein the oxide semiconductor includes a crystal region, and
wherein the crystal region includes a crystal in which a c-axis is aligned in a direction perpendicular or substantially perpendicular to a surface of the oxide semiconductor.

9. The semiconductor device according to claim 1, wherein the oxide semiconductor includes a region in which a hydrogen concentration is lower than $5 \times 10^{18}$ atoms/cm$^3$.

10. The semiconductor device according to claim 1, wherein the oxide semiconductor is highly purified.

11. The semiconductor device according to claim 1, wherein the oxide semiconductor is intrinsic or substantially intrinsic.

12. A semiconductor device comprising:
a memory cell including first to cth sub memory cells (c is a natural number greater than or equal to 2),
wherein a jth sub memory cell includes a first transistor, a second transistor, and a capacitor (j is a natural number of 1 to c),
wherein a first semiconductor layer in the first transistor and a second semiconductor layer in the second transistor include an oxide semiconductor,
wherein one of terminals of the capacitor is electrically connected to a gate electrode of the second transistor,
wherein the gate electrode of the second transistor is electrically connected to one of a source electrode and a drain electrode of the first transistor,
wherein, when j≥2, the jth sub memory cell is arranged over a j-1th sub memory cell, and
wherein a bit line is electrically connected to the jth sub memory cell and the j-1th sub memory cell.

13. The semiconductor device according to claim 12, wherein the first transistor has an off-state current lower than or equal to 10 zA per micrometer of channel width at room temperature.

14. The semiconductor device according to claim 12, wherein the bit line includes a plug.

15. The semiconductor device according to claim 12, wherein the memory cell is provided over a semiconductor substrate, and
wherein the bit line extends in a direction perpendicular or substantially perpendicular to the semiconductor substrate.

16. The semiconductor device according to claim 12, wherein the bit line extends in a direction in which a layer including the j-1th sub memory cell and a layer including the jth sub memory cell are stacked.

17. The semiconductor device according to claim 12,
wherein the memory cell is provided over a peripheral circuit including a transistor including silicon in a semiconductor layer.

18. The semiconductor device according to claim 12,
wherein the oxide semiconductor includes In, Ga, and Zn.

19. The semiconductor device according to claim 12,
wherein the oxide semiconductor includes a crystal region, and
wherein the crystal region includes a crystal in which a c-axis is aligned in a direction perpendicular or substantially perpendicular to a surface of the oxide semiconductor.

20. The semiconductor device according to claim 12,
wherein the oxide semiconductor includes a region in which a hydrogen concentration is lower than $5 \times 10^{18}$ atoms/cm$^3$.

21. The semiconductor device according to claim 12,
wherein the oxide semiconductor is highly purified.

22. The semiconductor device according to claim 12,
wherein the oxide semiconductor is intrinsic or substantially intrinsic.

* * * * *